US011923176B2

(12) United States Patent
Stowell et al.

(10) Patent No.: US 11,923,176 B2
(45) Date of Patent: *Mar. 5, 2024

(54) TEMPERATURE-CONTROLLED CHEMICAL PROCESSING REACTOR

(71) Applicant: Lyten, Inc., Sunnyvale, CA (US)

(72) Inventors: Michael W. Stowell, Sunnyvale, CA (US); Bryce H. Anzelmo, Mountain View, CA (US); Thomas Riso, Elizabeth, CO (US)

(73) Assignee: Lyten, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/008,188

(22) Filed: Aug. 31, 2020

(65) Prior Publication Data
US 2020/0402768 A1 Dec. 24, 2020

Related U.S. Application Data

(63) Continuation-in-part of application No. 15/676,649, filed on Aug. 14, 2017, now Pat. No. 10,937,632, (Continued)

(51) Int. Cl.
*H01J 37/32* (2006.01)

(52) U.S. Cl.
CPC .. *H01J 37/32192* (2013.01); *H01J 37/32229* (2013.01); *H01J 37/3244* (2013.01); *H01J 37/32532* (2013.01); *H01J 2237/334* (2013.01)

(58) Field of Classification Search
USPC .............................. 118/723 MW; 156/345.41
See application file for complete search history.

(56) References Cited

U.S. PATENT DOCUMENTS

| | | | | |
|---|---|---|---|---|
| 6,960,747 B2 * | 11/2005 | Risman | ................. | H05B 6/701 |
| | | | | 333/228 |
| 2008/0296294 A1 * | 12/2008 | Uhm | ..................... | B01J 19/088 |
| | | | | 219/688 |

(Continued)

FOREIGN PATENT DOCUMENTS

JP           2011166740 A        8/2011

OTHER PUBLICATIONS

International Search Report and Written Opinion for Intl. Application No. PCT/US2021/041079 dated Nov. 2, 2021; 11 pages.

*Primary Examiner* — Ram N Kackar
(74) *Attorney, Agent, or Firm* — Paradice & Li LLP

(57) ABSTRACT

This disclosure provides a reactor system that includes a microwave source configured to generate a microwave energy, one or more energy sources configured to generate a thermal energy and a field-enhancing waveguide (FEWG) coupled to the microwave source. The FEWG includes a field-enhancing zone having a cross-sectional area that decreases along a length of the FEWG. The field-enhancing zone includes a supply gas inlet configured to receive a supply gas, a reaction zone configured to generate a plasma in response to excitation of the supply gas by the microwave energy, a process inlet configured to inject a raw material into the reaction zone, and an afterglow region configured to combine the plasma and the raw material in response to the thermal energy. An outlet outputs a plurality of carbon-inclusive particles resulting from the combination of the plasma and the raw material. Electrodes can be positioned proximate to the reaction zone.

17 Claims, 32 Drawing Sheets

Related U.S. Application Data which is a continuation of application No. 15/428,474, filed on Feb. 9, 2017, now Pat. No. 9,767,992.

(56) References Cited

U.S. PATENT DOCUMENTS

| | | | |
|---|---|---|---|
| 2012/0217875 A1* | 8/2012 | Park | H05H 1/46 315/111.21 |
| 2013/0020939 A1* | 1/2013 | Kim | H01P 3/123 315/111.41 |
| 2013/0334964 A1 | 12/2013 | Wort et al. | |
| 2014/0008326 A1* | 1/2014 | Toyoda | H05H 1/46 216/69 |
| 2018/0226229 A1 | 8/2018 | Stowell et al. | |
| 2020/0062591 A1 | 2/2020 | Soane et al. | |

\* cited by examiner

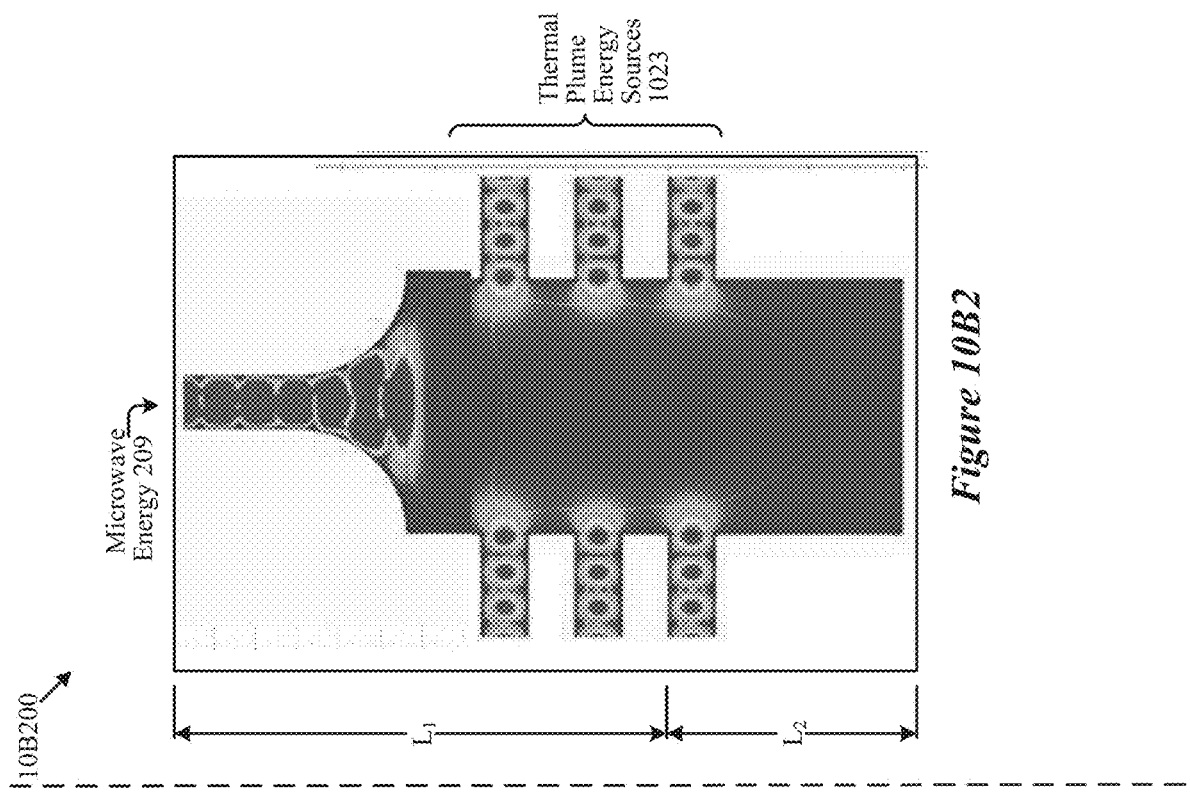
*Figure 10B2*
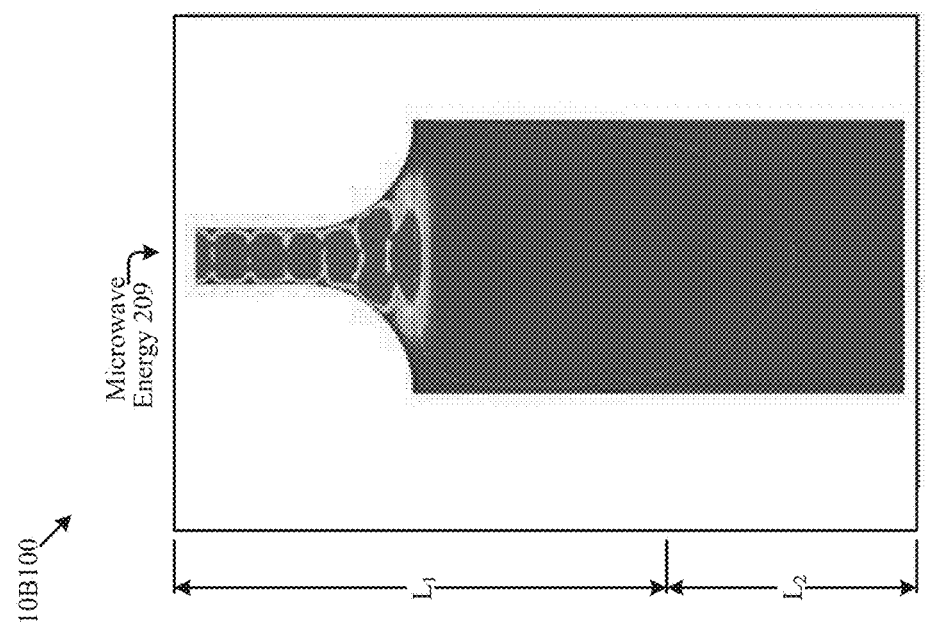
*Figure 10B1*

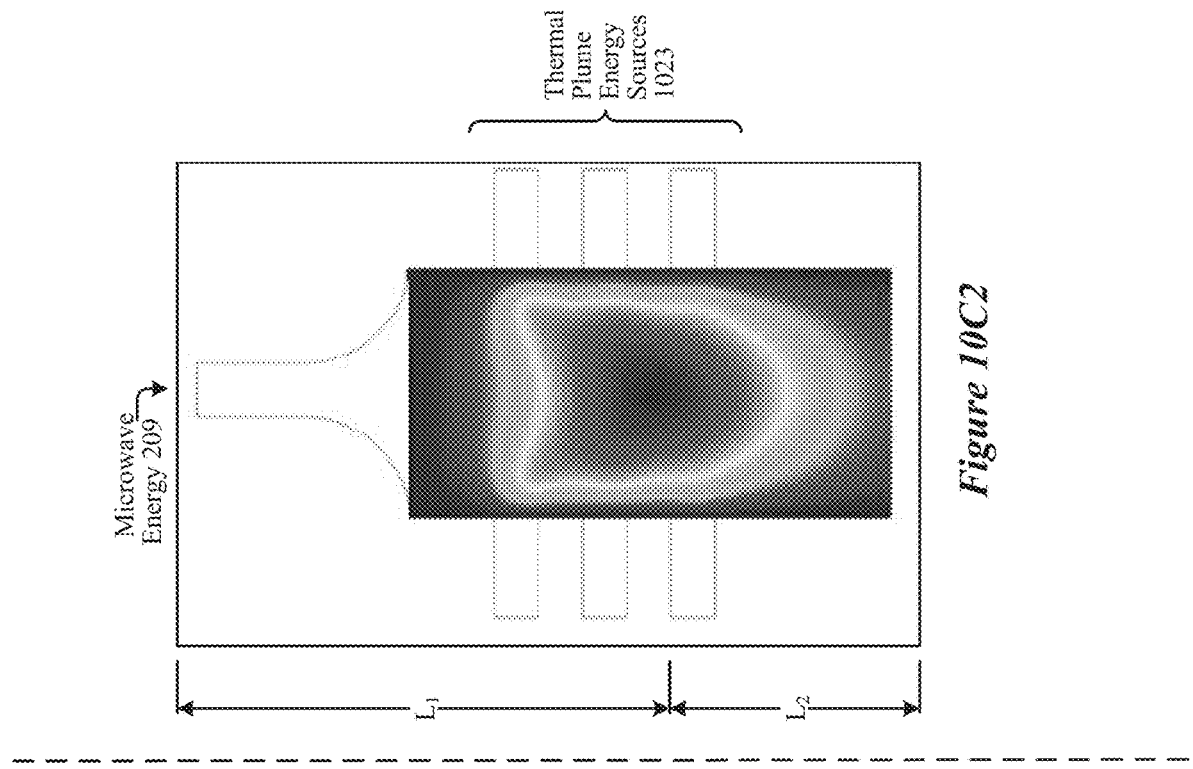
*Figure 10C2*
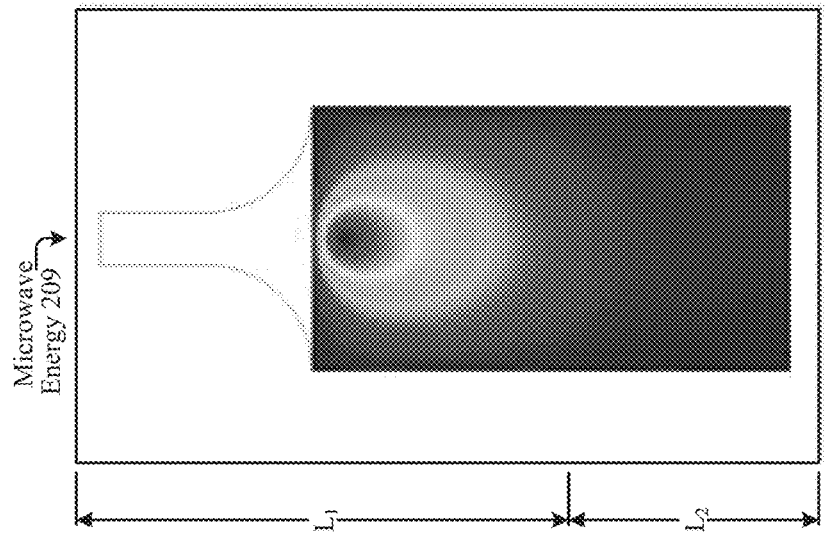
*Figure 10C1*

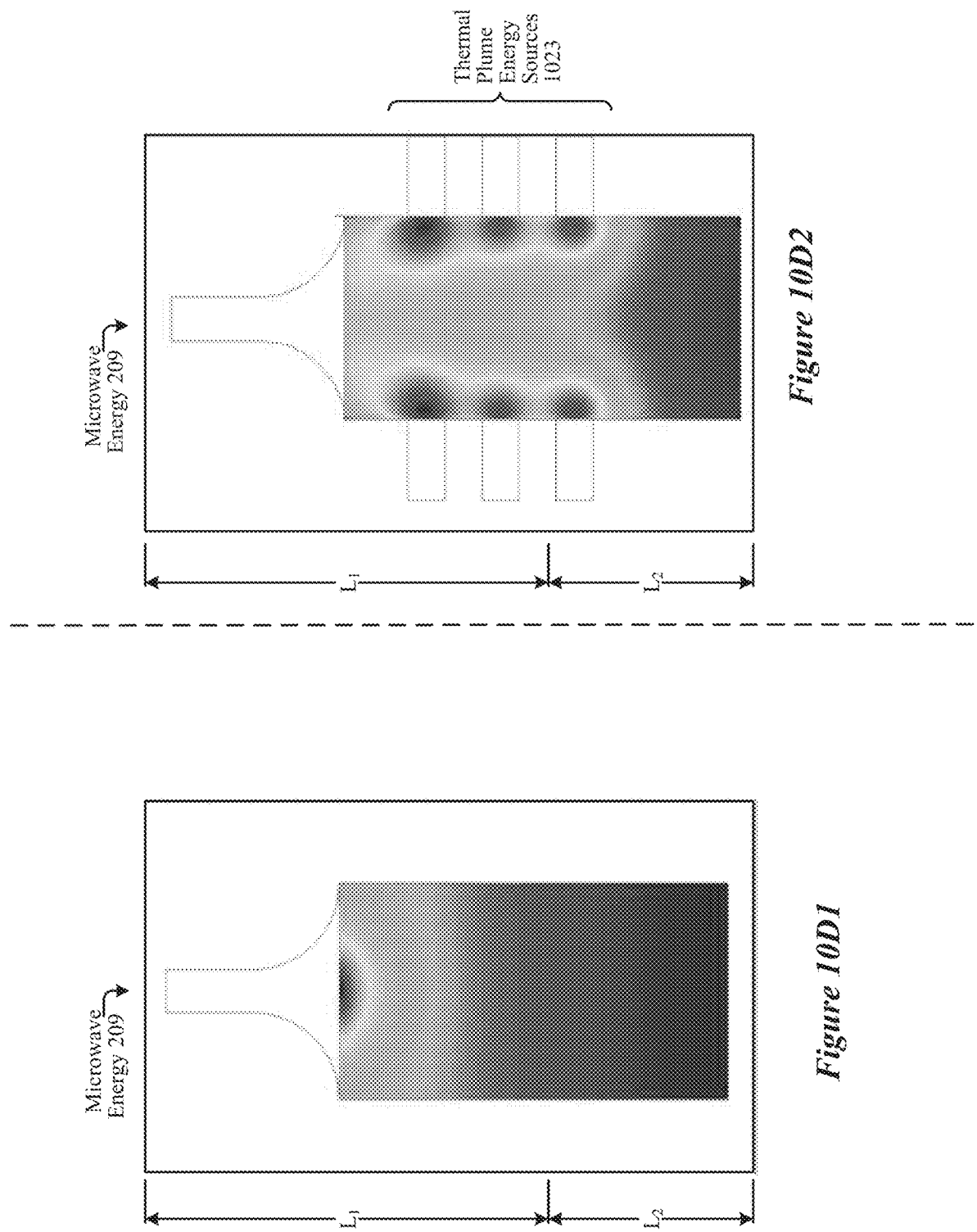
*Figure 10D2*
*Figure 10D1*

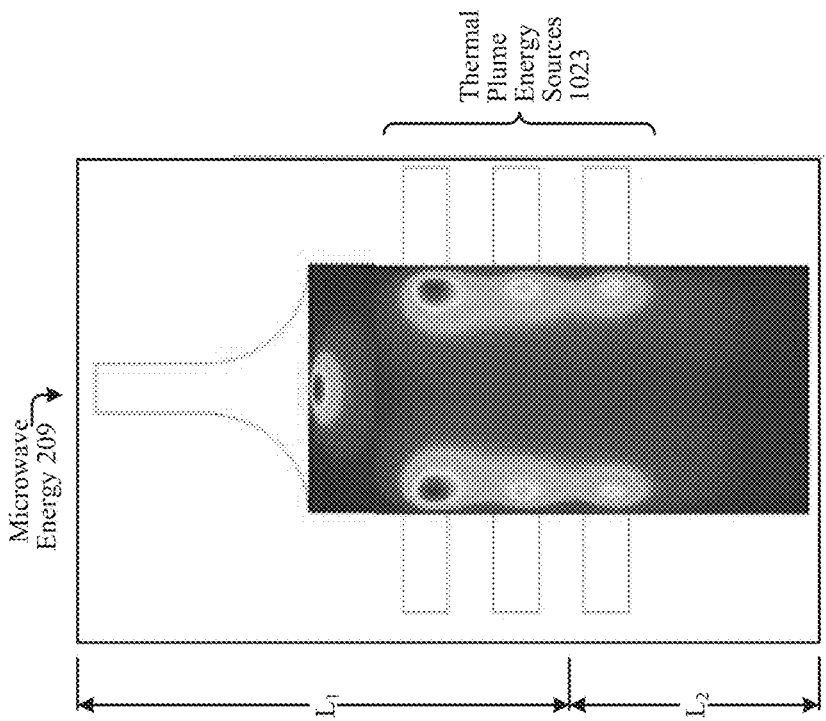
*Figure 10E2*
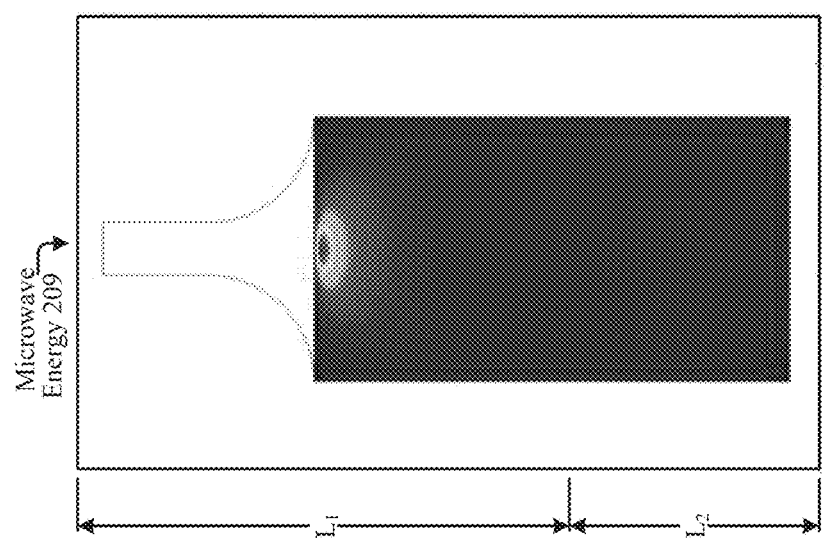
*Figure 10E1*

TEMPERATURE-CONTROLLED CHEMICAL PROCESSING REACTOR

CROSS-REFERENCE TO RELATED APPLICATIONS

This application is a continuation-in-part application and claims priority to U.S. patent application Ser. No. 15/676,649 filed on Aug. 14, 2017 and entitled "MICROWAVE CHEMICAL PROCESSING REACTOR," which is a continuation of U.S. patent application Ser. No. 15/428,474 filed on Feb. 9, 2017 and entitled "MICROWAVE CHEMICAL PROCESSING REACTOR" (now U.S. Pat. No. 9,767,992), all of which are assigned to the assignee hereof. The disclosures of all prior Applications are considered part of and are incorporated by reference in this Patent Application.

TECHNICAL FIELD

This disclosure relates generally to reactors for producing carbon agglomerates, and, more particularly, to reactors featuring multiple energy sources.

DESCRIPTION OF RELATED ART

Plasma-based processing of gases has emerged as a preferred industrial solution. In such settings, microwave are typically propagated into a reaction chamber enclosing a gaseous mixture to excite the mixture and, in turn, generate a plasma, which can assist in dissociation of gas molecules into their respective constituent species. Such systems are effective since microwaves introduced into the reaction chamber operate at relatively high-power coupling efficiencies at low ion energies and are thus capable of supporting various gas reactions, such as the conversion of methane into hydrogen and carbon particulates, which can be further processed, for functionalization thereof and for synthesis of layered materials.

After an initial dissociation of precursors gaseous species prevalent in the reaction chamber used to generate the plasma, the dissociated constituent species move away from this first reactor region into a downstream reactor region where the temperature cools, and plasma density begins to diminish due to recombination. This downstream reactor region can be referred to as the "afterglow region", which is particularly conducive for the formation of carbon particles, which can be subsequently further fused together to create larger interconnected networks, agglomerations, and structures. Various parameters can influence the shape of carbon growth, including concentration of precursor gas species (C, $C_2$, $C_xH_y$, etc.), particle temperatures, and particle charge. If additional forms of energy or cooling are not applied to the afterglow region, conditions in the afterglow can be mostly dictated by conditions in the main plasma region. This phenomena results in a narrow region of control of particle morphology. Control the conditions in the afterglow (such particle temperature, electron density and temperature, neutral gas temperature), and in other zones of the reactor can allow for better control over assembly processes of the particles, their morphology, and chemical compositions.

SUMMARY

The systems, methods and devices of this disclosure each have several innovative aspects, no single one of which is solely responsible for the desirable attributes disclosed herein.

One innovative aspect of the subject matter described in this disclosure can be implemented in a reactor system. In some implementations, the reactor system includes a microwave source, one or more energy sources, and a field-enhancing waveguide (FEWG). The microwave source may be configured to generate a microwave energy. In some aspects, the microwave energy may be pulsed according to a pulse frequency. The one or more energy sources may be configured to generate a thermal energy. The FEWG may be coupled to the microwave source and may include a field-enhancing zone and an outlet. In some aspects, the FEWG may have a cross-sectional area that decreases along a length of the FEWG.

In some implementations, the field-enhancing zone may include a supply gas inlet configured to receive a supply gas, a reaction zone configured to generate a plasma in response to excitation of the supply gas by the microwave energy, a process inlet configured to inject a raw material into the reaction zone, and an afterglow region configured to combine the plasma and the raw material in response to the thermal energy. The outlet may be configured to output a plurality of carbon-inclusive particles resulting from the combination of the plasma and the raw material. In some aspects, the field-enhancing zone may be configured to concentrate the microwave energy. In addition, or in the alternative, the raw material may be any one or more of carbonaceous particles, colloidal dispersions, or a plurality of solid particles.

The reactor system may also include a pair of electrodes positioned on opposite sides of the FEWG proximate to the reaction zone. In some aspects, the pair of electrodes may be configured to generate an electric field through which the plasma and the raw material are further combined. In addition, or in the alternative, the FEWG may also include a controller configured to adjust one or more of an electron density, an electron temperature, or a gas temperature within the FEWG.

In some implementations, the FEWG may be configured to self-nucleate the carbon-inclusive particles. In some aspects, the carbon-inclusive particles may include graphene platelets. In one or more of some of the aspects, the FEWG may be configured to fuse the graphene platelets to each other at substantially orthogonal angles. In addition, or in the alternative, the FEWG may include a tunable waveguide configured to selectively adjust one or more angles at which the generated graphene platelets are fused together.

The one or more energy sources may include at least one secondary zone configured to generate a secondary microwave energy. In some aspects, the one or more energy sources may be configured to adjust a pulsing frequency of the secondary microwave energy. In other aspects, the one or more energy sources may be configured to adjust a pulsing duty cycle of the secondary microwave energy. In some other aspects, the one or more energy sources may be configured to adjust a pulsing shape of the secondary microwave energy. In some other aspects, the one or more energy sources may be configured to adjust selectively pulse an output power level of the secondary microwave energy.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

FIGS. 10B1 and 10B2 depict power intensity maps in the reactor, with and without additional microwave energy being provided into the FEWG, according to some implementations.

FIGS. 10C1 and 10C2 depict electron density maps in the reactor, with and without additional microwave energy being provided into the FEWG, according to some implementations.

FIGS. 10D1 and 10D2 depict electron temperature maps in the reactor, with and without additional microwave energy being provided into the FEWG, according to some implementations.

FIGS. 10E1 and 10E2 depict radical density maps in the reactor, with and without additional microwave energy being provided into the FEWG, according to some implementations.

DETAILED DESCRIPTION

Figure 1A:
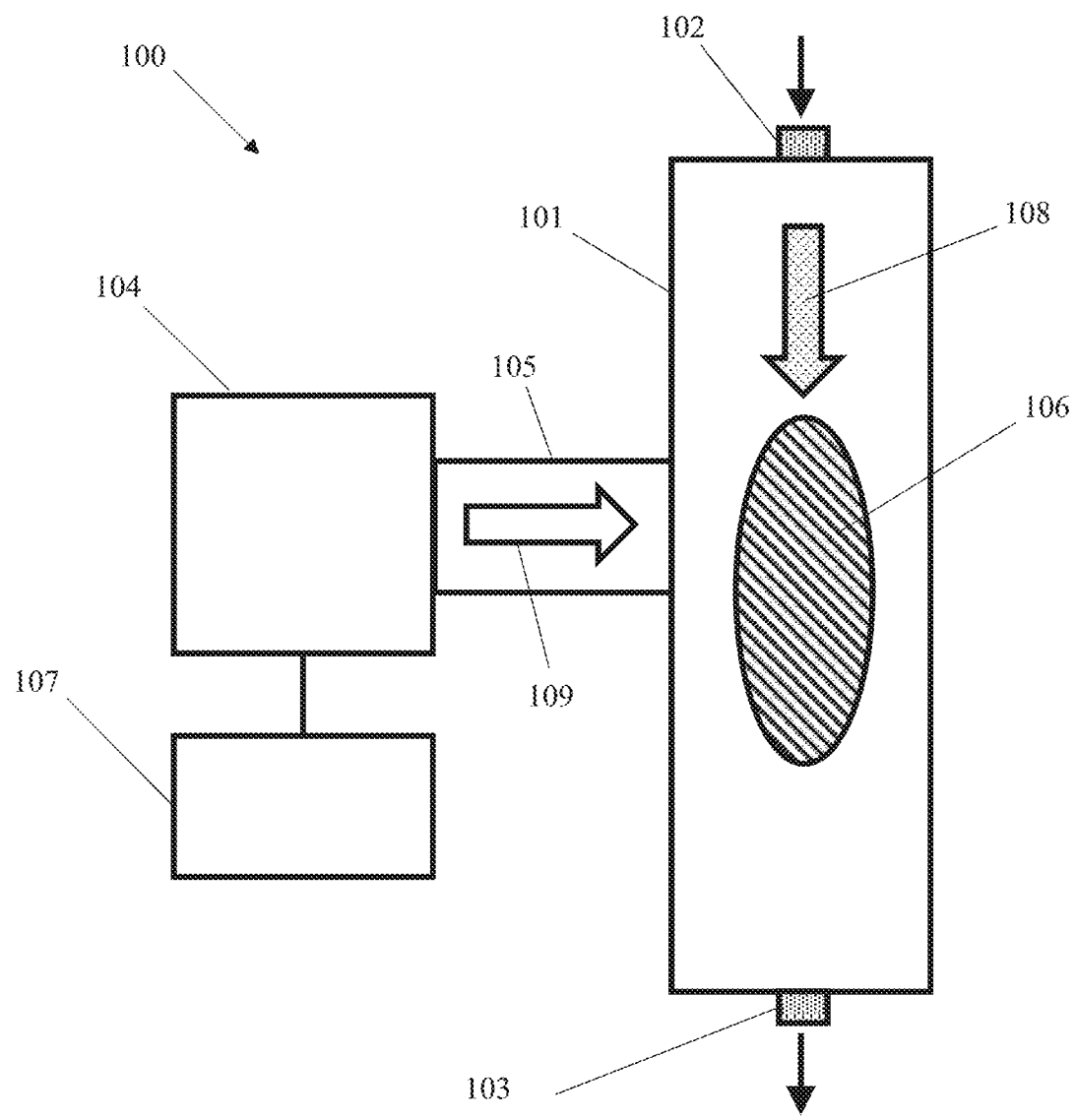
FIG. 1A shows a vertical cross-section of a conventional microwave chemical processing system.

Reference now will be made to implementations of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the scope thereof. For instance, features illustrated or described as part of one embodiment may be used with another embodiment to yield a still further embodiment. Thus, it is intended that the present subject matter covers all such modifications and variations within the scope of the appended claims and their equivalents.

Embodiments of the present systems and methods can be used for generating carbon-inclusive particles from raw materials using microwave plasma chemical processing techniques disclosed herein. In some implementations, the raw materials can be gases, liquids, or colloidal dispersions. In some other implementations, the raw materials can be or include any one or more of carbonaceous particles, colloidal dispersions, or a plurality of solid particles. In some aspects, the raw materials can be processed into separated components in a reaction zone of a waveguide. In some implementations, the waveguide can be a field-enhancing waveguide that not only allows relatively large quantities of raw materials to be processed, but also serves as a reaction chamber within which a plasma can be created or generated in response to excitation of the supply gas by the microwave energy. This is in contrast to conventional systems that use a quartz chamber separate and distinct from the waveguide to process the raw materials into plasma. In such conventional systems, particulate build-up on the quartz chamber walls can impede the penetration of microwave energy through the quartz chamber walls, thereby reducing the efficiency with which such conventional systems can process raw materials. More specifically, by propagating microwave energy along a waveguide that also serves as the reaction chamber to process raw materials into plasma, the efficiency with which reactor systems disclosed herein can process the raw materials into plasma is not susceptible to particulate build-up on the chamber walls, which is just one example of the advantages realized by various aspects of the subject matter disclosed herein.

As used herein, the term "field-enhancing waveguide" (FEWG) refers to a waveguide with a first cross-sectional area and a second cross-sectional area, where the second cross-sectional area is smaller than the first cross-sectional area and is farther away from the microwave energy source than the first cross-sectional area. The decrease in cross-sectional area enhances the field by concentrating the microwave energy, with the dimensions of the waveguide being set to maintain propagation of the specific microwave frequency being used. The second cross-sectional area of the FEWG extends along a reaction length that forms the reaction zone of the FEWG. There is a field-enhancing zone between the first cross-sectional area and the second cross-sectional area of a FEWG. In some aspects, the field-enhancing zone can change cross-sectional area in a continuous manner (such as linearly or non-linearly) or an abrupt manner (such as through one or more discrete steps). In some aspects, the pressure within the FEWGs are from 0.1 atm to 10 atm, or from 0.5 atm to 10 atm, or from 0.9 atm to 10 atm, or greater than 0.1 atm, or greater than 0.5 atm, or greater than 0.9 atm.

The microwave plasma chemical processing reactors of the present disclosure can include or can be associated with one or more supply gas inlets into which a supply gas is flowed and one or more process inlets into which the input material is flowed. The supply gas and process inlets are located in or upstream of the reaction zone, and the supply gas is used to generate a plasma in the reaction zone. The supply gas flows can be from 1 slm (standard liters per minute) to 1000 slm, or from 2 slm to 1000 slm, or from 5 slm to 1000 slm, or greater than 1 slm, or greater than 2 slm, or greater than 5 slm. The process material is a gas, and the flow rates are from 1 slm (standard liters per minute) to 1000 slm, or from 2 slm to 1000 slm, or from 5 slm to 1000 slm, or greater than 1 slm, or greater than 2 slm, or greater than 5 slm. The process material is a liquid, or a colloidal dispersion and the flow rates are from less than 1% to greater than 100% of the supply gas flow.

The microwave plasma chemical processing reactors of the present disclosure can have a single microwave energy generator, which is a source of microwave energy coupled to one or more than one FEWG. Disclosed reactors can have more than one microwave energy generator, coupled to more than one FEWG. The microwave energy is continuous wave or pulsed. The microwave energy generator power is from 1 kW to 100 kW. Disclosed reactors can have more than one reaction zone, which are connected together and have one or more than one outlet from which to collect the separated components. Disclosed reactors can contain multiple FEWGs with different geometries including manifold arrangements, and network arrangements. These geometries will be described more fully herein.

Disclosed reactors of the present disclosure have reaction zones with walls, and the supply gas and process inlets provide the supply gas (for creating the microwave plasma) and input material to the reaction zone through the walls. There can be a plurality of supply gas and process inlets that provide the supply gas and input material to the reaction zone through the walls in controlled mass fractions. Providing the supply gas and input material to the reaction zone through the walls in controlled mass fractions can mitigate the deposition of the separated components on the reaction zone walls.

Microwave plasma chemical processing of hydrocarbon gases can use various techniques including pulsing of the microwave energy to control the energy of the plasma. The ability to control the energy of the plasma enables the selection of one or more reaction pathways in conversion of the hydrocarbon gases into specific separated components. Pulsed microwave energy can be used to control the energy of the plasma because the short-lived high-energy species that are created when a plasma ignites can be re-generated at the start of each new pulse. The plasma energy is controlled to have a lower average ion energy than conventional techniques, but at a high enough level to enable the targeted chemical reactions to occur at high gas flows and high pressures.

Microwave plasma chemical processing systems using pulsed microwave energy have been developed that control the energy of the plasma and have very high cracking efficiency, in excess of 90%. These conventional systems, however, use low flow rates, below 1 standard liter per minute (slm), and small gas volumes within the plasma, with a consequence that the production rate is low, and the production cost is high. These conventional systems cannot increase the gas flow rate and the gas volume within the plasma while using high frequency microwave pulsing (such as above roughly 100 Hz) because the plasma cannot ignite fast enough to keep up with the pulses when a large volume and high flow of gas is used.

Microwave Chemical Processing Systems

In the present disclosure, a microwave plasma can be generated in a supply gas and/or process material, and the energy in the plasma is sufficient to form separated components from process material molecules. A source of microwave energy is coupled to a FEWG, the plasma is generated along a plasma zone of the FEWG, and the process material is separated into components by the plasma along the reaction length in in the FEWG. The microwave energy is coupled directly into the plasma and not through a dielectric wall as in conventional methods.

In the present disclosure, a microwave plasma can be generated in a supply gas and/or process material, and the energy in the plasma is sufficient to form separated components from process material molecules. A source of microwave energy is coupled to a FEWG, the plasma is generated along a plasma zone of the FEWG, and the process material is separated into components by the plasma along the reaction length in in the FEWG. The microwave energy is coupled directly into the plasma and not through a dielectric wall as in conventional methods.

FIG. 1A illustrates a conventional microwave chemical processing system. As shown in FIG. 1A, a microwave chemical processing system 100 generally includes a reaction chamber 101, one or more gas inlets 102 configured to receive process material 108 flowing into the reaction chamber, one or more outlets 103 configured to collect separated products out of the reaction chamber 101, and a source of microwave energy 104 that is coupled to the reaction chamber through a waveguide 105, among other elements not shown for simplicity. The microwave energy 109 creates a microwave plasma 106 in the reaction chamber 101 and provides energy for reactions to occur. A microwave emitter circuit 107 can control the microwave energy 109 emitted from the microwave energy source 104 to be either continuous wave or pulsed. Given the right conditions, the energy in the plasma will be sufficient to form separated components from the process material molecules.

Microwave Chemical Processing Reactors with Field-Enhancing Waveguides (FEWGS)

Figure 1B:
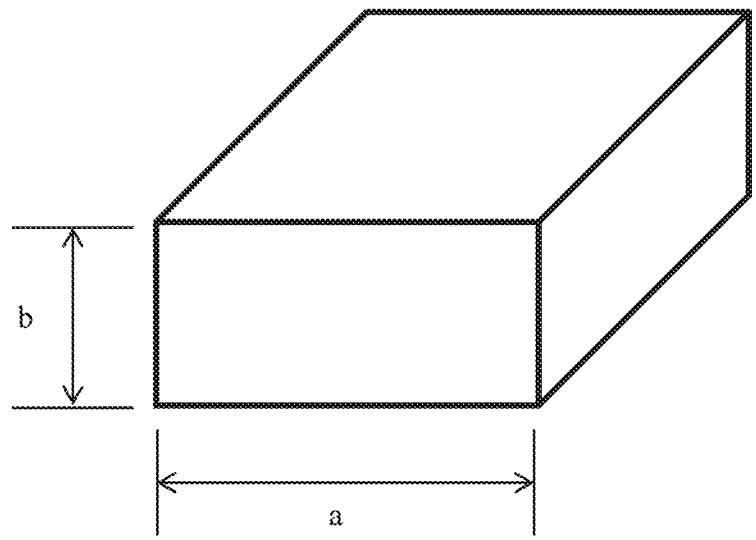
FIGS. 1B and 1C show example geometries and dimensions of waveguides of the present disclosure.

As shown in FIG. 1B, the widest dimension of a waveguide is called the "a" dimension and determines the range of operating frequencies. The narrowest dimension determines the power-handling capability of the waveguide and is called the "b" dimension. The FEWGs of the present disclosure efficiently transfer microwave frequency electromagnetic energy. The FEWGs of the present disclosure are constructed from conductive material and may be rectangular, circular, or elliptical in cross-section.

Figure 1C:
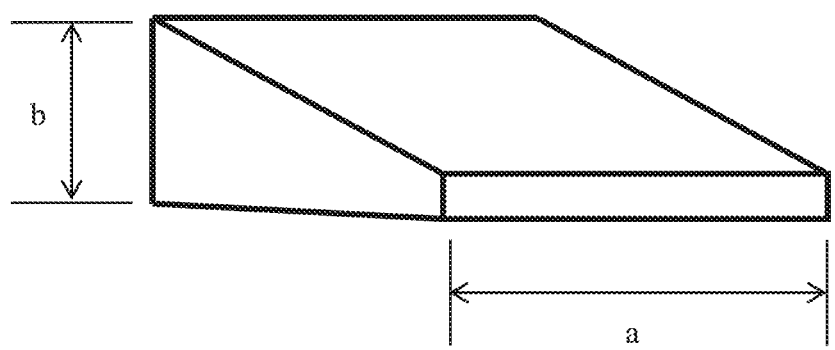

FIG. 1C shows an example of a field-enhancing region of a FEWG, where the widest dimension "a" stays constant in order to effectively transmit a selected frequency of microwave energy, and the narrower dimension "b" is reduced along the length of the FEWG in order to concentrate the microwave energy density. FIG. 1C depicts a linear decrease of dimension "b"; however, the decrease in the dimension "b" could be non-linear (such as parabolic, hyperbolic, etc.), have different rates of decrease along the length (such as different slopes of linear decrease, of linear in one section and non-linear in another section), or contain abrupt steps to decrease the length of dimension "b". Disclosed configurations or implementations can be applicable for both stationary wave systems (where the peaks remain at the same location) and traveling wave systems (where the peaks can move).

Figure 2:
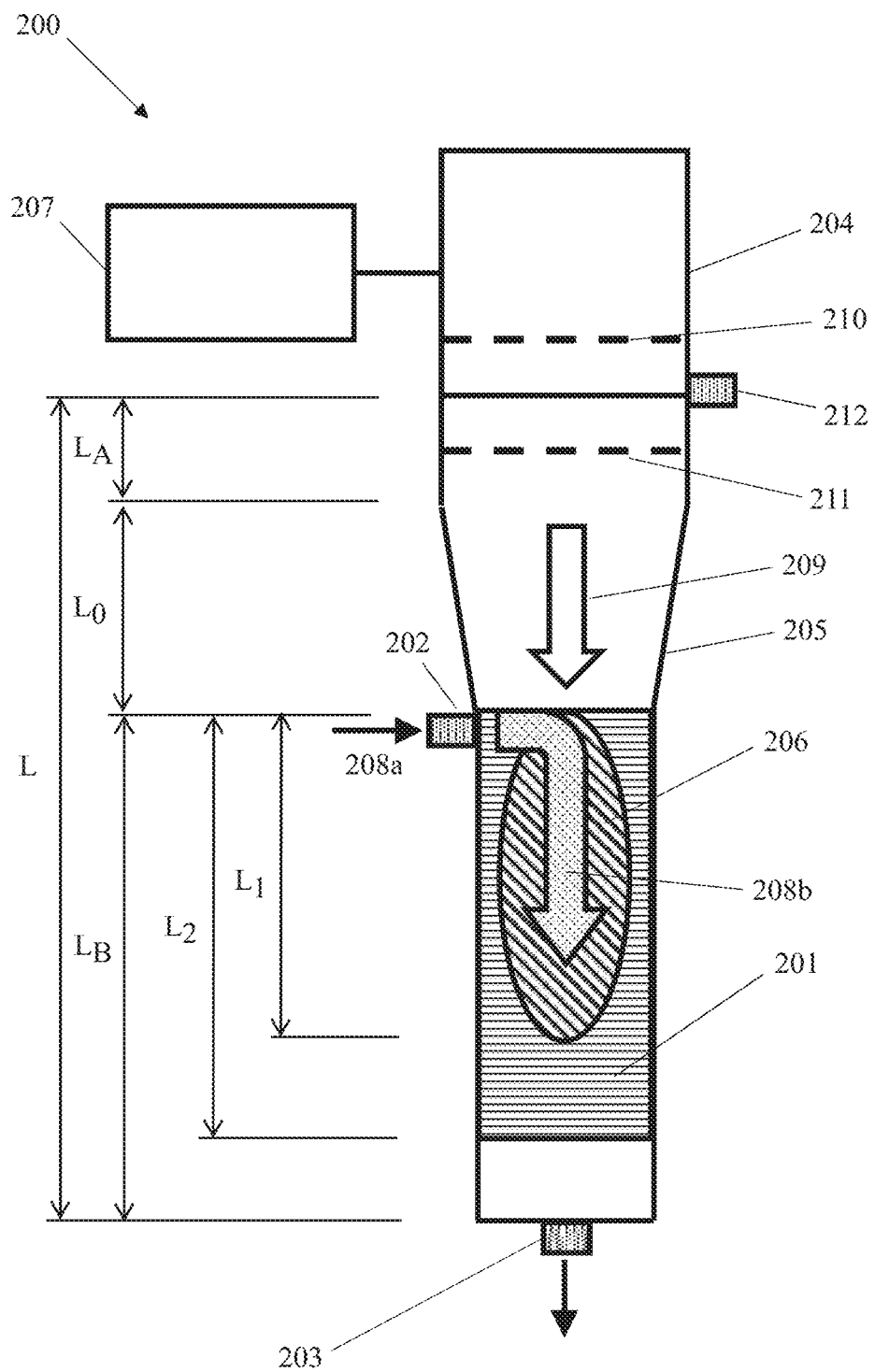
FIG. 2 shows a simplified vertical cross-section of a microwave gas processing system, according to some implementations.
Figure 3:
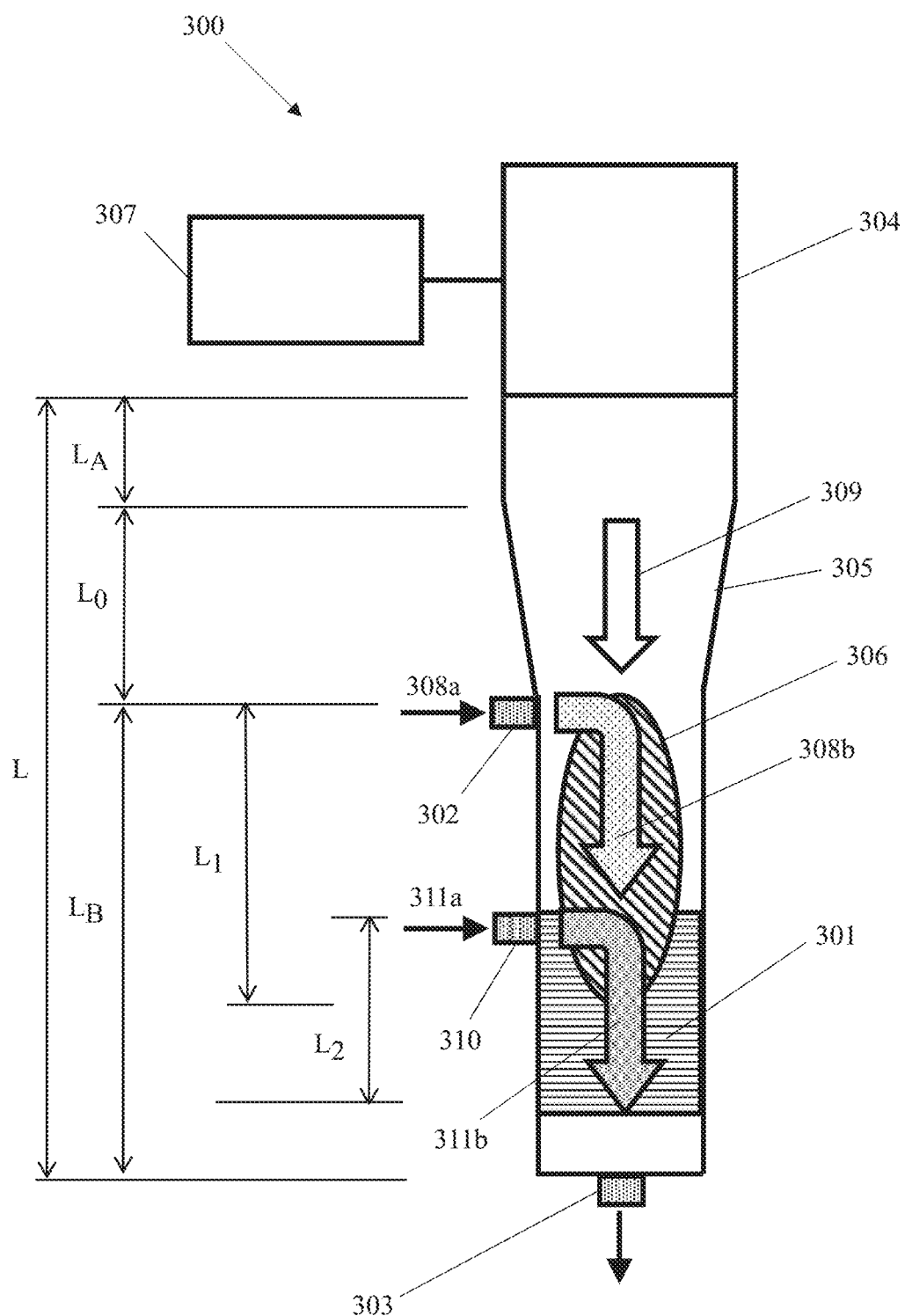
FIG. 3 shows a simplified vertical cross-section of a microwave gas processing system, according to other implementations.

FIG. 2 and FIG. 3 show microwave chemical processing systems where a FEWG is coupled to a microwave energy generator (such as a microwave energy source), a plasma is generated from a supply gas in a plasma zone of the FEWG, and a reaction length of the FEWG serves as the reaction zone to separate the process material into separate components. The present reactors as demonstrated by FIG. 2 and FIG. 3 are absent of a dielectric barrier between the field-enhancing zone of the field-enhancing waveguide and the reaction zone. In contrast, the reaction zones of conventional systems, are enclosed within a dielectric barrier such as a quartz chamber as explained previously. The direction of propagation of the microwave energy is parallel to the majority of the flow of the supply gas and/or the process material, and the microwave energy enters the waveguide upstream of the portion of the FEWG where the separated components are generated.

As shown in FIG. 2, a microwave chemical processing reactor 200 includes a FEWG 205, one or more inlets 202 configured to receive supply gas and/or process material 208a flowing into the FEWG 205, and a microwave energy source 204 that is coupled to the FEWG 205, among other elements not shown for simplicity. microwave circuit 207 controls a pulsing frequency at which microwave energy 209 from microwave energy source 204 is pulsed. The microwave energy 209 from microwave energy source 204 is continuous wave.

The FEWG 205 has a length L. The portion of the FEWG 205 with length LA (shown in FIG. 2 and FIG. 3) is closer to the microwave energy generator than the portion of the FEWG with length LB (shown in FIG. 2 and FIG. 3). Throughout this disclosure, different portions of the FEWG will be described by a capital L with a subscript denoting the certain portion of the FEWG (such as $L_A$, $L_0$, $L_B$, $L_1$, $L_2$), and synonymously, the lengths of the different portions of the FEWG will also be described by a capital L with a subscript denoting the length of a certain portion of the FEWG (such as $L_A$, $L_0$, $L_B$, $L_1$, $L_2$).

The cross-sectional area of the FEWG in length $L_B$ is smaller than the cross-sectional area of the FEWG in length $L_A$. The length of the FEWG $L_0$, is located between lengths $L_A$ and $L_B$ of the FEWG and has a decreasing cross-sectional area along the path of the microwave energy propagation. The cross-sectional area of the FEWG along length $L_0$ can decrease in a continuous manner. The cross-sectional area of the FEWG along length $L_0$ decreases linearly between lengths $L_A$ and $L_B$. The cross-sectional area of the FEWG along length $L_0$ can decrease non-linearly between lengths $L_A$ and $L_B$, such as decreasing parabolically, hyperbolically, exponentially, or logarithmically. The cross-sectional area of the FEWG along length $L_0$ decreases in a or an abrupt manner between lengths $L_A$ and $L_B$, such as decreasing through one or more discrete steps. The decrease in cross-sectional area serves to concentrate the electric field, thus increasing the microwave energy density while still providing a significant amount of area in which plasma can be formed compared to conventional systems. The portion of the FEWG with length $L_B$ (shown in FIG. 2 and FIG. 3) may have a rectangular cross-section of dimensions 0.75 inches by 3.4 inches when using a microwave energy frequency of 2.45 GHz. This cross-sectional area is much greater than conventional systems where the plasma generation area is generally less than one square inch. The dimensions of the different portions of the FEWG 205 are set according to the microwave frequency, in order to properly function as a waveguide. For example, for an elliptical waveguide the cross-sectional dimensions can be 5.02 inches by 2.83 inches for 2.1-2.7 GHz.

In conventional gas processing systems, the limited region in which plasma can form, such as less than one square inch as described above, constrains the volume in which gas reactions can occur. Also, in conventional systems the microwave energy enters the reaction chamber through a window (typically quartz). In these systems, dielectric materials (such as particulate carbon) are coated on the window during processing leading to a decreased power delivery over time. This can be highly problematic if these separated components absorb microwave energy because they can prevent the microwave energy from coupling into the reaction chamber to generate the plasma. Consequently, a rapid build-up of by-products, such as carbon particles that are produced from the gas reactions, occurs, and limits the run-time of the processing equipment. The system 200 can be designed without the use of a window in the reaction zone; that is, using a parallel propagation/gas flow system where the energy enters upstream from the reaction. As a result, more energy and power can be coupled into the plasma from the microwave energy source. The lack of a window and the greater volume within the waveguide, compared to limited reaction chamber volumes in conventional systems, greatly reduces the issue of particle build-up causing limited run-times, thus improving production efficiency of the microwave processing system.

The microwave energy 209 in FIG. 2 creates a microwave plasma 206 in the supply gas and/or process material within a plasma zone with length $L_1$ (shown in FIG. 2 and FIG. 3) of the length of the FEWG 205. The plasma zone with length $L_1$ is located within the portion of the FEWG $L_B$, where the cross-sectional area is smaller, and the microwave energy density is higher than in length $L_A$. A supply gas that is different from the process material is used to generate the microwave plasma 206. The supply gas may be, for example, hydrogen, helium, a noble gas such as argon, or mixtures of more than one type of gas. The supply gas can be the same as the process material, where the process material is the material from which separated components are being created.

The supply gas and/or process material inlet 202 can be located upstream from the portion of the FEWG $L_B$, or is located within the portion of the FEWG $L_0$, or is located within the portion of the FEWG $L_A$, or is located upstream of the portion of the FEWG $L_A$. The portion of the FEWG $L_1$ extends from a position along the FEWG downstream from the position where the supply gas and/or process material 208a enters the FEWG, to the end of the FEWG or to a position between the entrance of the supply gas and/or process material and the end of the FEWG 205. The portion of the FEWG $L_1$ extends from where the supply gas and/or process material 208a enters the FEWG, to the end of the FEWG or to a position between the entrance of the supply gas and/or process material and the end of the FEWG.

The generated plasma 206 provides energy for reactions to occur in process material 208b within a reaction zone 201 of the FEWG 205 having a reaction length $L_2$. Reaction zone $L_2$ extends from where the process material 208a enters the FEWG 205, to the end of the FEWG 205 or to a position between the entrance of the process material and the end of the FEWG 205. Given the right conditions, the energy in the plasma 206 will be sufficient to form separated components from the process material molecules. One or more outlets 203 are configured to collect the separated products out of the FEWG 205 downstream of the reaction zone portion of the FEWG where reactions occur in the process material 208b. In the example shown in FIG. 2, the propagation direction of the microwave energy 209 is parallel with the majority of the supply gas and/or process material flow 208b, and the microwave energy 209 enters the FEWG 205 upstream of the reaction zone 201 of the FEWG where the separated components are generated.

A pressure barrier 210 that is transparent to microwave energy can be located within the microwave energy source 204, near the outlet of the microwave energy source, or at other locations between the microwave energy source 204 and the plasma 206 produced in the FEWG. This pressure barrier 210 can serve as a safety measure to protect from potential backflow of plasma into the microwave energy source 204. Plasma does not form at the pressure barrier itself; instead, the pressure barrier is simply a mechanical barrier. Some examples of materials that the pressure barrier can be made of are quartz, ethylene tetrafluoroethylene (ETFE), other plastics, or ceramics. There can be two pressure barriers 210 and 211, where one or both pressure barriers 210 and 211 are within the microwave energy source 204, near the outlet of the microwave energy source, or at other locations between the microwave energy source 204 and the plasma 206 produced in the FEWG. The pressure barrier 211 can be closer to the plasma 206 in the FEWG than the pressure barrier 210, and there is a pressure blowout port 212 between the pressure barriers 210 and 211 in case the pressure barrier 211 fails.

A plasma backstop (not shown) can be included in the system to prevent the plasma from propagating to the microwave energy source 204 or the supply gas and/or process material inlet(s) 202. The plasma backstop can be a ceramic or metallic filter with holes to allow the microwave energy to pass through the plasma backstop but preventing the majority of the plasma species from passing through. The majority of the plasma species will be unable to pass the plasma backstop because the holes will have a high aspect ratio, and the plasma species will recombine when they hit the sidewalls of the holes. The plasma backstop is located between portion $L_0$ and $L_1$, or within portion $L_0$ upstream of portion $L_1$ and downstream of the inlet(s) 202 (in an embodiment where inlet 202 is within portion $L_0$) and the microwave energy source 204.

FIG. 3 shows another embodiment of a microwave chemical processing system 300 in which a supply gas and a process material are injected at different locations. The microwave chemical processing system 300 generally includes a FEWG 305, one or more supply gas inlets 302 configured to receive supply gas 308a flowing into the FEWG 305, one or more process material inlets 310 configured to receive process material 311a, and a source of microwave energy 304 that is coupled to the FEWG 305, among other elements not shown for simplicity. The location of process material inlet 310 is downstream of the location of supply gas inlet 302, where downstream is defined in a direction of the microwave energy propagation.

Microwave circuit 307 can control a pulsing frequency at which microwave energy 309 from microwave energy source 304 is pulsed. The microwave energy from microwave energy source 304 can be a continuous wave. Similar to the embodiment shown in FIG. 2, the FEWG 305 in FIG. 3 has portions $L_A$, $L_0$, $L_B$, $L_1$, and $L_2$, where portion $L_B$ has a cross-sectional area smaller than that of $L_A$, portion $L_0$ has a decreasing cross-sectional area between portion $L_A$ and $L_B$, $L_1$ is the portion where the plasma is generated, and $L_2$ is the portion that is the reaction zone.

The microwave energy 309 creates a microwave plasma 306 in the supply gas 308b within a plasma zone $L_1$ of the length L of the FEWG 305. Portion $L_1$ can extend from a position along the FEWG 305 downstream from the position where the supply gas 308a enters the FEWG 305, to the end of the FEWG 305 or to a position between the entrance of the supply gas and the end of the FEWG 305. Portion $L_1$ can extend from where the supply gas 308a enters the FEWG 305, to the end of the FEWG 305 or to a position between the entrance of the supply gas and the end of the FEWG 305. One or more additional process material inlets 310 are configured to receive process material flowing into the FEWG at a second set of locations downstream of the supply gas inlet(s) 302. The generated plasma 306 provides energy for reactions to occur within the reaction zone 301 of the FEWG 305 having a reaction length $L_2$.

Portion $L_2$ can extend from where the process material 311a enters the FEWG 305, to the end of the FEWG 305 or to a position between the entrance of the process material and the end of the FEWG 305. Given the right conditions, the energy in the plasma will be sufficient to form separated components from the process material molecules. One or more outlets 303 are configured to collect the separated products out of the FEWG 305 downstream of the portion 301 where reactions occur. In the example system 300 shown in FIG. 3, the propagation direction of the microwave energy 309 is parallel with the majority of the supply gas flow 308b and the process material flow 311b, and the microwave energy 309 enters the FEWG 305 upstream of the reaction portion 301 of the FEWG where the separated components are generated.

One or more pressure barriers that are transparent to microwave energy can be located within the microwave energy source 304, near the outlet of the microwave energy source, or at other locations between the microwave energy source 304 and the plasma 306 produced in the FEWG (similar to what is described above and depicted in FIG. 2). There can be two pressure barriers and a pressure blowout port between the pressure barriers in case the barrier closer to the plasma 306 in the FEWG fails.

The walls of the reaction zone $L_2$ can be configured such that the supply gas inlets and process material inlets provide the supply gas and process material to the reaction zone through the walls of the FEWG. For example, the walls can have a series of holes that serve as secondary supply gas inlets through which the supply gas and/or process material can be inserted into the FEWG, or the walls can be permeable to the supply and/or process material, or the walls can be porous. Providing the supply gas and input material to the reaction zone through the walls can mitigate the deposition of the separated components on the reaction zone walls, by forming a reactive plasma close to the wall that etches away deposited material.

There can be a plurality of supply gas and process inlets that provide the supply gas and input material to the reaction zone $L_2$ through the walls of the FEWG. There can be a plurality of supply gas and process inlets that are configured to provide controlled mass fractions of the supply gas and input material to the reaction zone $L_2$ through the FEWG walls. Having supply gas and process material introduced into the FEWG with controlled mass fractions can more effectively etch away any material that is deposited on the walls of the FEWG in the reaction zone.

As described above, the FEWG (such as 205 in FIG. 2, and 305 in FIG. 3) has a total length L, a portion of the total length $L_A$ and a portion $L_B$ where the cross-sectional area of $L_B$ is smaller than that of $L_A$, a portion $L_1$ along which the plasma is generated, and a portion of the total length $L_2$ along which the process material is converted into the separated components. The total length L of the waveguide can be from 1 cm to 1000 cm. Length $L_0$ of the waveguide can be from 1 cm to 100 cm. Length $L_1$ of the waveguide can be from 1 cm to 100 cm. Length $L_2$ of the waveguide can be from 1 cm to 1000 cm. Length L of the waveguide can be from 30 cm to 60 cm. Length $L_0$ of the waveguide can be from 10 cm to 40 cm. Length $L_1$ of the waveguide can be from 10 cm to 30 cm. Length $L_2$ of the waveguide can be from 5 cm to 20 cm. The portion of the FEWG length $L_A$ is from, for example, 0 inches to 10 inches for a microwave frequency of 2.45 GHz, although the length can vary according to the microwave frequency used. The portion of the FEWG length $L_B$ is from, for example, 10 inches to 20 inches, which will depend on factors such as the gas flow velocity and microwave power.

For example, higher gas flow velocities will expand the reaction zone length. length $L_1$ is more than 10%, or more than 20%, or more than 30% or more than 40% or more than 50%, or more than 60%, or more than 70%, or more than 80%, or from 10% to 90%, or from 20% to 80%, or from 30% to 70% of the length of the waveguide, L. length $L_2$ is more than 5%, or more than 10%, or more than 15% or more than 20%, or more than 25% or more than 30%, or more than 35%, or more than 40%, or more than 45%, or more than 50%, or more than 55%, or more than 60%, or from 1% to 90%, or from 1% to 70%, or from 1% to 50%, or from 10% to 50%, or from 10% to 40%, or from 20% to 40% of the length of the waveguide, L.

The FEWG (such as 205 in FIG. 2, and 305 in FIG. 3) can be configured to maintain a pressure from 0.1 atm to 10 atm, or from 0.5 atm to 10 atm, or from 0.9 atm to 10 atm, or greater than 0.1 atm, or greater than 0.5 atm, or greater than 0.9 atm. In many conventional systems, the microwave chemical processing is operated at vacuum. However, in the present embodiments with the plasma being generated within the FEWG, operating in a positive pressure environment assists in preventing the generated plasma from feeding back into the microwave energy source (such as 204 in FIG. 2, and 304 in FIG. 3).

The FEWG (such as 205 in FIG. 2, and 305 in FIG. 3) may have a rectangular cross-section within length $L_B$ of dimensions 0.75 inches by 3.4 inches, to correspond to a microwave energy frequency of 2.45 GHz. Other dimensions of $L_B$ are possible for other microwave frequencies, and dependent upon waveguide mode these cross-sectional dimensions can be from 3-6 inches. The FEWG (such as 205 in FIG. 2, and 305 in FIG. 3) may have a rectangular cross-section within length $L_A$ of dimensions 1.7 inches by 3.4 inches, for example, to correspond to a microwave energy frequency of 2.45 GHz. Other dimensions of $L_A$ are possible for other microwave frequencies. The FEWG may be made of any innately conductive material or a material with a sufficient conductive coated layer to propagate greater than 90% of incoming power. Some examples of FEWG materials are a metallic material, a metallic material with a conductive coating, a ceramic material, a ceramic material with a conductive coating, stainless steel, stainless steel coated with a conductive layer (such as Al, Ni, Au, or a Ni/Au alloy), stainless steel with an aluminum liner, or a ceramic material coated with a conductive layer.

Notably, the FEWG serves as the chamber in which the plasma is generated and the process material reactions to occur, rather than having a separate waveguide and quartz reaction chamber as in conventional systems. Having the FEWG serve as the reactor chamber provides a much larger volume in which gas reactions can occur (such as up to 1000 L). This enables high flow rates of process material to be processed, without being limited by a build-up of carbon particulate as occurs in conventional systems. For example, process material flow rates through the inlet (such as 202 in FIG. 2, and 310 in FIG. 3) into the waveguide (such as 205 in FIG. 2, and 305 in FIG. 3) may be from 1 slm (standard liters per minute) to 1000 slm, or from 2 slm to 1000 slm, or from 5 slm to 1000 slm, or greater than 1 slm, or greater than 2 slm, or greater than 5 slm. Supply gas flow rates through the inlet (such as 202 in FIG. 2, and 302 in FIG. 3) into the waveguide (such as 205 in FIG. 2, and 305 in FIG. 3) may be, for example, from 1 slm to 1000 slm, or from 2 slm to 1000 slm, or from 5 slm to 1000 slm, or greater than 1 slm, or greater than 2 slm, or greater than 5 slm. Dependent upon the gas plasma properties that result in sufficient plasma density (such as secondary electron emission coefficient) the flows can be from 1 slm to 1000 slm and with pressures up to 14 atm.

The process material can be a liquid that is provided through the process material inlet into the FEWG. Some examples of liquids that can be used as process materials are water, alkanes, alkenes, alkynes, aromatic hydrocarbons, saturated and unsaturated hydrocarbons (such as of alkanes, alkenes, alkynes, or aromatic hydrocarbons), ethanol, methanol, isopropyl alcohol (such as isopropanol), or mixtures thereof (such as a 50/50 mixture of ethanol/methanol). The liquid process materials listed above can produce carbon and hydrogen separated components. The flow rate of the liquid can be a percentage of the supply gas flow into the reactor, such as from 0.001% to 1000%, or from 0.001% to 100%, or from 0.001% to 10%, or from 0.001% to 1%, or from 0.001% to 0.1%, or from 0.01% to 1000%, or from 0.01% to 100%, or from 0.01% to 10%, or from 0.01% to 1%, or from 0.01% to 0.1%.

The process material can be a colloidal dispersion (such as a mixture of solid particles suspended in a liquid or a gas) that is provided through the process material inlet into the FEWG. For example, the colloidal dispersion can include carbonaceous particles. Some examples of colloidal dispersions that can be used as process materials are solid particles from the Group 16, Group 14, Group 10, Group 9, Group 5, Group 2, Group 1, alloys thereof, and mixtures thereof, mixed with a liquid or a gas. The solid particles listed above can be mixed with liquids such as water, alkanes, alkenes, alkynes, aromatic hydrocarbons, saturated and unsaturated hydrocarbons (such as of alkanes, alkenes, alkynes, or aromatic hydrocarbons), ethanol, methanol, isopropyl alcohol, or mixtures thereof (such as a 50/50 mixture of ethanol/methanol).

Examples of gases are Group 1 and Group 15-18, as well as inorganic compounds (such as group 14 hydride). Some examples of separated components that can be produced from the colloidal dispersion process materials listed above are solid inorganic materials coated in organic materials (such as silicon coated with graphene), and composite materials with interlayers of organic/inorganic materials (such as a silicon core with a layer of carbon encapsulating the silicon, coated with an additional inorganic layer). The flow rate of the colloidal dispersion can be a percentage of the supply gas flow into the reactor, such as from 0.001% to 1000%, or from 0.001% to 100%, or from 0.001% to 10%, or from 0.001% to 1%, or from 0.001% to 0.1%, or from 0.01% to 1000%, or from 0.01% to 100%, or from 0.01% to 10%, or from 0.01% to 1%, or from 0.01% to 0.1%.

The process material can be a gas. The process material is a hydrocarbon gas, such as $C_2H_2$, $C_2H_4$, $C_2H_6$. The process material is methane, and the separated components are hydrogen and nanoparticulate carbon. The process material is carbon dioxide with water, and the separated components are oxygen, carbon, and water. The process material is $H_2S$ and the separated components are hydrogen gas and sulfur. The process material does not contain carbon dioxide. The process material is a complex gas-based material, for example $SiH_4$, trimethylaluminum (TMA), trimethylgallium (TMG), glycidyl methacrylate (GMA), $SF_6$, and other materials used in the semiconductor industry for the deposition and etching of metals and dielectrics.

One of the separated components is nanoparticulate carbon such as, but not limited to, carbon black, carbon nano-onions (CNOs), necked CNOs, carbon nanospheres, graphite, pyrolytic graphite, graphene, graphene nanoparticles, graphene platelets, fullerenes, hybrid fullerenes, single-walled nanotubes and multi-walled nanotubes. One or more of these nanoparticulate carbons may be produced during a particular process run. The separated components can comprise nanoparticulate carbon that is in agglomerate—which may also be described as aggregate—particles. In some cases, the agglomerate or aggregate particles comprise many nanoparticulate carbon particles. The agglomerate or aggregate particles can comprise nanoparticulate carbon particles and have average diameter greater than 50 microns, or greater than 100 microns, or greater than 200 microns, or greater than 300 microns, or greater than 500 microns, or greater than 1000 microns, or from 1 to 1000 microns, or from 10 microns to 1000 microns, or from 100 microns to 1000 microns, or from 100 microns to 500 microns.

Tuning Microwave Energy in Microwave Chemical Processing Systems

Different process materials require different amounts of energy to react into different separated components. In the present disclosure, the available reaction pathways can be selected by changing the average energy of the plasma. The microwave energy coupled to the plasma can be pulsed, and the average energy of the plasma, and therefore the reaction pathways, are selected by controlling the microwave energy pulse duration and frequency, duty cycle, shape, and time-averaged output power level. Additional details of tuning microwave energy in microwave chemical processing systems are disclosed in U.S. patent application Ser. No. 15/351,858, entitled "Microwave Chemical Processing" and filed on Nov. 15, 2016, which is owned by the assignee of the present application and is hereby incorporated by reference in its entirety.

The average energy in the plasma can be controlled by changing the pulse period, by choosing a pulsing frequency to achieve a desired plasma energy. Additionally, the average energy of the plasma can be controlled by controlling the duty cycle. This can be understood by contemplating the situation where the time-averaged input power and the pulse period are both held constant and the duty cycle is varied. A shorter duty cycle will increase the magnitude of the power coupled into the chamber when the microwave energy is on. This is advantageous because a relatively low amount of power (such as time-averaged power) can be used to generate reaction products from reaction pathways that would be impossible to facilitate at the same power in a continuous wave.

The reaction pathways can be selected by controlling time-averaged power input into the plasma. For example, if the duty cycle and pulse frequency are held constant, and the power input into the microwave generator is increased, then the energy of the plasma will increase. By way of another example, if the duty cycle and pulse frequency are held constant, and the power is more effectively coupled into the reaction chamber, then the energy of the plasma will increase.

The reaction pathways can be selected by controlling a shape of the microwave energy pulse. The microwave pulse can be a rectangular wave, where the power is constant during the duration of the pulse period when the microwave is on. The pulse power can be not constant during the duration of the pulse period when the microwave power is on. The microwave pulse is a triangular wave, or a trapezoidal wave, or a different wave profile. The plasma can be referred to as diffuse during the time period when the high energy species exist in higher fractions (such as at the beginning of the pulse before the plasma reaches equilibrium). The microwave energy can increase over the time period where the plasma is diffuse, which increases the time average fraction of high energy species in the plasma. As described above, tuning the pulse frequency, duty cycle, and pulse shape can enable the creation of a higher fraction of higher energy species within the plasma for a given time-averaged input power. The higher energy species can enable additional reaction pathways that would otherwise not be energetically favorable.

The techniques above can be further understood by using methane ($CH_4$) as an example process material, to be separated into hydrogen and nanoparticulate carbon. Typically, 4-6 eV is needed to dissociate methane ($CH_4$); however, the plasma energy typically settles at approximately 1.5 eV after an initial ignition energy spike. By pulsing the microwave, the average plasma energy (such as time-averaged plasma energy) is maintained at the higher levels, where the frequency and duration of the pulsing controls the average plasma energy. Specifically, pulsing parameters such as frequency and duty cycle can be controlled to provide an average plasma energy of 4-6 eV to select specific dissociation reactions of the methane. Another advantage of pulsing the microwave energy is that the energy is more distributed throughout the chamber in which microwave is being input.

In conventional systems, at equilibrium the plasma forms a dense layer of ionized species in the chamber towards the location of the microwave input, which absorbs the incoming microwave energy and consequently prevents further microwave energy from penetrating deeper into the chamber. The high frequency pulsing of the present disclosure maintains the plasma in a non-equilibrium state for a greater fraction of time and the dense layer of ionized species is present for a smaller fraction of time, which allows the microwave energy to penetrate deeper into the chamber and the plasma to be generated in a larger volume within the chamber. More generally, in various embodiments of the present disclosure the average energy of the plasma over the entire duration of the pulse period may be from 0.9 eV to 20 eV, or from 0.9 to 10 eV, or from 1.5 eV to 20 eV, or from 1.5 eV to 10 eV, or greater than 0.9 eV, or greater than 1.5 eV. The specific values to which the plasma energy is tuned will depend on the type of process material being utilized.

In the microwave processing systems described above, the microwave energy source is controlled by a microwave emitter circuit (such as 207 in FIG. 2, and 307 in FIG. 3), that can control the microwave energy emitted from the source to be either continuous wave or pulsed. The microwave emitter circuit can produce microwave energy through the use of a magnetron, such as at 915 MHz, 2.45 GHz, or 5.8 GHz. To control the pulse output power of the microwave energy, the microwave emitter circuit may pulse the magnetron at various frequencies and duty cycles. Each microwave emitter circuit is designed for a specific range of pulsing frequency, duty cycle, shape, and pulse output power level, where the selection of specific values of these parameters is used to tune the chemical reaction pathways in the process material.

The microwave control circuit can enable a pulse frequency from 500 Hz to 1000 kHz, or from 1 kHz to 1000 kHz, or from 10 kHz to 1000 kHz, or from 40 kHz to 80 kHz, or from 60 kHz to 70 kHz, or greater than 10 kHz, or greater than 50 kHz, or greater than 100 kHz. The microwave source can emit continuous wave or pulsed microwave energy with a time-average power from 1 to 100 kW, or from 1 kW to 500 kW, or from 1 kW to 1 MW, or from 10 kW to 5 MW, or greater than 10 kW, or greater than 100 kW, or greater than 500 kW, or greater than 1 MW, or greater than 2 MW. The pulse period has a first duration where the microwave power is on, and a second duration where the microwave energy is off or at a lower power than during the first duration. The second duration can be longer than the first duration. The optimal duty cycle for a given system depends on many factors including the microwave power, pulse frequency, and pulse shape. The duty cycle (such as the fraction of the pulse period where the microwave energy is on, expressed as a percentage) can be from 1% to 99%, or from 1% to 95%, or from 10% to 95%, or from 20% to 80%, or from 50% to 95%, or from 1% to 50%, or from 1% to 40%, or from 1% to 30%, or from 1% to 20%, or from 1% to 10%, or less than 99%, or less than 95%, or less than 80%, or less than 60%, or less than 50%, or less than 40%, or less than 30%, or less than 20%, or less than 10%.

Microwave Chemical Processing Reactors with Multiple Field-Enhancing Waveguides

FIG. 4A through FIG. 4D show block diagrams representing embodiments of microwave chemical processing systems of the present disclosure, in which multiple FEWGs are coupled to one or more microwave energy generators (such as microwave energy sources). The FEWGs in these embodiments can share some or all of the features of the systems described above. The supply gas and process material inputs in these embodiments can also share some or all of the features described above. each FEWG has a reaction zone. A plasma can be generated from a supply gas in a plasma zone in each of the FEWGs, and a reaction length of each of the FEWGs serve as reaction zones to separate the process material into separate components. The reaction zones can be connected together, and the microwave chemical processing system has one outlet for the separated components. The reaction zones can be connected together, and the microwave chemical processing system has more than one outlet for the separated components. Each reaction zone can have its own outlet for the separated components.

Figure 4A:
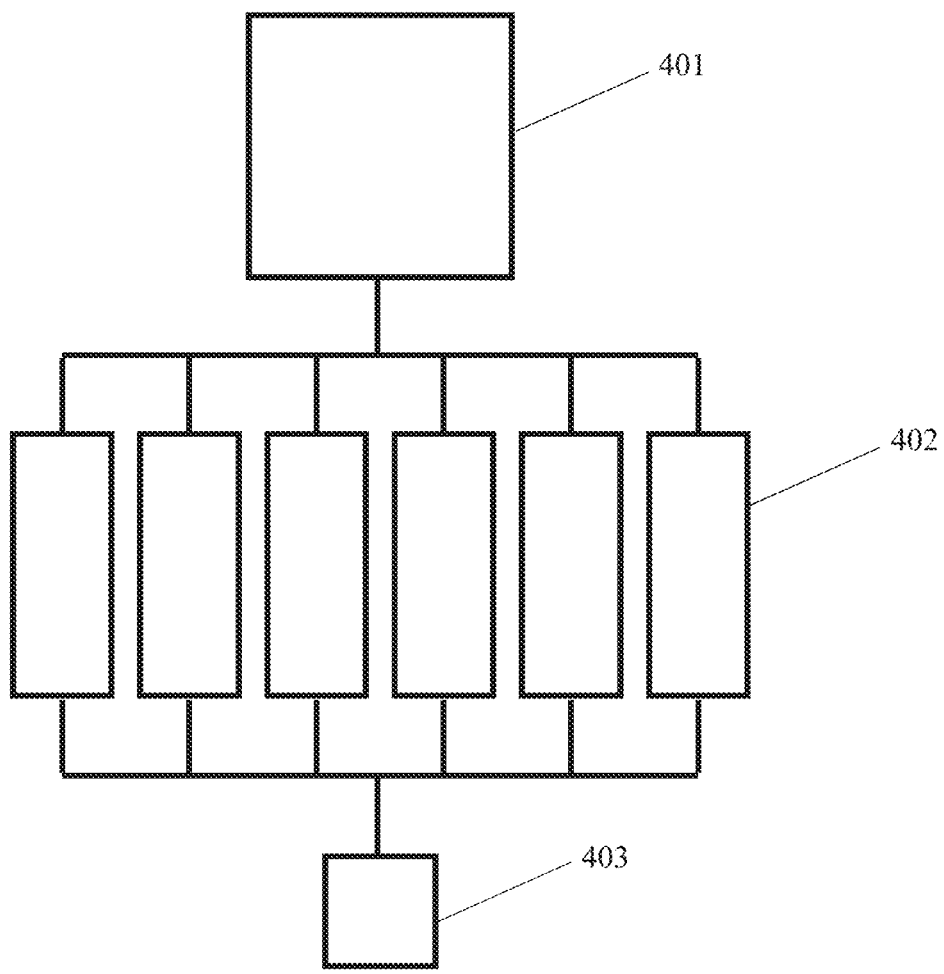
FIGS. 4A, 4B, 4C, and 4D show block diagrams of microwave chemical processing systems having multiple field-enhancing waveguides and multiple microwave energy sources, according to some implementations.
Figure 4B:
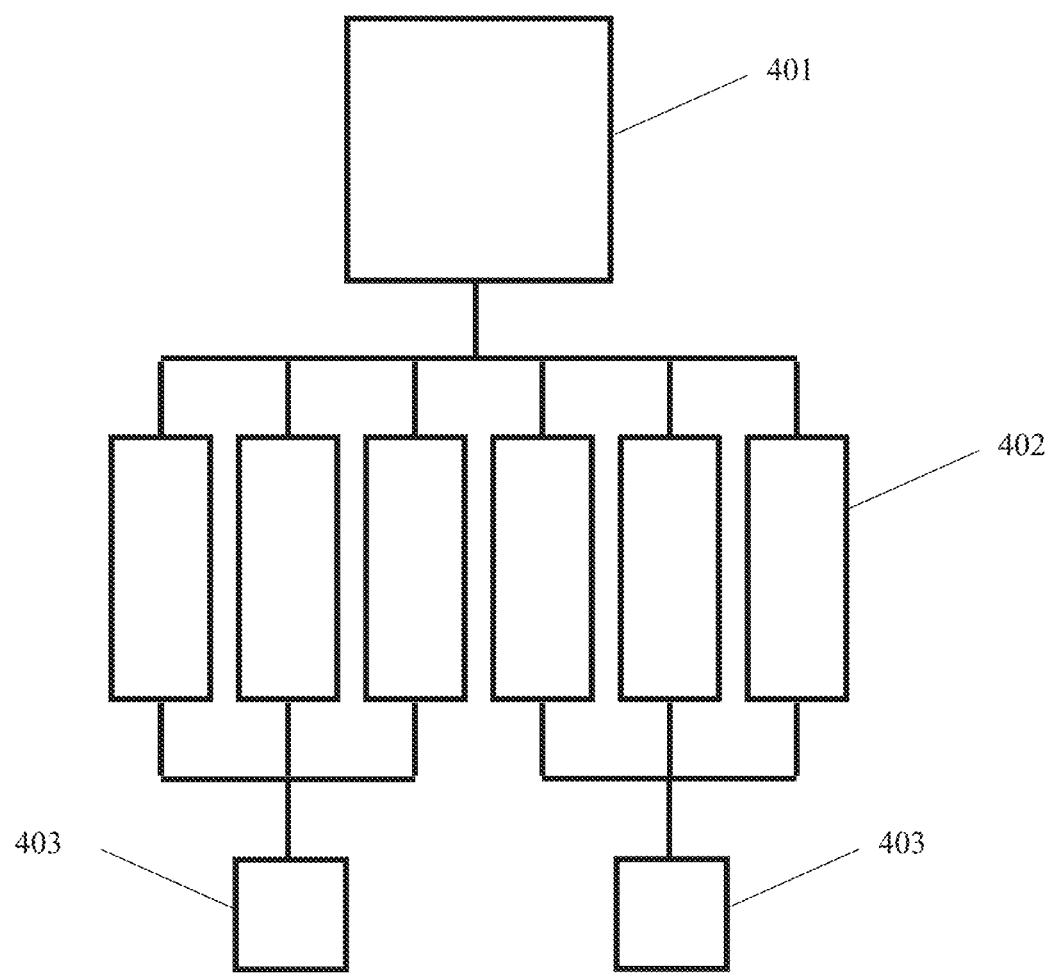
Figure 4C:
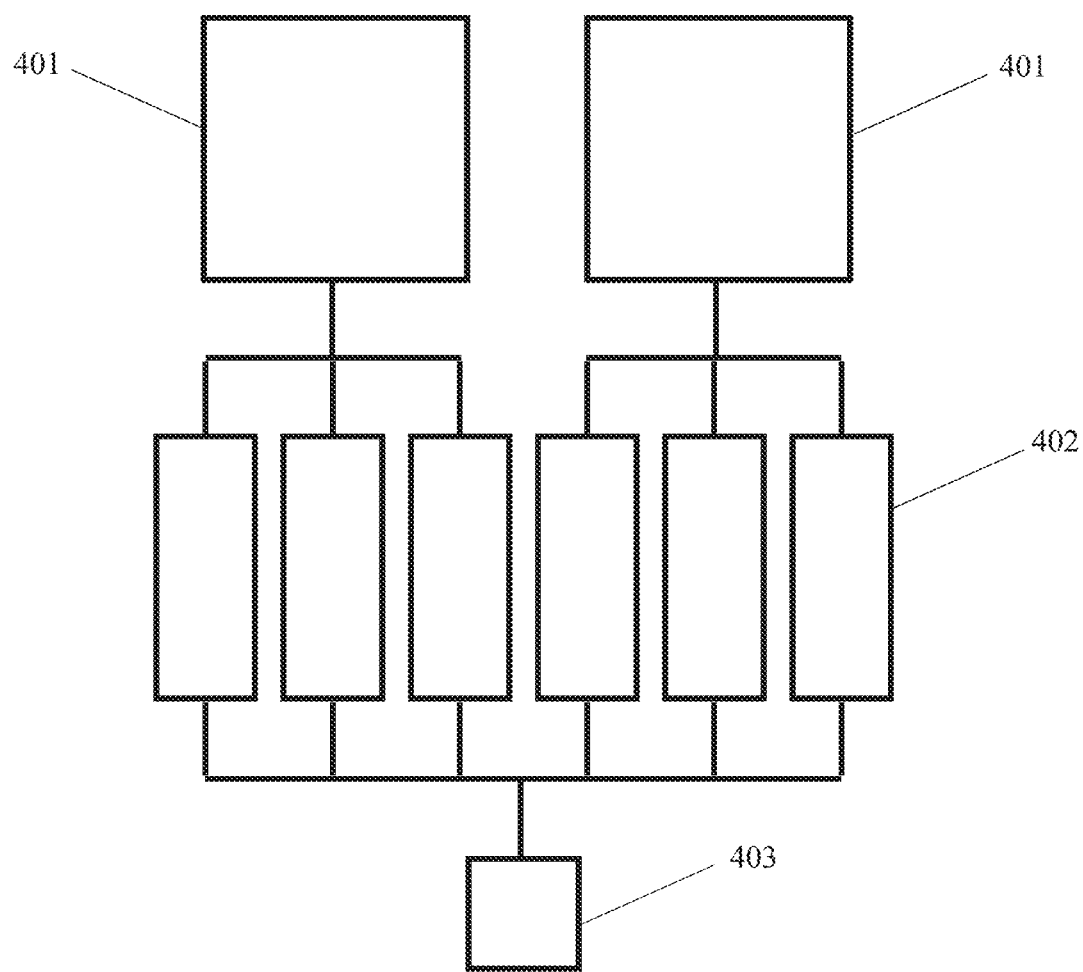
Figure 4D:
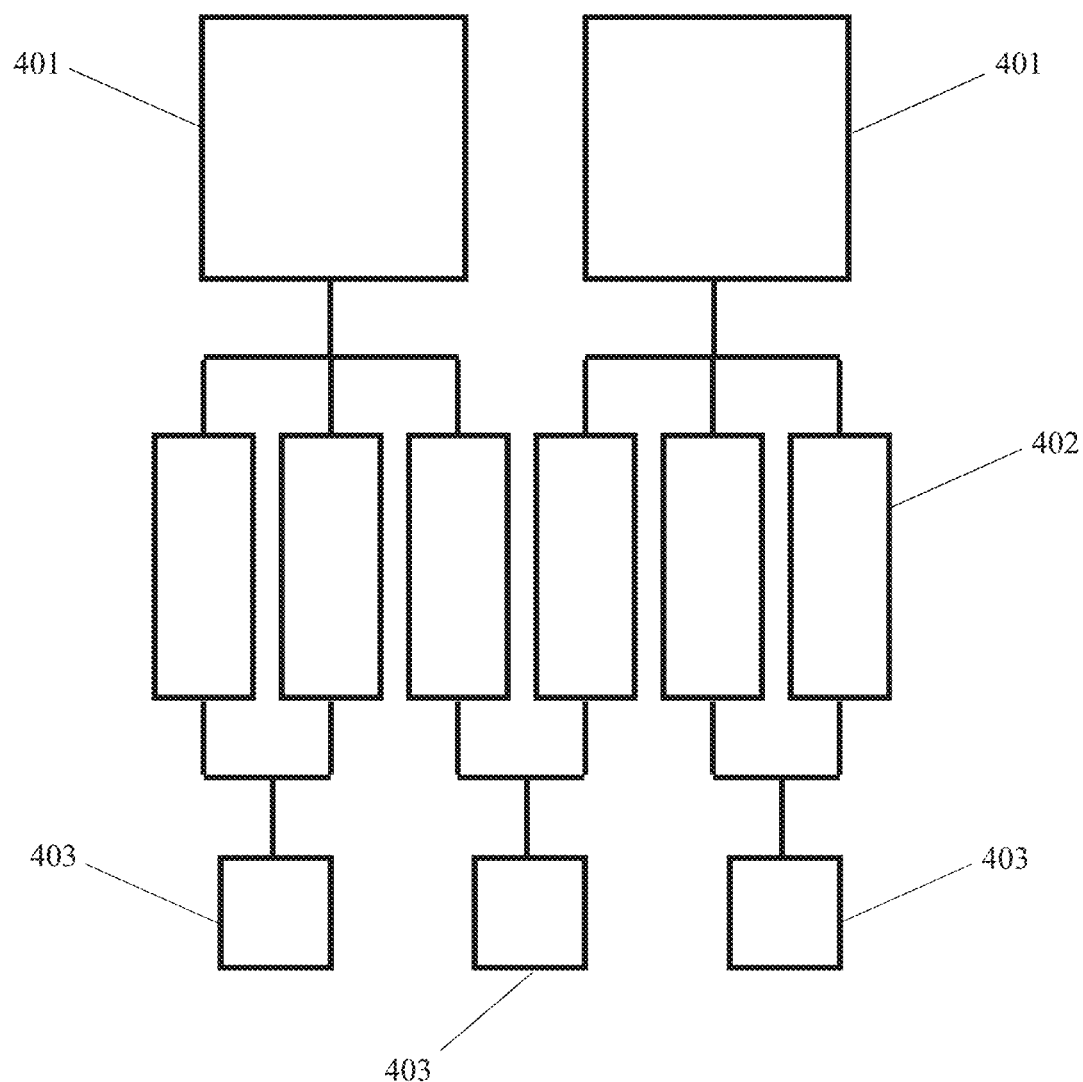

FIG. 4A shows an embodiment where there is one microwave energy generator 401 coupled to multiple FEWGs 402, and the reaction zones of the FEWGs are all connected together such that there is a single outlet 403 to collect the separated components. FIG. 4B shows an embodiment where there is one microwave energy generator 401 coupled to multiple FEWGs 402, and the reaction zones of some the FEWGs are connected together such that there more than one outlet 403 to collect the separated components. FIG. 4C shows an embodiment where there is more than one microwave energy generator 401 coupled to multiple FEWGs 402, and the reaction zones of the FEWGs are all connected together such that there is a single outlet 403 to collect the separated components. FIG. 4D shows an embodiment where there is more than one microwave energy generator 401 coupled to multiple FEWGs 402, and the reaction zones of some the FEWGs are connected together such that there more than one outlet 403 to collect the separated components.

FIG. 4A through FIG. 4D depict 6 FEWGs for illustrative purposes, but There are fewer or greater than 6 FEWGs. For example, there can be from 1 to 10 FEWGs coupled to each microwave energy generator. The microwave energy from more than one microwave generator can be combined using a power combiner, and then the combined microwave energy can be coupled into more than one FEWG. The microwave energy emitted from such a power combiner can be very large and can be coupled into many FEWGs (such as more than 10). Multiplexing can be used to couple microwave energy into multiple FEWGs from a single microwave energy source.

In one example, the multiplexing is time-division multiplexing which means that the energy is coupled from a microwave energy source into one set of FEWGs at one moment in time, and a switch is used to direct the energy into a different set of FEWGs at a later moment in time. The switch can be used to cycle energy between many sets of FEWGs (such as more than 2, or more than 5, or more than 10) from a single microwave energy source over time, where each set of FEWGs can contain multiple FEWGs (such as more than 2, or more than 5, or from 1 to 10). FIG. 4B and FIG. 4D depict two outlets, but there can be more than two outlets, and each FEWG can have its own outlet to collect the separated components. There are from 1 outlet to 10 outlets to collect the separated components. FIG. 4B and FIG. 4D depict 3 FEWGs connected into each outlet, but there can be fewer or greater than 3 FEWGs connected into each outlet, and each FEWG can have its own outlet to collect the separated components. FIG. 4C and FIG. 4D depict two microwave energy generators, but There are more than 2 microwave energy generators. There can be from 1

FEWG to 10 FEWGs connected together into each outlet to collect the separated components.

Figure 5A:
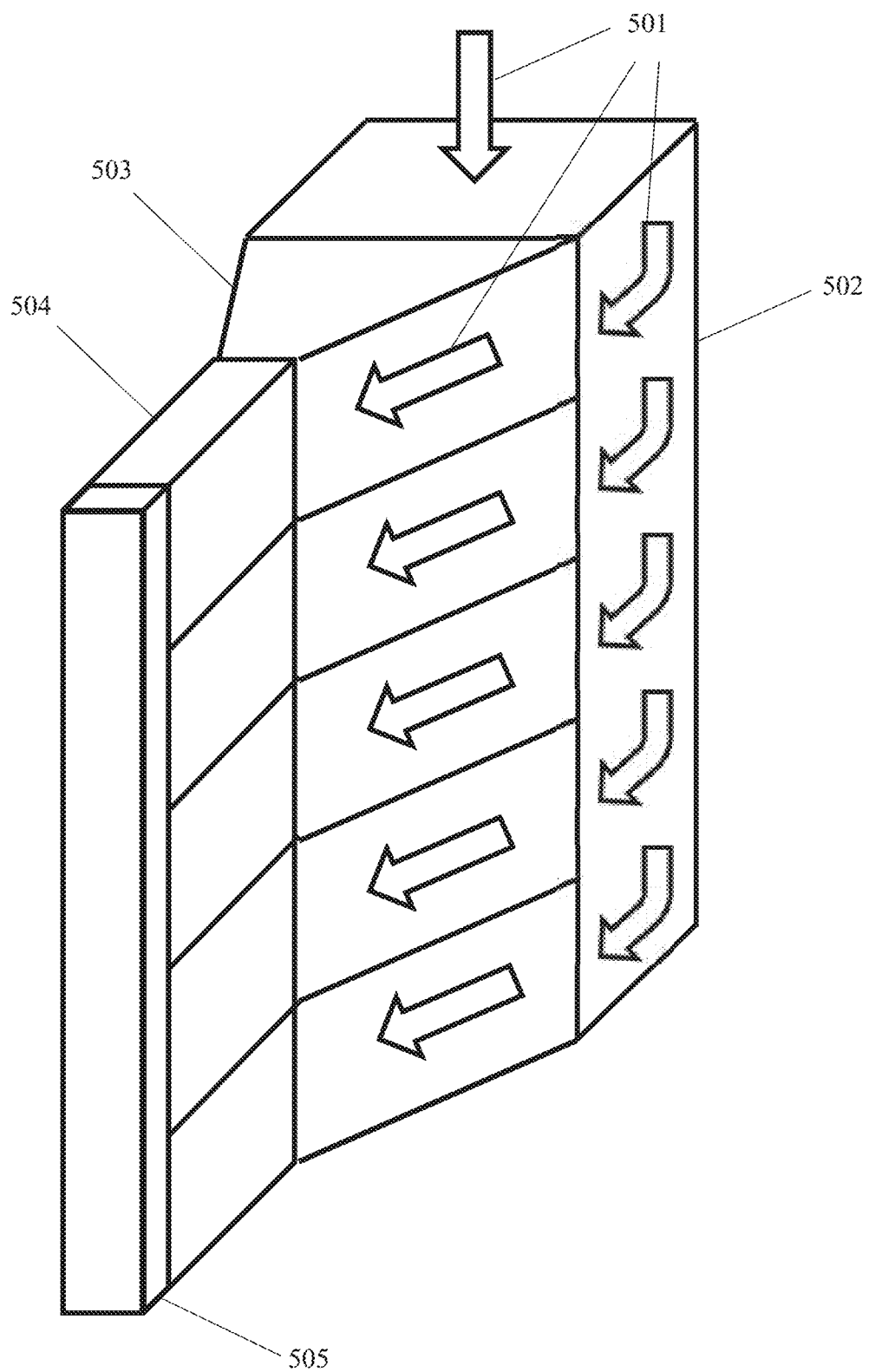
FIG. 5A and FIG. 5B show simplified diagrams of microwave chemical processing systems in which multiple field-enhancing waveguides are coupled to one microwave energy generator, according to some implementations.
Figure 5B:
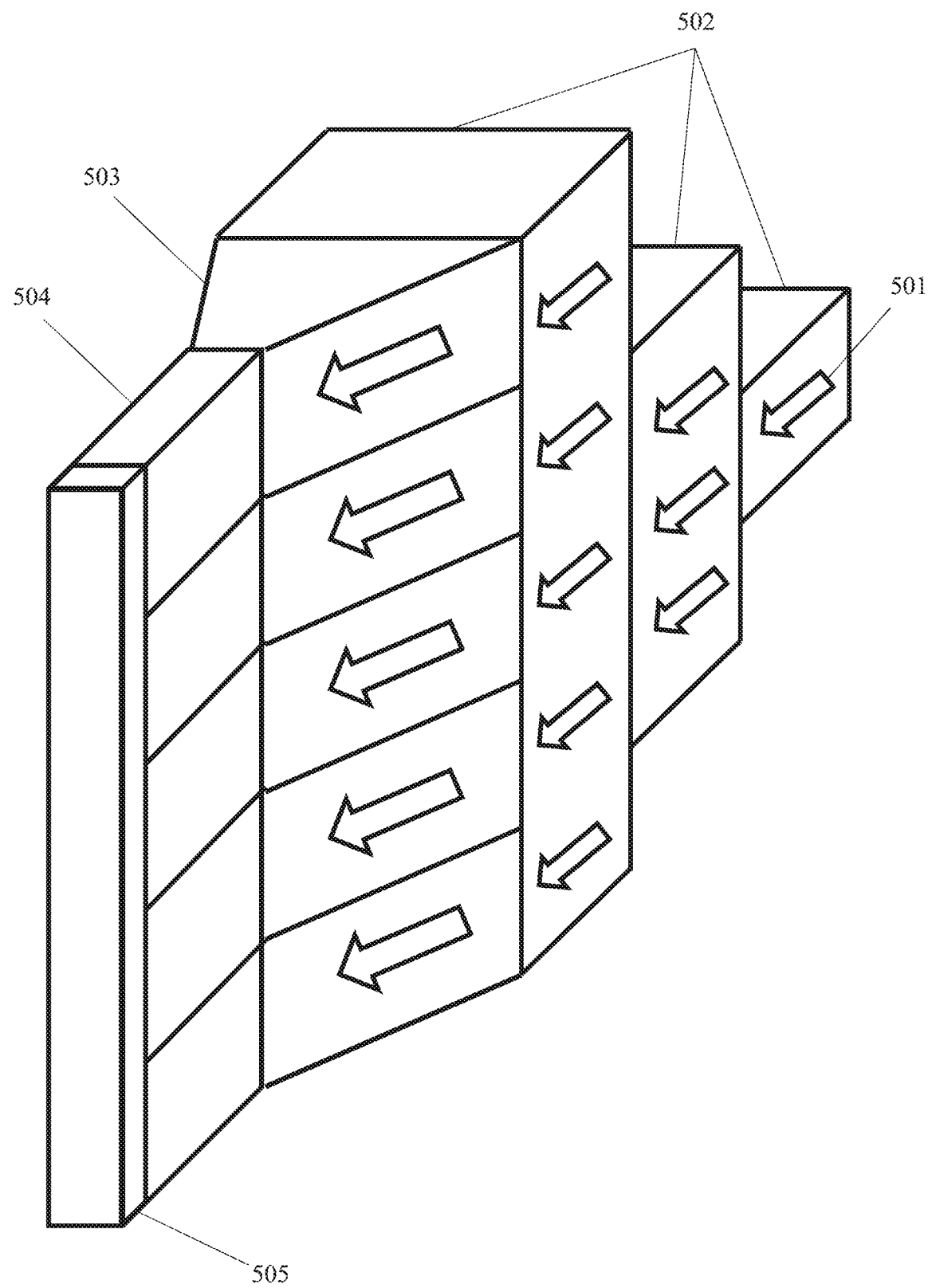

FIG. 5A and FIG. 5B show embodiments of microwave chemical processing systems of the present disclosure, in which multiple FEWGs are coupled to one microwave energy generator (such as microwave energy sources) using different geometries. The FEWGs in these embodiments can share some or all of the features of the systems described above. The supply gas and process material inputs in these embodiments can also share some or all of the features described above. Each FEWG can have a reaction zone. A plasma can be generated from a supply gas in a plasma zone in each of the FEWGs, and a reaction length of each of the FEWGs serve as reaction zones to separate the process material into separate components. The reaction zones can be connected together, and the microwave chemical processing system has one outlet for the separated components. The reaction zones can be connected together, and the microwave chemical processing system has more than one outlet for the separated components. Each reaction zone can have its own outlet for the separated components.

FIG. 5A shows a manifold geometry where there is one microwave energy generator coupled to multiple FEWGs. The microwave energy 501 is coupled to a manifold waveguide 502, and then is coupled into multiple FEWGs. The microwave energy enters the large cross-sectional area section of each the FEWGs, then into the field-enhancing zone of the FEWGs 503 and is then coupled into the smaller cross-sectional area reaction zones of the FEWGs 504. In the embodiment depicted in FIG. 5A, all of the FEWGs are all connected together such that there is a single outlet 505 to collect the separated components.

FIG. 5B shows a network geometry where there is one microwave energy generator coupled to multiple FEWGs. The microwave energy 501 is coupled to a network waveguide 502, and then is coupled into multiple FEWGs. The specific network waveguide dimensions are dependent on the microwave frequency being used. The microwave energy enters the large cross-sectional area section of each the FEWGs, then into the field-enhancing zone of the FEWGs 503 and is then coupled into the smaller cross-sectional area reaction zones of the FEWGs 504. In the embodiment depicted in FIG. 5B, all of the FEWGs are all connected together such that there is a single outlet 505 to collect the separated components.

FIG. 5A and FIG. 5B depict one microwave energy generator coupled to 5 FEWGs in a manifold or network geometry, but There is one microwave energy generator coupled to fewer or greater than 5 FEWGs in a manifold or network geometry. The microwave energy from more than one microwave generator can be combined using a power combiner, and then the combined microwave energy can be coupled into more than one FEWG in a manifold or network geometry. The microwave energy emitted from such a power combiner can be very large and can be coupled into many FEWGs (such as more than 10) in a manifold or network geometry. There can be from 1 FEWG to 10 FEWGs coupled to each microwave energy generator in a manifold or network geometry. FIG. 5A and FIG. 5B depict one outlet, but there can be more than one outlet from FEWGs coupled to microwave energy generators in a manifold or network geometry. There can be from 1 outlet to 10 outlets to collect the separated components from FEWGs coupled to microwave energy generators in a manifold or network geometry. FIG. 5A and FIG. 5B depict one microwave energy generator coupled to multiple FEWGs, but There can be from 1 microwave energy generator to 10 microwave energy generators coupled to from 1 FEWG to 10 FEWGs in a manifold or network geometry. There can be from 1 FEWG to 10 FEWGs connected together into each outlet to collect the separated components from FEWGs coupled to microwave energy generators in a manifold or network geometry.

There can be apertures between the manifold or network geometry waveguides 502 and the field-enhancing zones of the FEWGs 503. The dimensions of these apertures are tailored to effectively couple the microwave energy from the manifold or network geometry waveguides 502 to the field-enhancing zones of the FEWGs 503. The dimensions of these apertures are different sizes to balance the microwave energy transmission from the manifold or network geometry waveguides 502 between all of the coupled field-enhancing zones of the FEWGs 503.

The dimensions of the manifold or network geometry waveguides 502 can be tailored such that they form a resonant cavity and there is (are) standing wave(s) of microwave energy within the manifold or network geometry waveguides 502. The standing wave of microwave energy can be tuned to effectively couple microwave energy into each of the coupled field-enhancing zones of the FEWGs 503.

There can be controlled leakage from the manifold or network geometry waveguides 502 to the field-enhancing zones of the FEWGs 503 to effectively distribute the amount of microwave energy coupled into each of the reaction zones of the FEWG 504. Some examples of designs to control the leakage from the manifold or network geometry waveguides 502 to the field-enhancing zones of the FEWGs 503 and effectively distribute the amount of microwave energy coupled into each of the reaction zones of the FEWG 504 are: changing the cross-section and/or lengths of the waveguides; using apertures between the manifold or network geometry waveguides 502 and the field-enhancing zones of the FEWGs 503; changing the angle of orientation between the manifold or network geometry waveguides 502 and the field-enhancing zones of the FEWGs 503; using filaments, point sources, electrodes and/or magnets within the manifold or network geometry waveguides or within the FEWGs (as will be discussed in further detail below); and combinations of two or more of these design features.

Figure 6:
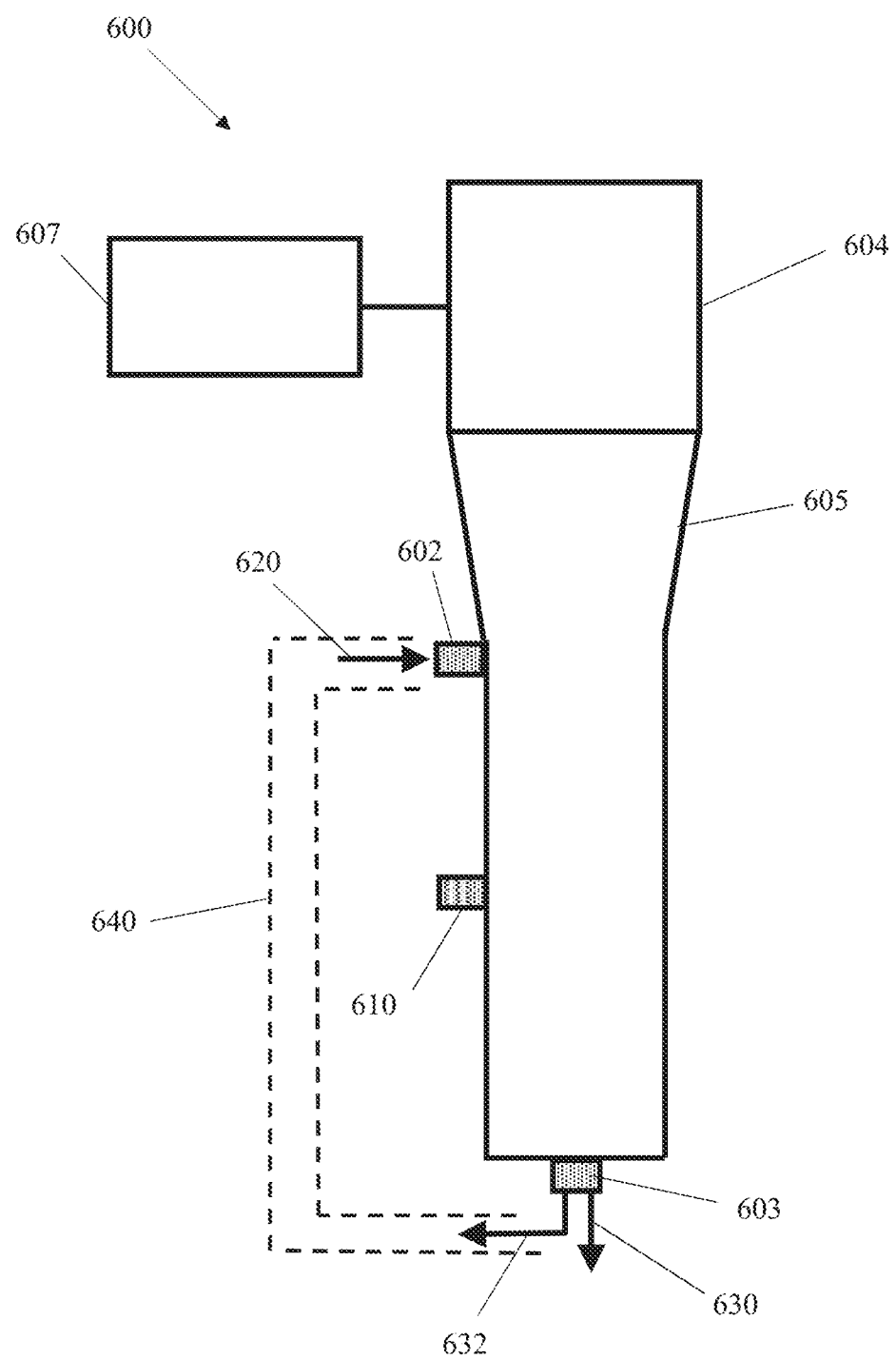
FIG. 6 shows a simplified vertical cross-section of a microwave gas processing system with precursor gas input, according to some implementations.

Additional Features in Microwave Chemical Processing Reactors with Field-Enhancing Waveguides In addition to the above features of microwave processing systems with FEWGs, further features shall now be discussed that can be used in the systems described above. FIG. 6 illustrates a microwave process system with a FEWG, where the plasma is generated in one or more precursor gases, where the precursor gases are inserted upstream from where the process material is flowed into the reaction zone of the FEWG. Precursor gases improve cracking efficiency by adding species of various ionization potentials. That is, different gases have different ionization energies, which is the amount of energy required to remove an electron from an atom or molecule is. In addition, various gases have different pair production (how many electrons per ion can be produced) and secondary electron emission properties (emission of electrons when the charged particles strike a surface). Thus, in the present disclosure the use of precursor gases can be utilized to affect the energy of the plasma.

In FIG. 6, a microwave gas processing system 600 includes a microwave energy generator (such as microwave energy source) 604, a FEWG 605, and a microwave emitter circuit 607. For clarity, the diagram of FIG. 6 is a simplified drawing compared to the previous figures. A supply gas inlet 602 receives a precursor gas 620 which supplements the supply gas (not shown) to create the plasma in the waveguide. In various embodiments, the precursor gas 620 may include one or more of hydrogen, argon, helium, or various noble gases. Process material inlet 610 is configured to receive the process material that is to be reacted.

One or more of the separated components of the process material can be recycled back into the supply gas and/or process material entering the FEWG 605. For precursor gases that are not desired output products of the system (such as argon precursor gas in processing of methane), the precursor gases are removed from the separated components 630 and 632 that are output from outlet 603 in post-processing steps. As shown in FIG. 6, gas reactions in the FEWG 605 produce separated components 630 and 632. For example, for methane as a process material, first separated component 630 may be carbon and second separated component 632 may be H2 gas (which recombined from atomic hydrogen H+ before being collected at the outlet 603).

Alternatively, first separated component 630 may be CH2 and second separated component 632 may be hydrogen gas H2. The separated component 632 is recycled back into the FEWG 605 through conduit 640, back to supply gas inlet 602. The recycled separated component 632 thus is used as a precursor gas 620. Although it can appear counterintuitive to return the produced separated components back into the reaction system, recycling of the components adds energy to the plasma, and can also contribute to thermal cracking of the process material since the recycled components have already been heated during the gas processing. For example, separated component 632 can be 2 to 10 slm of $H_2$ that is recycled back into the FEWG 605, for a process in which a total of 150 to 200 slm of $H_2$ is produced. Other amounts or portions of separated component 632 may be recycled, as determined by factors such as the flow rate of the process material, and/or the amount of energy desired to be added to the process to initiate the targeted chemical pathways.

To initiate the foregoing chemical pathways, one or more microwave energy sources can be configured to initiate a chemical reactions within the microwave chemical processing reactor. Further details regarding general approaches to initiating chemical pathways are described in U.S. application Ser. No. 16/751,086 titled "Complex Modality Reactor for Materials Production and Synthesis", filed on Jan. 23, 2020, which is hereby incorporated by reference in its entirety.

Some or all of the supply gas contains one or more recycled separated components of the process material. For example, the supply gas can be hydrogen, and the process material can be methane, which is reacted to form hydrogen and carbon, and at least a portion of the hydrogen that is produced from the methane can be recycled and used as the supply gas. Recycling the produced hydrogen beneficially improves the efficiency of the overall gas processing because the plasma formed from the hydrogen is highly efficient at cracking hydrocarbon bonds in the process material molecules. Additionally, the recycled $H_2$ is already at a high temperature, and thus less energy input is needed to achieve a thermal cracking energy. The supply gas is $H_2$ provided by an external source, to which recycled $H_2$ is added. The generated plasma can be a hydrogen plasma.

Figure 7:
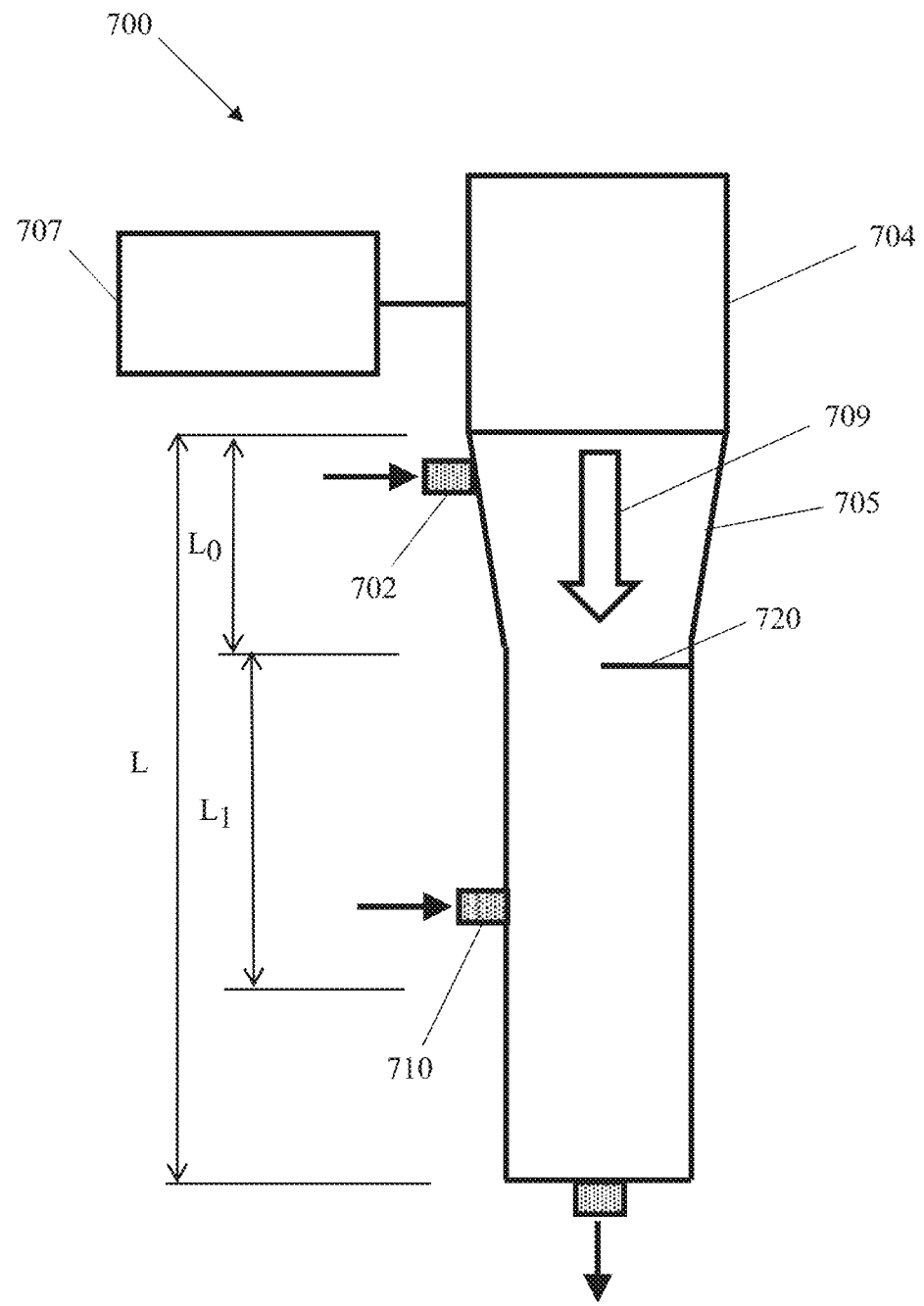
FIG. 7 shows a simplified vertical cross-section of a microwave gas processing system having a filament, according to some implementations.

FIG. 7 illustrates a microwave process system with a FEWG and filaments. In the embodiment of FIG. 7, the microwave processing system 700 includes a microwave energy generator (such as a microwave energy source) 704, a FEWG 705, and a microwave emitter circuit 707. Microwave energy 709 is supplied by the microwave energy source 704, to propagate in a direction down the length L of the FEWG 705. In this embodiment, supply gas inlet 702 is placed near the entrance of the portion L0, rather than at the entrance to the portion $L_1$ (such as the plasma zone). One or more metal filaments 720 is placed within the FEWG 705 to assist in the ignition of the plasma and/or the excitation of higher energy species within the plasma. In this embodiment, metal filament 720 is downstream of the supply gas inlet 702, near the entrance to the plasma zone portion of the FEWG $L_1$ (with a smaller cross-sectional area than the FEWG closer to the microwave energy generator).

The filament 720 may be located at other locations within portion $L_1$ of the overall length L of the FEWG 705, where $L_1$ is the region in the waveguide where the plasma is formed as described in relation to previous embodiments. The filament 720 is located within portion $L_1$ of the FEWG and upstream of the process material inlet 710, so that it will be located outside of the portion $L_2$ (such as length $L_2$ shown in FIG. 3) where reactions are taking place and which could coat the filament with reacted species. The presence of filament 720 can reduce the plasma ignition voltage by providing an ignition site, by focusing the electric field of microwave energy 709. Additionally, the filament 720 can become heated and emit electrons through thermionic emission, which further contributes to reducing the plasma ignition voltage. Although the filament 720 is illustrated as a single wire in this embodiment, filament 720 may take other configurations such as a coil or multiple filaments. The filament 720 is tungsten. The filament may be actively energized (powered) or may be passive. The filament 720 is an osmium filament (such as configured as a plate, or coil, or other shape) adjacent to a heater coil. The filament 720 is a ferrous material in the field of an inductive coil. The filament 720 is actively heated where the active components (such as heating source components) are located outside of the FEWG 705 and the filament material that is being heated is inside of the FEWG 705.

Figure 8:
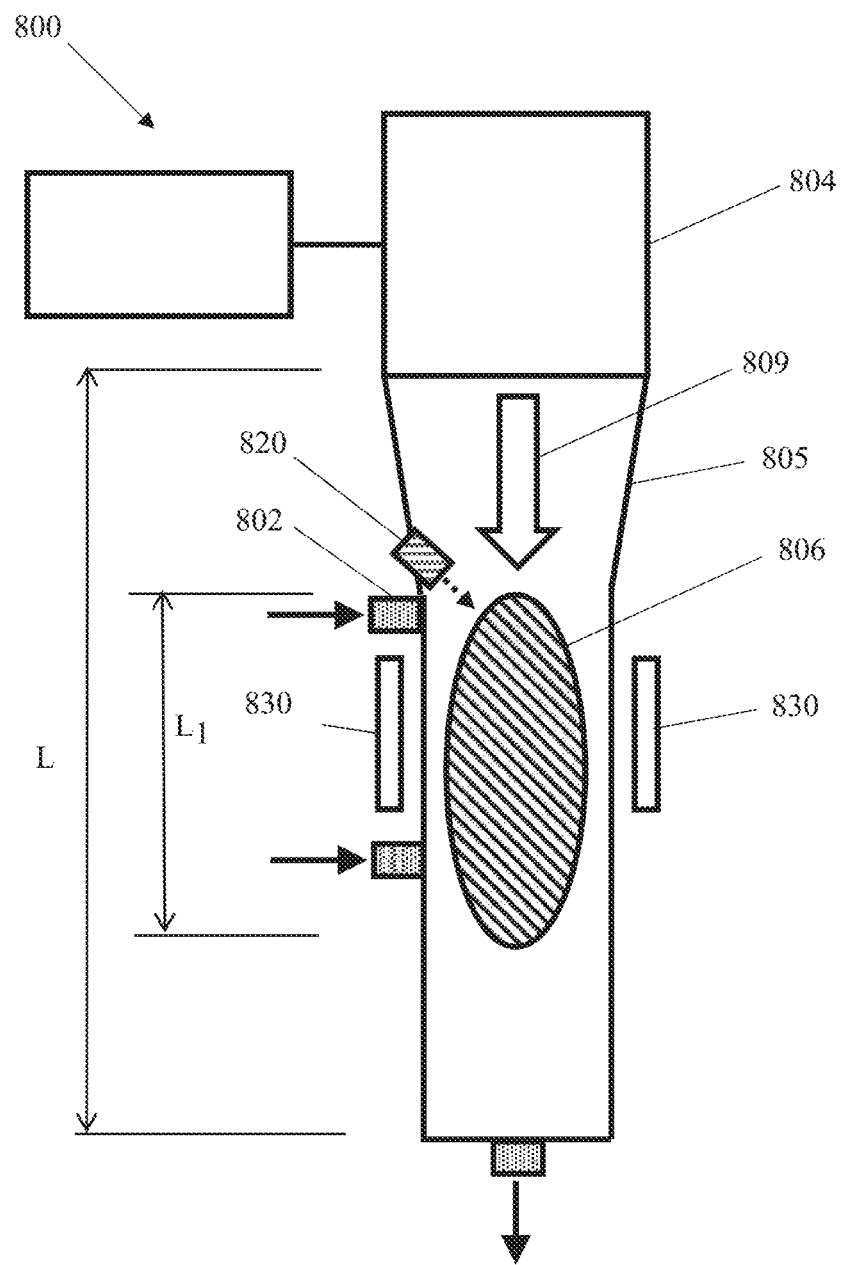
FIG. 8 shows a simplified vertical cross-section of a microwave gas processing system in which an electron source and an electrode are depicted, according to some implementations.

FIG. 8 illustrates an implementation of an energy source 830 extending substantially alongside the FEWG 805 and/or may be similarly positioned with any one or more of presented microwave process systems with FEWGs. In some implementations, the energy source 830 can be embodied as one or more electrodes, or one or pairs of co-planar electrodes oriented along a common vertical axis extending lengthwise through a center of the FEWG 805. Each pair of electrodes can comprise a positive electrode (referred to as a "cathode") and a negative electrode (referred to as an "anode"). "Electrode", as generally understood and as referred to herein, implies an electrical conductor used to contact with a nonmetallic part of a circuit. In alternative, or in addition to, configurations of the energy source 830 incorporating one or more electrodes, the energy source can be embodied as (or otherwise incorporate), an electron gun, referring an electrical component in some vacuum tubes that produces a narrow, collimated electron beam that has a precise kinetic energy. Such an electron gun configuration can include several constituent parts, such as a hot cathode, which is heated to create a stream of electrons via thermionic emission, electrodes generating an electric field to focus the electron beam (such as a Wehnelt cylinder), and one or more anode electrodes which accelerate and further focus the beam.

Further, the energy source can be configured, in addition or alternative to the configurations discussed, as a flow heater and/or reactor providing for the transfer of thermal energy (as heat) for ultra-fast heating of liquid and viscous fluid materials (such as the supply gas provided by the supply gas inlets 802 and/or process input materials, which can also be flowed through, in some implementations, the supply gas inlets 802). In some implementations, the energy source 830 may be used independently of, or in any combination with the recycled precursor gases 620 of FIG. 6, the filaments 720 of FIG. 7, or the electron source 820 of FIG. 8. The system 800 can include one or more sets of energy sources 830, where any one or more of the energy sources 830 can be configured to supply energy (such as in the form of thermal and/or electromagnetic energy, among other forms of energy) to the plasma 806. The energy sources 830, when embodied as a pair of oppositely charged co planar electrodes flanking the FEWG 805 (such as that shown in FIG. 8) can be configured to generate an electric field within the portion $L_1$ of the overall length L of the FEWG 805. $L_1$ refers the region in the FEWG where the plasma is formed as described above. The energy source 830 (when embodied as a pair of oppositely charged co planar electrodes flanking the FEWG 805) can be energized to a particular voltage to accelerate a gaseous and/or plasma-based species (that becomes charged upon receiving energy from the energy source 830) within the plasma 806 to a desired extent, thus permitting of the precise control of an energy level (measured as a temperature, or some other type of energy measurement) of the plasma 806.

The energy source 830 of this implementation can be configured to function with continuous wave microwave energy input (as provided by, for example, the microwave processing system 800) and is also effective when used in combination with a pulsed microwave input. For example, in conventional systems that have electrodes and use continuously provided microwave energy, the plasma 806 located between the energy sources 803 will tend to localize there at equilibrium. The plasma 806 can screen (referring to at least partially blocking or otherwise impeding) exposure to an electric field generated by the energy sources 830 (such as when embodied as a pair of co-planar electrodes), which can in turn limit the ability of the energy sources 830 to add energy to the plasma 806. In contrast, when supplied microwaves are pulsed, the plasma 806 can exist in a non-equilibrium state (referring to a plasma which is not in thermodynamic equilibrium, because the electron temperature is much hotter than the temperature of heavy species such as ions and neutrals) for a larger portion of an overall processing time. As a result, the plasma 806 can exist in an equilibrium state for the balance of the overall processing time and will thus screen the electric field generated by the energy sources 803 for a smaller fraction of the overall processing time.

FIG. 8 also illustrates an embodiment of an energy source 830 in the present microwave process systems with FEWGs. The energy source 830 may be used independently of, or in combination with, the recycled precursor gases 620 of FIG. 6, the filaments 720 of FIG. 7, or the electron source 820 of FIG. 8. The system 800 contains one or more sets of electrodes 830 to add energy to the plasma. The electrodes are configured to generate an electric field within the portion $L_1$ of the overall length L of the FEWG 805, where $L_1$ is the region in the FEWG where the plasma is formed as described above. Energy source 830 is shown in FIG. 8 as a pair of coplanar electrodes of opposite charges, that are on the exterior of and on opposite sides of the portion of the FEWG 805 where the plasma 806 is generated, although other energy source types are possible (such as thermal energy sources including heaters). The electrodes can be energized to a particular voltage to accelerate the charged species within the plasma to a desired degree, thus controlling the plasma energy. The electrodes of this embodiment can be used with continuous wave microwave energy (such as that applied in a general direction 809 from a microwave energy generator 804) and are particularly effective in combination with a pulsed microwave input. In conventional systems with electrodes and continuous microwave energy, the plasma between electrodes will localize (such as near the electrodes) at equilibrium and screen the electric field from the electrodes, which limits the ability of the electrodes to add energy to the plasma. However, when the microwaves are pulsed, the plasma will exist in the non-equilibrium state for a larger fraction of time and will screen the electric field of the electrodes for a smaller fraction of time.

The microwave processing systems of the present disclosure will include magnets (not shown) to confine the plasma in the reaction zone and reduce the ignition voltage for generating the plasma. The magnets are permanent or are electromagnets. The magnets can be positioned so the plasma density distribution can be controlled. The magnets will increase the plasma density in the portion L1, which will improve the efficiency by which the process material is separated by the plasma.

The local impedance within the FEWG is tailored using filaments, point sources, electrodes and/or magnets. Filaments, point sources, electrodes and/or magnets are used to increase the density plasma within the reaction zone of the FEWG.

As previously described, microwave energy generators coupled to FEWGs containing reaction zones with the combination of pulsed microwave energy, high gas flows (such as greater than 5 slm), large volumes of plasma (such as up to 1000 L), high pressures (such as greater than 0.1 atm or greater than 0.9 atm, or greater than 2 atm), either filaments or electron sources to assist in plasma ignition at the start of each pulse, and/or electrodes to further add energy to the plasma can enable cost-effective high-productivity chemical gas processing systems, with low energy input requirements.

The microwave processing systems with the above features are configured in such a way that the plasma is generated and the process material is separated into components within the FEWG itself, such as the examples depicted in FIG. 2, FIG. 3, FIG. 4A through FIG. 4D, FIG. 5A and FIG. 5B, FIG. 6, FIG. 7, and FIG. 8. In such systems, microwave energy enters the system upstream of the reaction generating the separated components, and therefore the problem of the separated components building up on a microwave entry window of a reactor and absorbing the microwave energy before it can generate the plasma is alleviated. The portion of the FEWG where the separated components are generated acts as a reaction chamber, and the supply gas flow and/or the process material flow through the reaction chamber is parallel to the propagation direction of the microwave energy in the FEWG. The microwave energy enters the FEWG upstream of the portion of the FEWG acting as a reaction chamber where the separated components are generated.

Gas recycling, filaments, and electron sources can be used in microwave gas processing systems with FEWGs utilizing continuous wave (CW) microwave energy. In configurations with CW microwave energy, gas recycling, filaments, and electron sources would still be advantageous to improve the gas processing efficiency of the system, reduce the ignition voltage of the plasma, and control the density distribution of the plasma.

The separated components can adhere to the walls of the FEWG downstream of the reaction generating the separated components, despite the large volume of the reaction zone in the FEWG. Although this does not prevent the plasma from being generated, it still represents a loss of production and a source of contamination in the system. Therefore, the gas flow of the supply gas and the process material can be designed to generate a plasma near the areas of deposition to remove the separated products that are deposited on the waveguide walls (or reaction chamber walls). In some implementations, additional inlets of supply gas and/or process material can be configured to direct the gases to the areas of deposition to remove the separated products that are deposited on the waveguide walls (or reaction chamber walls).

Methods of Microwave Gas Processing

Figure 9:
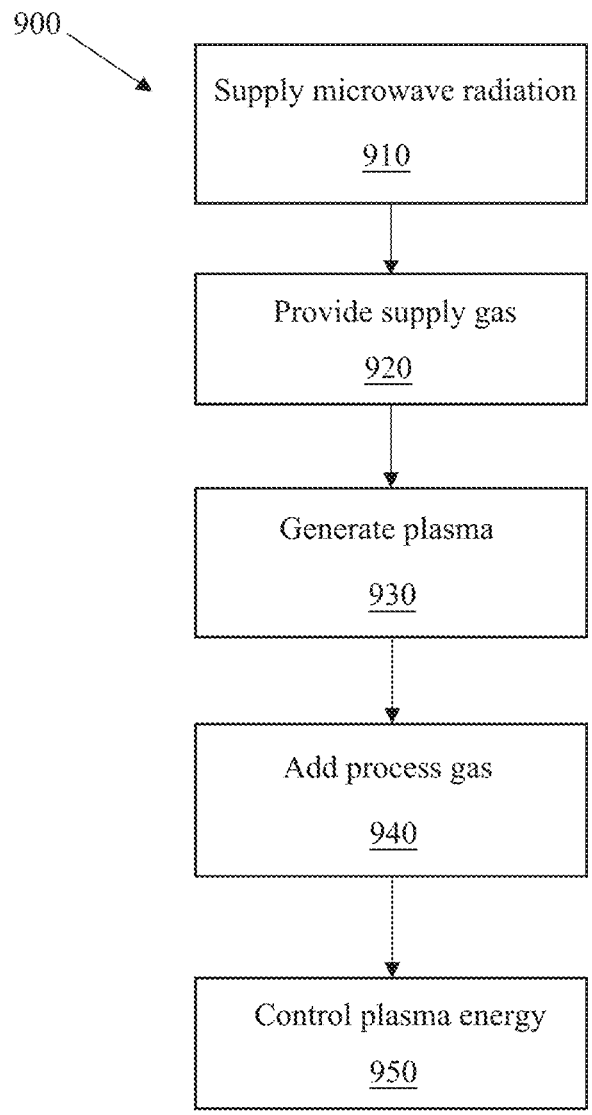
FIG. 9 shows an example flow chart of methods for microwave processing of a gas, according to some implementations.

FIG. 9 is an example flow chart 900 representing methods for microwave processing of gas, using chemistry control in high efficiency gas reactions with FEWGs. In step 910, microwave energy is supplied through a FEWG having a length, where the microwave energy propagates in a direction along the FEWG. The microwave energy may be pulsed or continuous wave. The microwave energy is supplied into the FEWG with a time-average power less than 100 kW, or from 1 kW to 100 kW, or from 1 kW to 500 kW, or from 1 kW to 1 MW, or from 10 kW to 5 MW, or greater than 10 kW, or greater than 100 kW, or greater than 500 kW, or greater than 1 MW, or greater than 2 MW. A pressure within the FEWG is at least 0.1 atmosphere, such as from 0.9 atm to 10 atm. In step 920, a supply gas is provided into the FEWG at a first location along the length of the FEWG, where a majority of the supply gas is flowing in the direction of the microwave energy propagation. In step 930, a plasma is generated in the supply gas in at least a portion of the length of the FEWG. A process material is added into the FEWG at step 940, at a second location downstream from the first location. A majority of the process material flows in the direction of the microwave propagation at a flow rate of greater than 5 slm.

Optionally in step 950, an average energy of the plasma is controlled to convert the process material into separated components. The average energy may be, for example, 0.8 eV to 20 eV. The pulsing frequency is controlled, where the pulsing frequency is greater than 500 Hz. For example, the pulsing frequency of the microwave energy may be from 500 Hz to 1000 kHz. The duty cycle of the pulsed microwave energy is controlled in addition to or instead of the pulsing frequency, where the duty cycle is less than 50%.

Note that the steps in FIG. 9 may be performed in sequences other than what is shown. For example, process gas can be added at the same point as the step 920; that is, prior to the step of generating a plasma in step 930. In another example, controlling of the plasma energy in step 950 can be performed in conjunction with the generation of plasma in step 930. The conditions in the afterglow can be controlled with different forms of energy input. As one specific example, the afterglow conditions can be controlled with microwave energy. This microwave energy can be directly used to either expand the plasma plume or heat the particles in the region. This feature expands the plasma, thereby accommodates tuning of the time the particles spend in the plasma. This feature further facilitates control on the gas phase chemistry, particle charging, and particle heating processes of the particles throughout this region. Control of these parameters lead to control over particle morphology. Alternatively, the energy source in this region can be chosen such that the plasma is not formed and instead the particles are heated, leading to direct control of the particle temperature. This in turn allows for controlling the growth kinetics and therefore the morphology of the particles. One implementation of the juxtaposition and use of energy sources positioned along the length of the FEWG is shown and discussed as pertains to FIG. 10A.

Figure 10A:
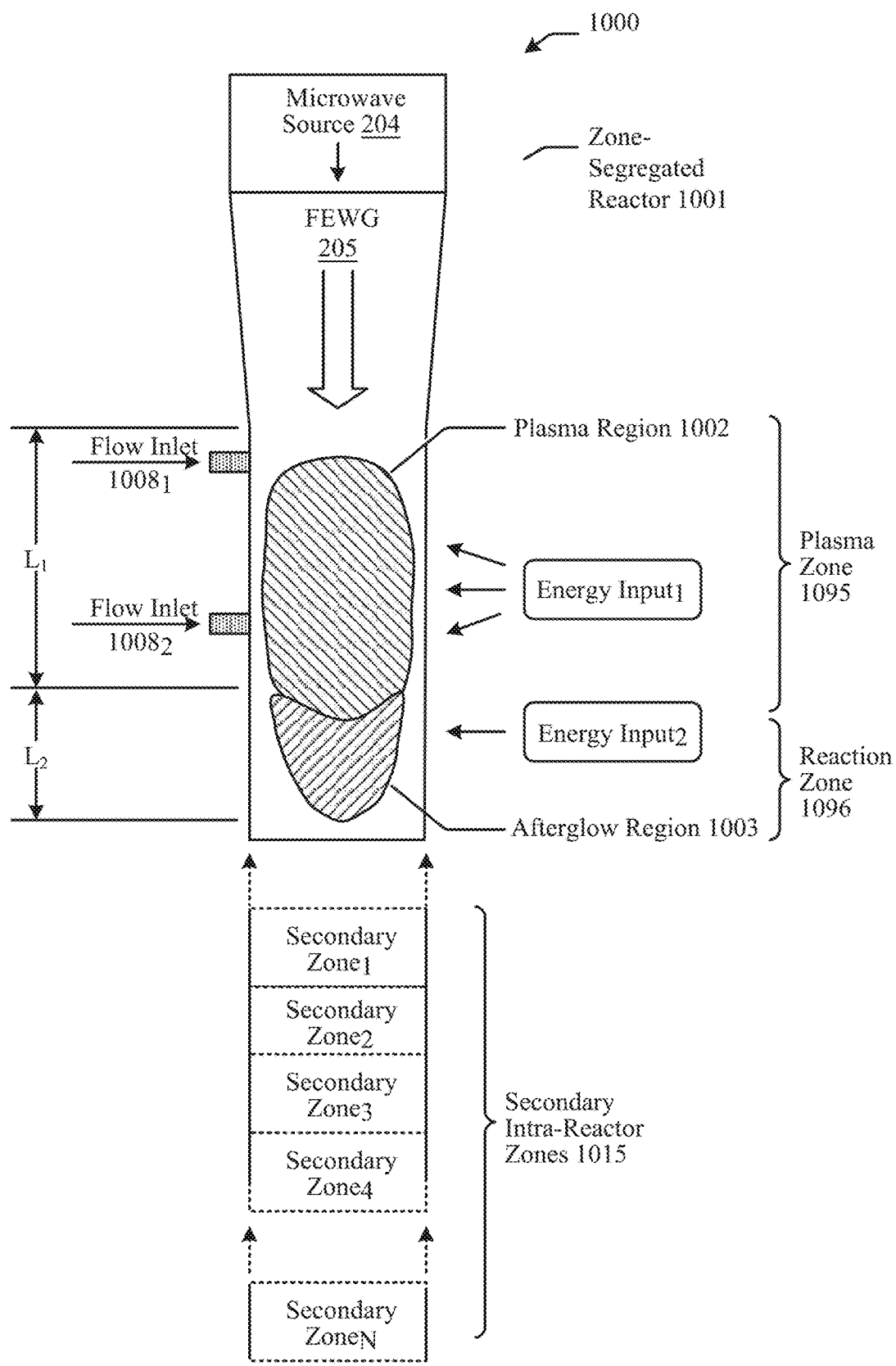
FIG. 10A shows a simplified vertical cross-section of a microwave gas processing system having thermal plume energy sources, according to some implementations.

FIG. 10A is a simplified vertical cross-section of a microwave gas processing system 1000 having thermal plume energy sources 1023. The gas processing system 1000 comprises a zone-segregated reactor 1001 that has two independently controllable energy inputs (such as energy input1, and energy input2) that are separated substantially equidistantly to provide energy into the FEWG 205.

There may be many zones that are defined by various corresponding lengths of the FEWG 205. Strictly as one example, FIG. 10A depicts a plasma zone 1095 defined by plasma column length ($L_1$) and a reaction zone 1096 defined by afterglow column length ($L_2$). The plasma zone has two flow inlets (such as flow inlet 10081 and flow inlet 10082) along the plasma column length. Each of the shown flow inlets are independently controllable such that a first flow inlet serves to introduce material at a first flow rate into a first location along the FEWG 205 and such that a second flow inlet serves to introduce second material at a second flow rate into a second location along the FEWG 205.

The ability to independently control the material flows while at the same time controlling the thermal plume energy sources along plasma column length leads to the ability to control the energy levels within the plasma region 1002, which in turn leads to controllable selection of one or more reaction pathways that occur during conversion of the introduced materials into specific separated components. However, certain reaction pathways that occur during conversion of the introduced materials into specific separated components need a longer pathway and/or longer times being spent in the pathway and/or different temperature ranges along the pathway such that the plasma column length needs to be extended. This is accommodated by provision of the shown reaction zone 1096 having an extended length. This is further accommodated by control of a set of thermal plume energy sources. In particular, temperature control of regions throughout the entire length of the FEWG 205 can be accommodated by selection, control, and positioning any of a variety of thermal plume energy sources. Strictly as an illustrative example, temperatures in plasma region 1002 can be at least partially controlled by energy input1, while temperatures in afterglow region 1003 can be at least partially controlled by energy input2, and while temperatures in any of the shown secondary zones can be at least partially controlled by additional thermal plume energy sources (not shown)

As such, the pathways and temperature contours through the FEWG 205 can be controlled, at least in part by selection and design of the FEWG 205, and at least in part by control of flows through the inlets, and at least in part by control of additional thermal plume energy inputs. As used herein, the term 'thermal plume' refers to a region or regions within the reactor where plasma is formed and/or where chemical reactions are taking place. Two or more different, independently controllable energy sources can be provided in proximity to two or more regions within the reactor. Further, in exemplary embodiments the average temperature in a first region (such as in plasma region 1002) are higher than the average temperature in a second region (such as in afterglow region 1003).

FIG. 10A depicts an afterglow region 1003 that is in proximity to the shown plasma region 1002. Different plasma and chemical processes can be controlled in one or both regions. In particular, the temperature contours in the plasma region can be controlled by controlling energy input1. This facilitates tight control of plasma interactions in the plasma region. Similarly, the temperature contours in the afterglow region can be controlled by controlling energy input2. This facilitates tight control of chemical interactions in the afterglow region.

Control of the specific chemical reactions of the introduced materials can be facilitated at least in part by controlling the temperature contours in and between the plasma region and the afterglow region. Control of the plasma and neutral gas temperatures can allow for optimization of the flux of building precursors, such as $C_2$ radicals. For example, too much $C_2$ in a small region can lead to formation of amorphous carbon and additional graphene layers; however, smaller concentrations of $C_2$ over a longer region lead to controlled growth of graphene platelets which is advantageous for growing longer platelets, typically sought after in many applications. Therefore, rather than having an intense source of $C_2$ over a small distance, having a controlled concentration of $C_2$ over a longer period is advantageous to growth kinetics.

Secondary Intra-Reactor Zones

For further materials processing within the reactor, the FEWG 205 can be fitted with any number of components that define secondary intra-reactor zones 1015 (such as secondary zone$_1$, secondary zone$_2$, secondary zone$_3$, secondary zone$_4$, . . . secondary zone$_N$). Each secondary zone can be independently sized by in a first dimension (as shown) and/or in a second dimension (not shown) by sizing its corresponding component. The order of the secondary zones can be determined based on a particular desired pathway. For example, secondary zone1 might be followed by secondary zone$_3$, followed by secondary zone$_2$, followed by secondary zone4, etc. A selection of secondary zones can be determined based on a particular desired pathway. For example, secondary zone$_1$ might be followed by secondary zone3, without any further secondary zones. Components that define any one or more of the secondary zones can be removably attached to a previous component and/or successive component(s). For example, a component that defines secondary zone$_1$ can be removably attached to the FEWG (as shown), and/or a component that defines secondary zone$_N$ can be removably attached to any other component, including the FEWG 205 itself.

The depiction of the microwave gas processing system 1000 of FIG. 10A is not necessarily to scale. Moreover, the shown length $L_1$ and length $L_2$ of the FEWG 205 might be relatively longer or relatively shorter with respect to each other. The physical shape of length $L_1$ and length $L_2$ can be designed to cause a longer or shorter residence time as materials pass through length $L_1$ and length $L_2$ of the reactor. Moreover, the different and independently controllable energy inputs (such as energy input$_1$, energy input$_2$) serve to control the temperatures and temperature variations that materials passing through length $L_1$ and length $L_2$ of the reactor are subjected to.

The two separate flow inlets (flow inlet 10081 and flow inlet 10082) permit two or more materials to be mixed, either before or after entering the FEWG 205. Mixtures of materials that include, for example, an active material component and an electrically conductive material component are useful in many applications such as electronics, automotive and aerospace. Such mixtures of materials often benefit from some underlying structure. For example, some structural composites utilize a fibrous web or weave of material with high tensile strength to provide strength in one or two directions. Such a fibrous web or weave of material is embedded in a matrix material with a lower elastic modulus to provide flexibility. Another application that benefits from an underlying structure within a mixture of active and conductive materials are battery electrodes, where the active material is an energy storage material and metallic or carbon-based particles provide electrical conductivity.

Related to the underlying structure of such mixtures, the surface area of the active material or the conductive component can also be important. A high surface area can provide a high interfacial area either between the active material and the conductive material, or upon which reactions can take place. In many applications, carbon allotropes are attractive for the conductive material component in such mixed structured materials because they can be produced with high electrical and thermal conductivities, and with high surface areas.

Conventional approaches to making such composite materials include growing structured carbon allotropes (such as nanostructured graphene) on a substrate, and then depositing the active material component into the pores of the structured carbon material. However, while high quality carbon allotropes require high growth temperatures (such as greater than 1000° C.), many other materials cannot withstand these high processing temperatures. Accordingly, the zone-segregated reactor 1001 can be configured with an extended length of the FEWG 205 such that chemical processing at lower temperatures within afterglow region 1003 can be carried out. Additional energy inputs (such as energy input$_2$) may be provided and controlled so as to maintain a temperature or temperature contours at least though length $L_2$.

Configurations can include juxtaposition of energy sources across length $L_1$ and $L_2$. Specifically, FIG. 10B1 and FIG. 10B2 depict alternative power intensity maps, FIG. 10C1 and FIG. 10C2 depict alternative electron density maps, FIG. 10D1 and FIG. 10D2 depict alternative electron temperature maps, and FIG. 10E1 and FIG. 10E2 depict alternative radical density maps.

The power intensity map 10B100 shows most of the high-power areas (such as areas depicted in red color) as being concentrated exclusively in the upper portions of the FEWG, whereas power intensity map 10B200 shows high power areas in the lower portions of the FEWG. The high-power areas in the lower portions of the FEWG are present due to the operation of several thermal plume energy sources 1023 that are separated to provide energy into the plasma region and/or into the afterglow region of the thermal plume. As such, the temperatures in the plasma region and/or in the afterglow region of the thermal plume can be controlled to accommodate the growth of fewer layer graphene nanoplatelets. Since the outward growth of graphene nanoplatelets is competing with growth of amorphous carbon and more graphitic layers, it is important to have a lower concentration of gas phase precursors over a longer distance. This can be referred to as balancing precursor concentrations with growth kinetics. Particle temperature is also important to control as it plays into the kinetics of graphene growth. Therefore, there are some circumstances where fine control of heating of the particles is of interest.

The contours of electron density, electron temperature, and gas temperature can influence various chemical and physical properties, including the distribution of gas phase precursors in the reactor. The concentration of these precursors must be balanced by the growth kinetics of the particles, which are in turn affected by the concentration of precursors and the temperature of the particles. Systematic self-nucleation of multiple organized graphene platelets can occur upon application of energetic ad-atom/ionic molecular species attachment that can take place under chemisorption and physisorption at one or more basal surfaces of each graphene platelet. Process conditions can be tuned carefully to yield graphene platelets fused to each other at substantially orthogonal angles, allowing for the creation of ornate, highly tuned, three-dimensional (3D) hierarchical multiparous carbon-based agglomerate particles.

Application of elevated thermal temperatures can provide the energetic driving force needed for movement and dispersing of individual graphene platelets, ultimately also contributing to the coalescing of such platelets to form larger agglomerate particles. A concentration level of precursors on the surface of a graphene platelet can affect the growth of the graphene platelet; however, this process competes with the formation of amorphous structures and further growth of more potentially unorganized and unattached graphene layers (which is undesirable). Therefore, excessive precursors on a given graphene platelet can lead to undesired carbon morphologies. Higher particle temperatures allow for faster diffusion of these adsorbed precursors along the graphene plane and therefore lead to faster growth, mitigating undesired morphology formation. Therefore, control of the length of the plasma plume, the concentration of gas phase precursors (affected by neutral gas temperature, electron density, and electron temperature), and the particle temperature and particle charge all contribute to controlling particle growth kinetics. Another aspect of controlling particle morphology is agglomeration of particles. Fluid velocity and particle charge dictate the motion of the particles throughout the reactor, which motion is in turn a dominant factor in controlling particle agglomeration.

The comparisons shown in the foregoing maps of FIG. 10B1, FIG. 10B2, FIG. 10C1, FIG. 10C2, FIG. 10D1, FIG. 10D2, FIG. 10E1, and FIG. 10E2 and the foregoing corresponding discussion establishes that positioning and control of thermal plume energy sources leads to tighter control of (1) power intensity, (2) electron density, (3) electron temperature, and (4) radical density. As such, at least some aspects of materials evolution can be influenced controlling thermal plume energy sources that are positioned along the length of an FEWG.

In some cases, the choice of purposefully configured lengths of length L1 and length L2 become dominant in the materials evolution that take place in the reactor. More particularly, in certain materials evolution situations, the materials evolve relatively slowly, leading to purposeful configuration of a relatively longer afterglow region through which the materials traverse while undergoing evolution. One example of microwave gas processing having a relatively longer afterglow region is shown and described as pertains to FIG. 11A.

Figure 11A:
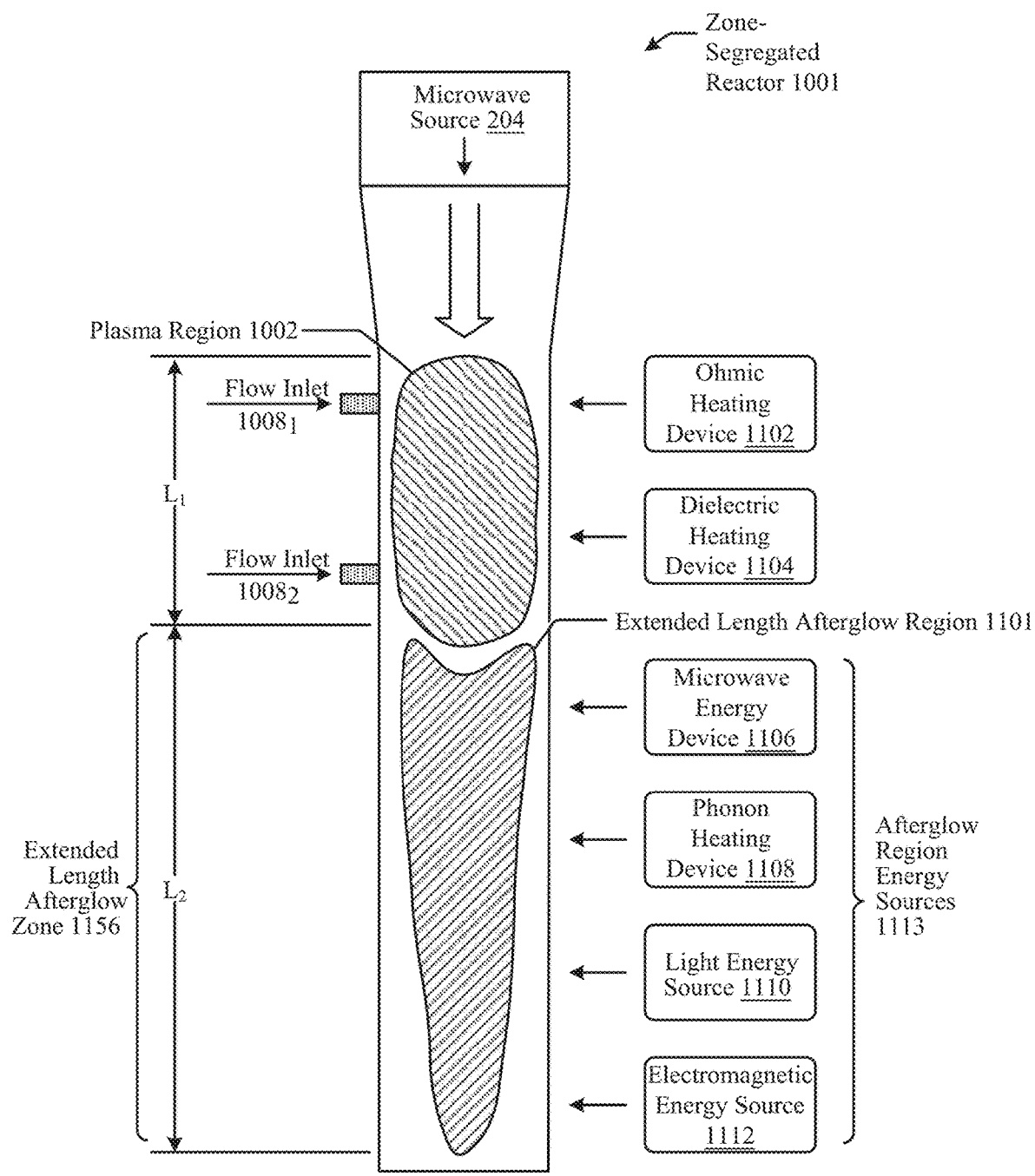
FIG. 11A shows a simplified vertical cross-section of a microwave gas processing system having an extended length afterglow zone, according to some implementations.

FIG. 11A is a simplified vertical cross-section of a microwave gas processing system having an extended length afterglow zone 1156. As shown, the microwave gas processing system is configured to facilitate a longer path length of materials as they traverse out of the plasma region and into and through the extended length afterglow region 1101. The temperature contours within the extended length afterglow region can be controlled, at least in part by afterglow region energy sources 1113 provided along length $L_2$ of the reactor. Control of at least some aspects (such as temperature contours, residence times, etc.) of the traversal path of process input materials and/or dissociated process input materials through the volume of the reactor corresponding to length $L_1$ and into the volume of the reactor corresponding to length $L_2$ results in tuned reaction products. Having an elongated plasma column with tuned electron density and temperature contours in the presence of a neutral gas facilitates an ideal concentration of growth precursors and particle temperatures which in turn serve to control growth of graphene nanoplatelets. The addition of energy to heat the particles directly—such as via microwave radiation—will increase particle temperature, thus enhancing graphene platelet growth. As such, the productivity of the reactor is enhanced. More specifically, the addition of higher energy levels will ionize the gas and other particles within the reactor, and the extended residence time spent in the extended length afterglow region 1101 allows these graphene platelets or flakes to reach larger sizes.

The energy added into length $L_2$ may be of any form of energy. Any combination of a second microwave energy source (such as microwave energy device 1106), and/or a phonon energy source (such as phonon heating device 1108), and/or a light energy source 1110, and/or an electromagnetic energy source 1112 can be located at any position along length $L_2$. The choice of the combination and positioning of the foregoing energy sources may be dependent on the desired chemical formulation and/or the desired specific morphology of the one or more reaction products. The afterglow region energy sources 1113 may be modular such that the various afterglow region energy sources can be positioned in any location along length $L_2$.

Figure 11B:
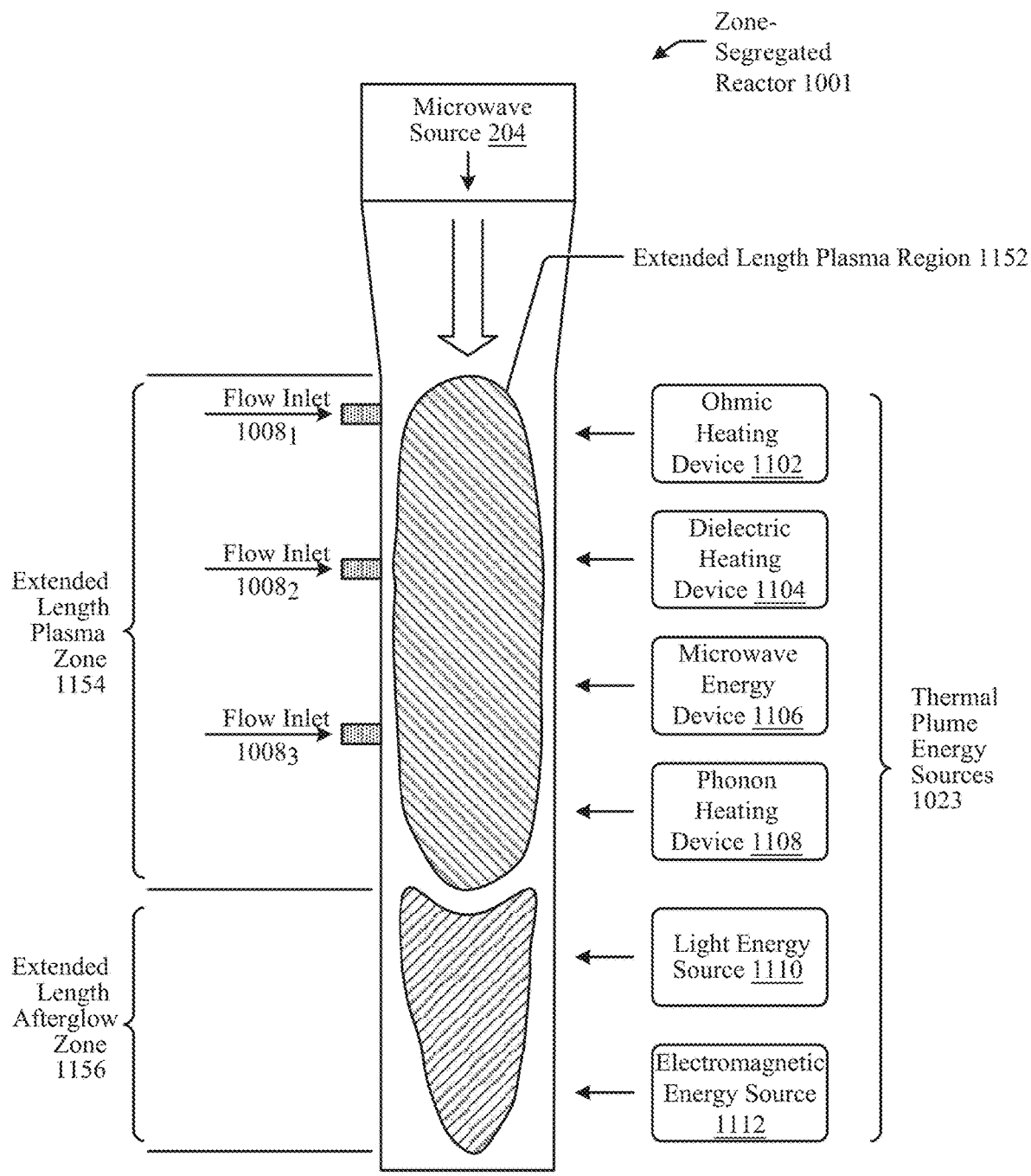
FIG. 11B shows a simplified vertical cross-section of a microwave gas processing system having an extended length plasma zone, according to some implementations.

FIG. 11B is a simplified vertical cross-section of a microwave gas processing system having an extended length plasma zone 1154. Here, the extended length plasma region 1152 is controlled so as to facilitate fine-tuned control of radical generation and/or to facilitate introduction of additional materials. Specifically, and as shown, a first set of thermal plume energy sources 1023 (such as ohmic heating device 1102, dielectric heating device 1104, microwave energy device 1106, phonon heating device 1108) are positioned along the length of extended length plasma zone 1154, whereas a second set of thermal plume energy sources 1023 (such as light energy source 1110 and electromagnetic energy source 1112) are positioned along the length of the extended length afterglow zone 1156.

As shown, the length of extended length plasma zone 1154 is sufficiently long so as to accommodate a third flow inlet 10083. This flow inlet can be configured to provide additional material into the FEWG. For example, to functionalize the graphene surface with different chemical groups such as fluorine, oxygen, or nitrogen these precursors can be added into third flow inlet as a gas stream. Growing composite particles can also be achieved in this fashion. For example, growing a composite SiC surface on top of the graphene nanoplatelets can be achieved by adding $SiH_4$ into the foregoing gas stream (such as via the third flow inlet).

The thermal plume energy sources 1023 may be modular such that the various thermal plume energy sources can be positioned in any location along the FEWG. For example, the ohmic heating device 1102 can be swapped with electromagnetic energy source 1112. Moreover, such modularity can include signaling to/from one or more reactor controllers. One illustrative example of such a configuration is shown and described as pertains to FIG. 11C.

Figure 11C:
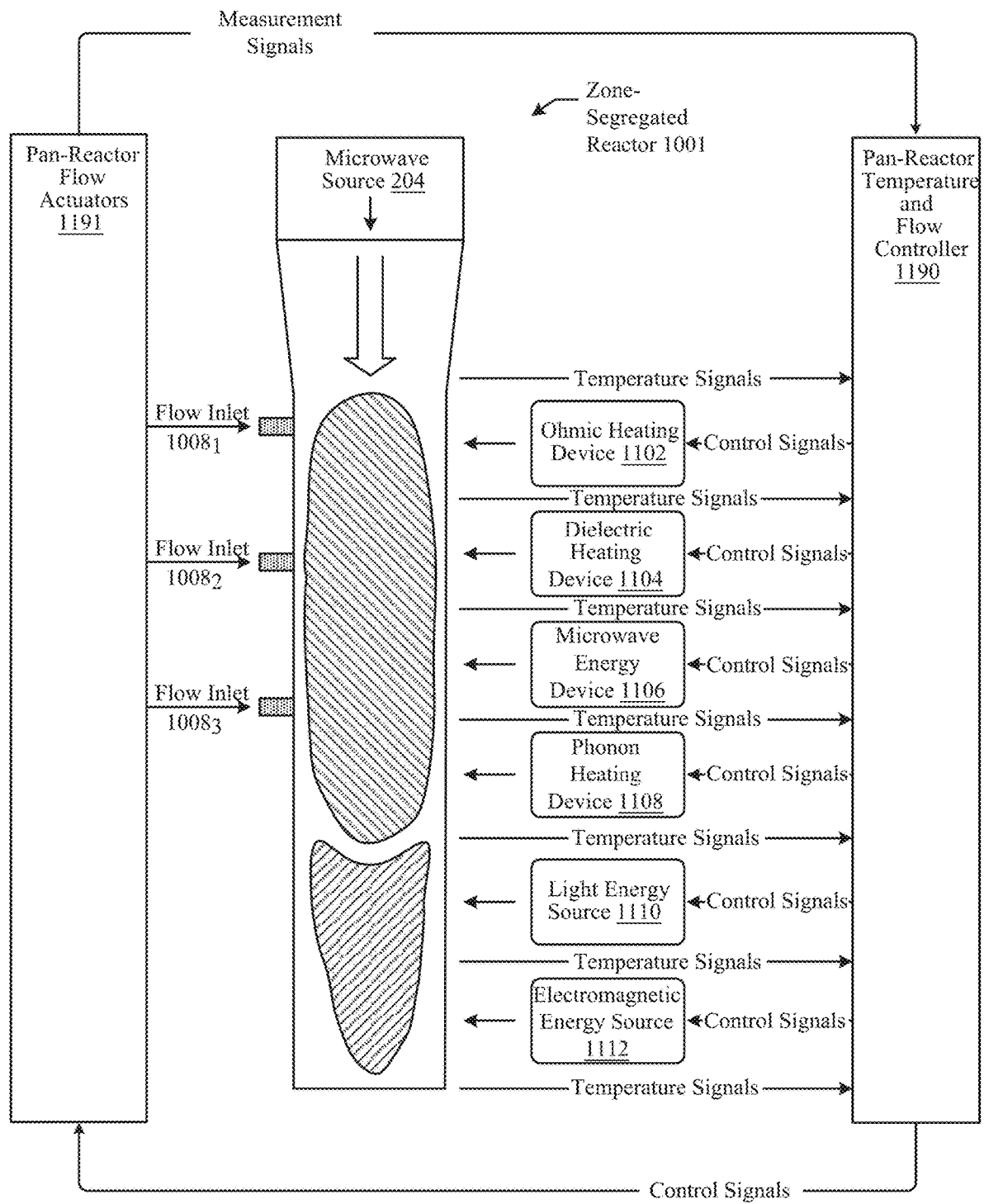
FIG. 11C shows a simplified vertical cross-section of a microwave gas processing system having a pan-reactor control system, according to some implementations.

FIG. 11C is a simplified vertical cross-section of a microwave gas processing system having a pan-reactor control system. As shown, the energy sources (such as ohmic heating device 1102, dielectric heating device 1104, microwave energy device 1106, phonon heating device 1108) light energy source 1110 and electromagnetic energy source 1112) are coupled to a pan-reactor temperature and flow controller 1190. The flow controller 1190 is in turn coupled with a bank of pan-reactor flow actuators 1191. Moreover, a series of temperature measurements (such as an embodied by the shown temperature signals) are coupled to the pan-reactor temperature and flow controller 1190 can control any one or more of the energy sources based at least in part on the temperature measurements. As such temperatures within the reactor can be controlled to a fine degree across all zones, and within all regions of the reactor.

Figure 12A:
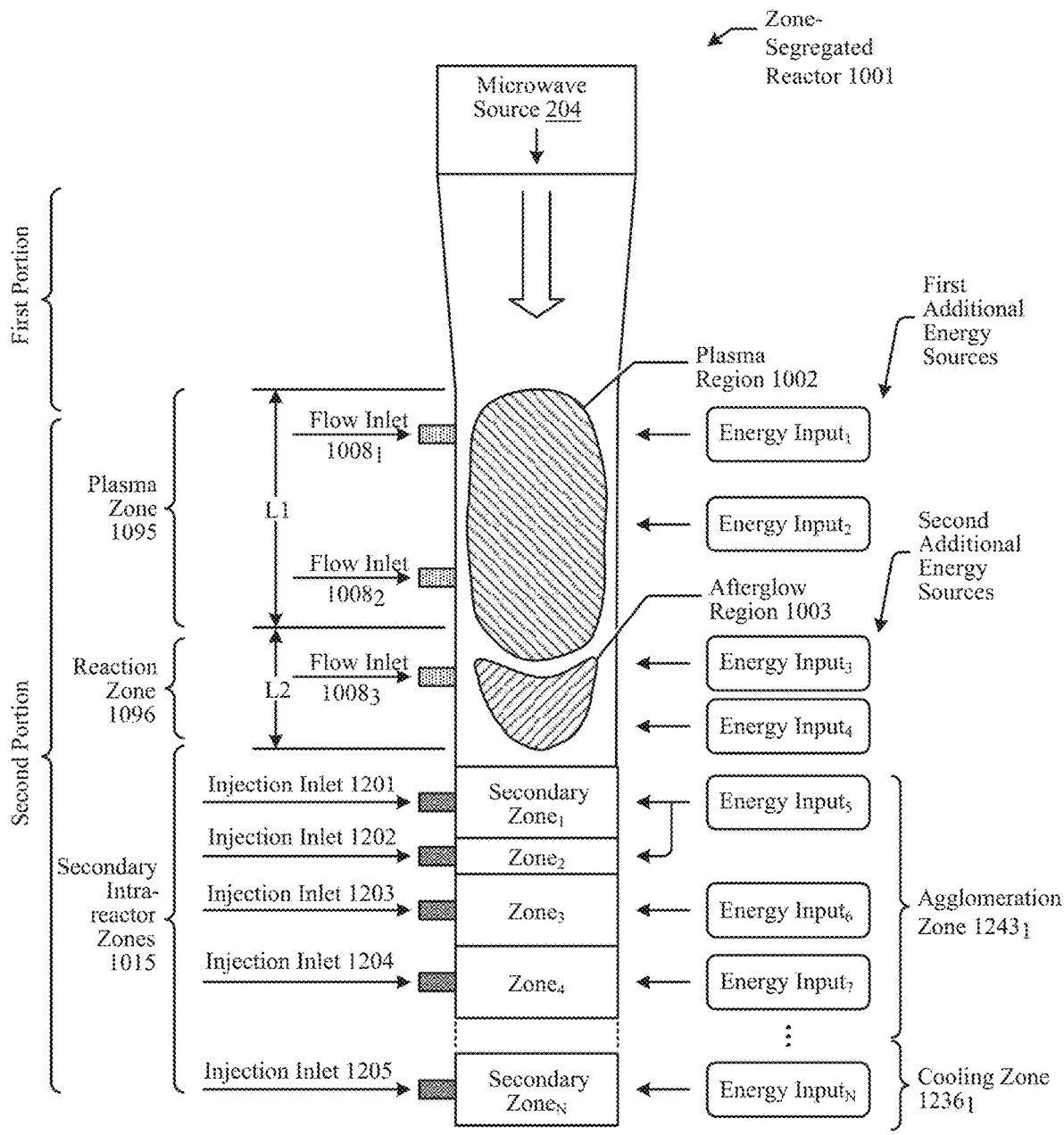
FIG. 12A shows a schematic of a modular microwave gas processing system having a series of secondary zones, according to some implementations.

FIG. 12A is a schematic of a modular microwave gas processing system having a series of secondary zones. The series of secondary zones (such as secondary zone$_1$, secondary zone$_2$, secondary zone$_3$, secondary zone$_4$, and secondary zone$_N$) have respective injection inlets (such as injection inlets, injection inlet$_2$, injection inlet$_3$, injection inlet$_4$, and injection inlet$_N$) as well as corresponding energy sources (such as energy input$_5$, energy input$_6$, energy input$_7$, and energy input$_N$).

The secondary zones, together with their respective injection inlets and energy inputs, can be configured for making structured composite materials (SCMs) that have particular chemical and/or morphological properties. A first set of secondary zones, together with their respective injection inlets and energy inputs, can be configured as an agglomeration zone 12431, whereas a second set of secondary zones, together with their respective injection inlets and energy inputs, can be configured as a cooling zone 12361. Any of the first set of injection inlets and/or the second set of injection inlets can be configured to introduce porous media, conductive particles, electrically conductive materials (ECMs), and/or active materials into a corresponding secondary zone.

In this embodiment, a plurality of porous media particles and a plurality of conductive particles can be introduced into the reactor, possibly at different locations on the reactor (such as through flow inlet 10082, and/or through injection inlet 1201 and/or through injection inlet 1202). Additionally, or alternatively, a plurality of porous media particles and a plurality of conductive particles are introduced into the reactor via injection inlet 1203. In some configurations, electrically conductive materials, possibly introduced via injection inlet 1204 is deposited on the surfaces (and/or in within the pores) of these two types of particles. The particles may coalesce and agglomerate together (such as in agglomeration zone 12431) to form the SCM. Additional material may be introduced into the reactor within the cooling zone 12361, possibly via injection inlet 1205.

Figure 12B:
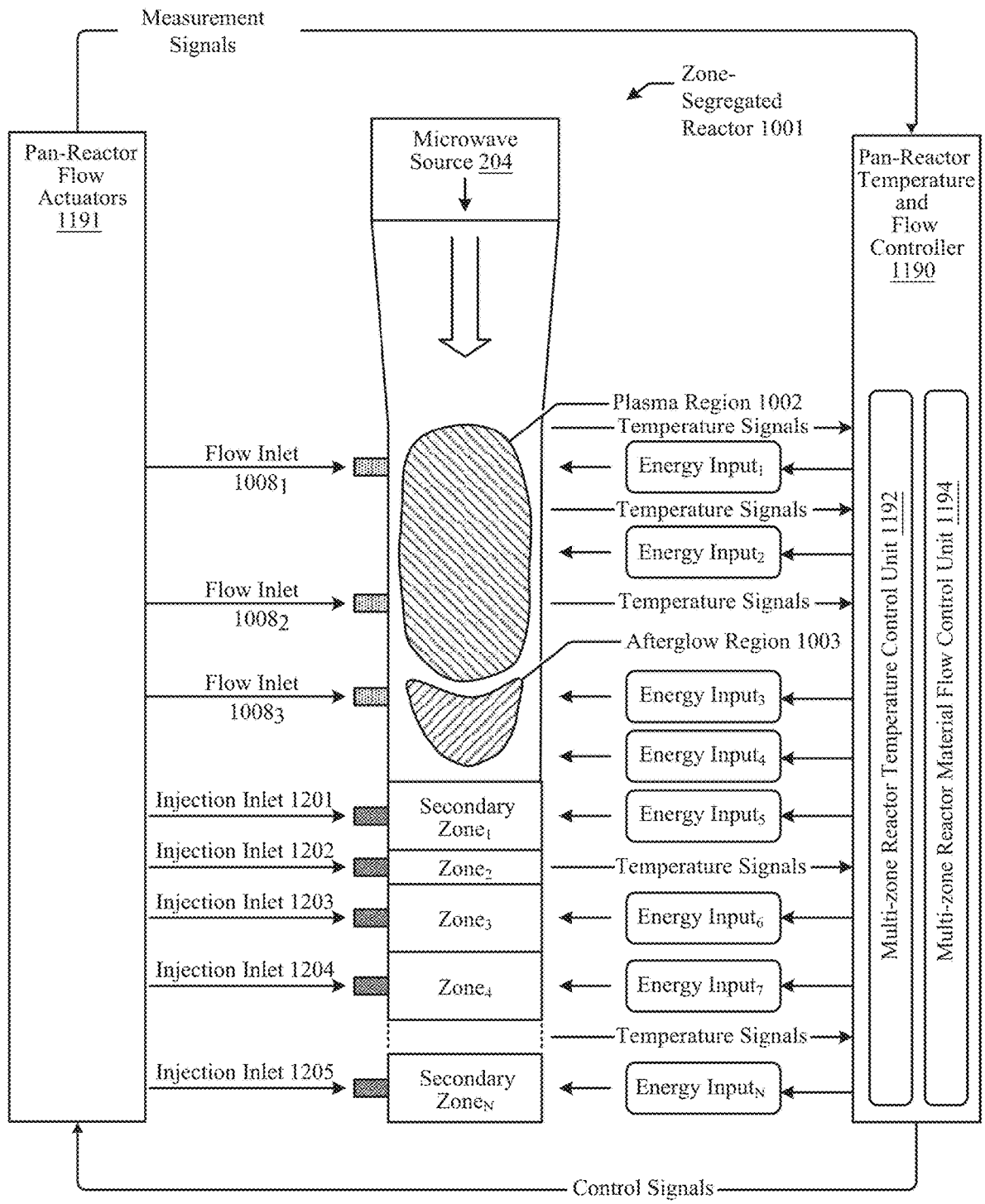
FIG. 12B shows a schematic of a modular microwave gas processing system having a having a pan-reactor control system, according to some implementations.

FIG. 12B is a schematic of a modular microwave gas processing system having a having a pan-reactor control system. As shown, the energy inputs (such as energy input$_1$, energy input$_2$, energy input$_3$, energy input$_4$, energy input$_5$, energy input$_6$, energy input$_7$, and energy input$_N$) are coupled to a pan-reactor temperature and flow controller 1190. The flow controller 1190 is in turn coupled with a bank of pan-reactor flow actuators 1191 that control flows into any/all of the flow inlets, and/or into the injection inlets. Moreover, a series of temperature measurements (such as an embodied by the shown temperature signals) are coupled to the pan-reactor temperature and flow controller 1190 so as to control any one or more of the energy sources based at least in part on the temperature measurements.

The shown embodiment includes a multi-zone reactor temperature control unit 1192. The multi-zone reactor temperature control unit 1192 serves to control temperatures within the reactor to a fine degree across all zones, and within all regions of the reactor. More particularly, in configurations having one or more secondary zones, temperatures within the one or more secondary zones can be controlled to a fine degree by the multi-zone reactor temperature control unit. The shown embodiment includes a multi-zone reactor material flow control unit 1194. The multi-zone reactor material flow control unit 1194 serves to control material flows within the reactor to a fine degree across all zones, and within respect to any/all flows entering the reactor. More particularly, in configurations having one or more secondary zones, the rate of material flows through injection inlets and into the one or more secondary zones can be controlled to a fine degree by the multi-zone reactor material flow control unit.

Figure 13A:
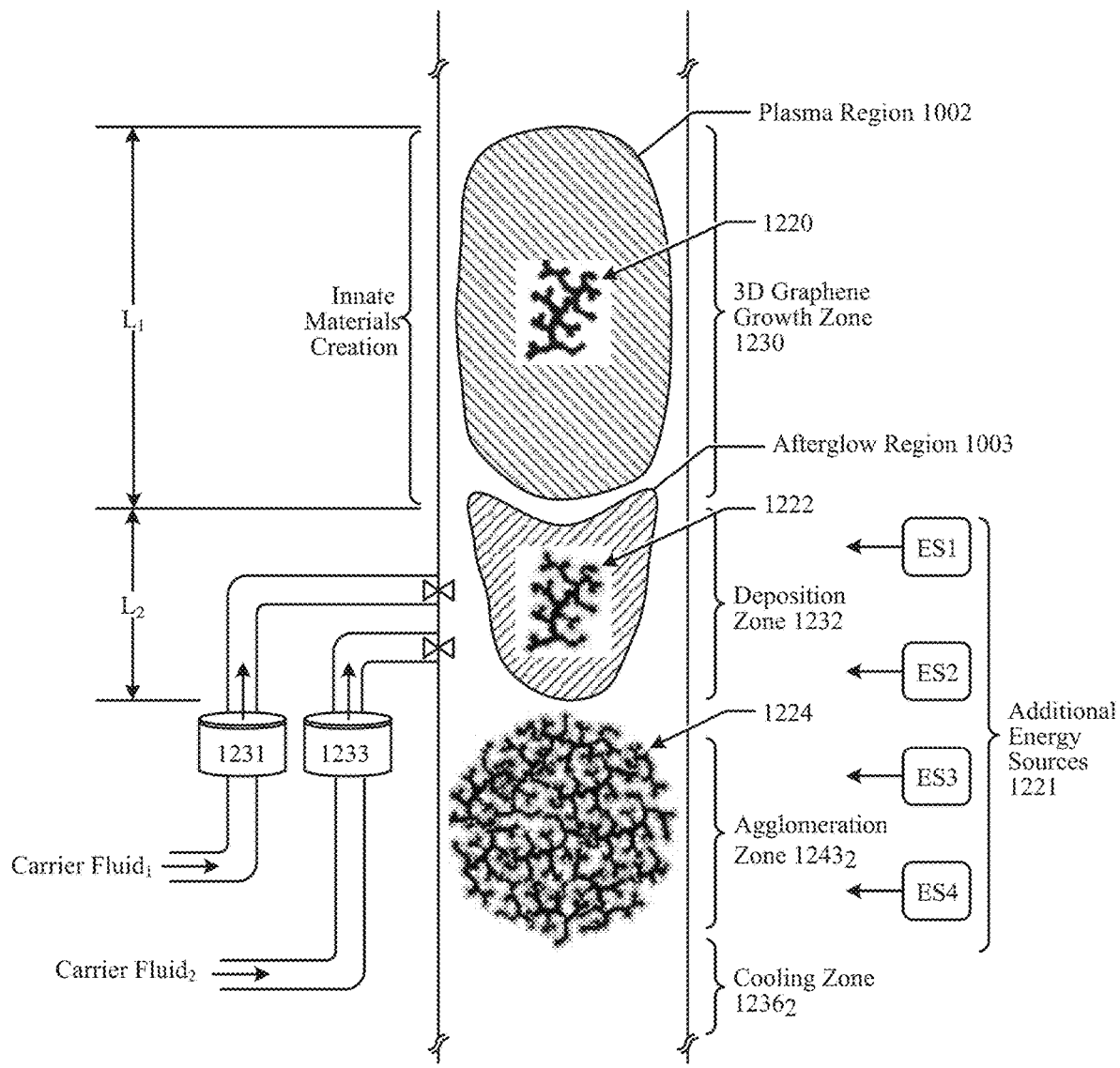
FIG. 13A shows schematic representations of materials as the materials evolve within a reactor, according to some implementations.

FIG. 13A shows schematic representations of materials as the materials evolve within a reactor. The materials evolution flow of FIG. 13A begins with innate materials creation, which occurs in the shown 3D graphene growth zone 1230. The innate materials 1220 then enter a deposition zone 1232 where functionalized innate materials 1222 are formed, then into an agglomeration zone 1243$_2$ where tuned morphology materials 1224 are formed, and then into a cooling zone 1236$_2$. The agglomeration zone 1243$_2$ and/or the cooling zone 1236$_2$ may correspond to a particular secondary zone or a particular set of secondary zones (such as secondary zone$_1$, secondary zone$_2$). In some cases, the cooling zone may correspond to a first secondary zone that is a first cooling zone followed by a warming zone, followed by a next secondary zone that serves as a second cooling zone.

In this particular embodiment, porous media 1231 and/or active material 1233 is dispensed into the volume of the FEWG. Growth and deposition are controlled such that the active material both has a high surface area and is also supported by a porous structure with very high electrical conductivity. The materials may be allowed to agglomerate within a temperature-controlled agglomeration zone 1243$_3$ and then move into a cooling zone 1236$_3$.

A reactor configuration in accordance with the foregoing can serve for:
  innate 3D materials creation (such as through nucleation and growth);
  introduction of, and synthesis of, materials that are deposited onto the innate materials in the deposition zone;
  agglomeration; and
  cooling.

Any materials at any temperature can be introduced into the deposition zone. Moreover, the temperatures in the deposition zone can be controlled so as to facilitate particular chemical reactions with particular reactants.

Functionalization and forming of composite graphene particles is possible by introducing secondary gas precursors into one or more of the zones of the FEWG. For example, growing SiC-Graphene composite particles can be accomplished by introducing $SiH_4$ into the deposition zone. A configuration can dissociate $SiH_4$ and introduce the precursors directly to the deposition zone. Additionally, or alternatively, growing SiC-Graphene composite particles can be accomplished by introducing $SiH_4$ into a reactor configuration that dissociates $SiH_4$ and introduces the precursors directly to one or more secondary zones (not shown).

Introducing $SiH_4$ directly to the secondary zone can be effective if a plasma or high temperatures exists in this region to dissociate the gas into precursors necessary for SiC growth on the graphene nanoplatelets. For example, and as shown, additional energy sources 1221 (such as energy source $ES_1$, energy source $ES_2$, energy source $ES_3$, energy source $ES_4$) can be positioned along the length of the FEWG so as to provide tight control of energies throughout various regions within the reactor.

More specifically, particle temperatures are sought to be maintained for balancing growth kinetics. Other precursors can also be introduced in this fashion to grow other composite materials such as metallic or other ceramic precursors. Functionalization of the graphene surface is then accomplished in a similar fashion except that the introduced precursors comprise species that can functionalize the surface of the graphene. Strictly as examples, such precursors can be oxygen, fluorine, nitrogen, etc. The control of electron temperature, electron density, and gas temperature in this region is facilitates controlling the concentration of appropriate precursors, which in turn facilitates realization of the desired functionalization.

Now, returning to discussion of the deposition zone 1232, and referring to a specific desired functionalization, the deposition of the ECM and/or the active material can occur in different zones of a single reactor. In some cases, the different zones of the single reactor include one secondary zone or multiple different secondary zones within the reactor. Additionally or alternatively, the plurality of porous media particles and conductive particles can either be produced in one or more separate reactors from the reactor(s) used to deposit the ECM and active material, or in different zones of the same reactor used to deposit the ECM and active material.

As shown, the deposition zone abuts the agglomeration zone. In either or both of the deposition zone and the agglomeration zone, additional materials can be deposited onto the surfaces of and/or into the pores of the SCM. These additional materials can be the active materials. Strictly as one example, mesoporous carbon porous media particles can be coalesced with metallic conductive particles (such as silver particles) using a graphene-containing ECM after which an active material (such as sulfur, or $Li_xS_y$) can be deposited into the pores. Such deposition can employ any known techniques, possibly including use of a physical vapor deposition process (such as evaporation).

The porous media can provide a structural framework (or scaffold) and the ECM provides high electrical conductivity to the SCM. In some cases, the ECM is deposited onto the surfaces and/or in the pores of the porous media and forms a continuous (or semi-continuous, with some disconnected regions and/or islands) matrix and/or a coating throughout the SCM. In some cases, the porous media and the conductive particles are coalesced (or, welded together) by depositing an ECM. The resulting SCMs contain the porous media and conductive particles embedded in a matrix of the ECM. In some cases, the active material is deposited onto the surfaces and/or in the pores of the ECM and provides activity (such as energy storage capacity) to the SCM.

In some situations, the SCMs can be mixed together in a carrier fluid to form a carrier fluid mixture. The carrier fluids (such as the shown carrier fluid$_1$ and carrier fluid$_2$) can include or be precursors that are used in a molecular dissociation reaction to "weld" (such as coalesce, or unite the physically separate particles into one composite material) the porous media and the conductive particles into an SCM. For example, the carrier fluid (optionally mixed with another precursor input material) can dissociate (or decompose) into separated components to form an ECM that coats the porous media and conductive particles, thereby welding them together. The carrier fluid can contain carbon (such as methane gas) and can dissociate into a carbon-based ECM (such as graphene-containing particles) and volatile byproducts (such as hydrogen). Additionally or alternatively, the carrier fluid can be inert (such as used mainly to transport the particles within the reactor), be reactive (such as be separated into components that form the materials deposited in the reactor, such as the ECM), or be used to form a plasma (such as a hydrogen plasma within a microwave chemical processing reactor). The carrier fluid can be a liquid, a gas or a mixture of liquid and gas.

Some examples of gaseous carrier fluids that contain carbon are hydrocarbon gases such as $C_2H_2$, $C_2H_4$, $C_2H_6$, $C_3H_6$, carbon dioxide with water, trimethylaluminum (TMA), trimethylgallium (TMG), glycidyl methacrylate (GMA), methylacetylene-propadiene, propadiene, propane, propyne, acetylene, and any mixture or combination thereof. Some examples of liquid carrier fluids that contain carbon are isopropyl alcohol (IPA), ethanol, methanol, acetone, condensed hydrocarbons (such as hexane), other liquid hydrocarbons, and any mixture or combination thereof. The carrier fluid can be a mixture of any of the liquids stated above with any of the gases stated above. The carrier fluid contains carbon and contains less than 1% oxygen or contains no oxygen.

A carrier fluid (carrier fluids) mixed with the porous media 1231 and/or a carrier fluid (carrier fluid$_2$) mixed with the conductive particles 1233 is combined with another liquid or gaseous supply material within a reactor. This supply material can be inert (such as used mainly to transport the particles within the reactor), or the supply material can be reactive (such as to be separated into components that form the materials deposited in the reactor, such as the ECM), or the supply material can be used to form a plasma (such as a hydrogen plasma within a microwave chemical processing reactor). Some supply materials contain carbon, and some do not. Some examples of gaseous supply materials that contain carbon are hydrocarbon gases, such as $C_2H_2$, $C_2H_4$, $C_2H_6$, carbon dioxide with water, TMA, TMG, GMA, methylacetylene-propadiene, propadiene, propane, propyne, acetylene, and any mixture or combination thereof. Some examples of liquid supply materials that contain carbon are IPA, ethanol, methanol, condensed hydrocarbons (such as hexane), other liquid hydrocarbons, and any mixture or combination thereof. Some examples of gaseous supply materials that do not contain carbon are hydrogen, helium, a noble gas such as argon, or mixtures of more than one type of gas. An example of a liquid supply material that does not contain carbon is LiS. Depending on the composition of the carrier gas, and optional other gases the fraction of carrier fluid to total flow into the reactor can vary widely (such as from 0.1% to 100% of the total flow). After the SCM is created, an active material can be deposited onto the surfaces of and/or within the pores of the SCM.

The porous media particles and/or the conductive particles can be broken up within the reactor, either before, after, or concurrently with the deposition of the ECM and the joining or fusing of the porous media, conductive particles and ECMs together. Using the foregoing reactors, porous media 1231 and/or active material 1233 can be dispersed through the SCMs such that the active material has both a high surface area and is also supported by a porous structure with very high electrical conductivity.

The present SCMs can be tailored for use as energy storage materials, electronic materials, optical materials, structural materials, and others. The chemical composition and morphology of the porous media, conductive particles, and/or the ECM in the SCMs can be different in different applications. For example, active materials can include materials for batteries, capacitors, sensors, inks, fuel cells, printed circuits, Internet of Things (IoT) applications, metamaterials for electromagnetic films, electrochemical sensors, and materials for impedance spectroscopy, aerospace applications, automotive applications, light absorbing applications, electro-optics systems, satellites, or telescopes. The active material can be deposited within the pores of the porous media, the pores of the conductive particles, and/or the pores of the ECM material, and the resulting SCMs have improved properties compared to conventional composites.

For example, a high capacity and durable battery electrode (such as a cathode in a lithium ion battery) can be produced from an SCM containing mesoporous carbon as the porous media and sulfur-containing active material deposited within the pores of the mesoporous carbon. Other applications for SCMs include fuel cell and flow battery electrodes, anodes, and cathodes, as well as solid electrolytes. Strictly as one specific example, control of the plasma region to generate graphene nano-platelets brings about a scaffold structure that exhibits particularly high volumetric and gravimetric characteristics, which in turn results in highly sought-after battery components.

Another application for SCMs are resonators for frequency selective surfaces composed of nanostructured, micro-structured or meso-structured materials. The terms nanostructured, micro-structured, and meso-structured materials, as used herein, are materials with physical features (such as pores, precipitates, particles, and fibers) with average sizes in the 1 nm to 10 nm range in the case of nanostructured materials, 100 nm to 10 micron range in the case of micro-structured materials, and with a wide distribution of sizes in the case of mesoporous materials. These resonators can be used for direct energy absorption and to convey energy of only select frequencies, for example, in metamaterials for IoT devices and systems applications.

Another application for SCMs is in semiconductor devices. For example, an SCM can contain semiconducting particles (such as Si, SiGe, or GaAs) coated with a matrix material (such as conductive carbon or an insulating oxide). By tuning the morphology and materials in the SCMs, the properties of the semiconducting SCM can be tuned (such as the optical absorption, or the carrier mobility). These properties can be tuned to produce materials for high quantum efficiency photodetectors or high mobility thin film transistors.

A structural application for the SCMs described herein are reinforcing fillers for elastomer compounds. To explain, consider the following three properties that affect the ability of a particular carbon material to reinforce elastomers: surface area, structure, and surface activity. The present SCMs can be tailored to produce elastomer compounds with different properties. For example, high surface area graphene-containing porous media can be functionalized with an active material (such as H, S or N containing species) to improve the surface interaction between the SCM filler material and the surrounding polymer. Elastomeric compounds that incorporate functionalized carbon materials described herein can also benefit from a faster rate of cure, improved elastic moduli, improved abrasion resistance, and/or improved electrical conductivity.

Some non-limiting examples of active materials for the present SCMs are sulfur, sulfur compounds, silicon, silicon compounds, boron, bromine, and platinum, nickel, silver, molybdenum, and iron; however, the materials and methods described herein are applicable to many different active materials.

An SCM contains porous media coated with ECM and has high surface area and very small pores. Conventionally, it can be difficult to deposit an additional material (such as an active material) into very small pores, especially if those pores have high aspect ratios. The surface characteristics of the partially formed SCM and the deposition method of the additional material enable the additional material to efficiently be deposited within the small pores of the SCM, even into pores with high aspect ratios. For example, the average pore size can be less than 50 nm or less than 10 nm or less than 5 nm, with an aspect ratio of 1:10 (such as 10 times deeper than wide), or 1:5, or 1:2, or 1:1, and the additional material can fill more than 30%, or more than 40%, or more than 50%, or more than 60%, or more than 70%, or more than 80%, or more than 90% of the volume of the pore. In the case of a thin coating, then for the same pore sizes as above, the additional material coating can cover more than 30%, or more than 40%, or more than 50%, or more than 60%, or more than 70%, or more than 80%, or more than 90% of the surface area of the pore with the geometries described above.

An initial coating of surfactant materials such as silver or antimony are grown on the aforementioned materials to promote the additional material to fill the pores (such as with the geometries described above) without clogging. Tuning these surfactant materials (such as by varying coverage) can also be used to effectively tune the degree of pore volume filling of an additional material. In other examples, a thin wetting layer, such as a layer of amorphous carbon, or a surface functionalized with hydroxy groups, allows the additional material (especially if the additional material is a liquid) to infiltrate into the small pores more effectively.

The porous media, conductive particles, and/or ECM can have a high surface area (such as greater than 50 $m^2/g$), a high electrical conductivity (such as greater than 500 S/m), and/or a particular morphological structure (such as a mesoporous structure with a bi-modal pore size distribution, or with nanometer-scale pores interspersed within a 3D web of thicker, more conductive branches). These properties can be varied such that the SCMs are useful in different applications.

In different applications, the porous media can be electrically conductive, electrically insulating, or a semiconducting. A few non-limiting examples of porous media materials are carbon allotropes, silicon, silicon oxide, silica, diatomaceous earth, and silicon carbide; however, the materials and methods described herein are applicable to many different porous media materials. Throughout this disclosure, the porous media, conductive particles and/or ECM may be described as being composed of carbon allotropes, or carbon alloys, semiconductors, pure metals, or silicon; however, the materials and methods described herein are applicable to many different materials. For example, SCMs containing covetic materials (such as aluminum or copper intermixed with carbon) can be produced using plasma torch processing. The co-deposition within the plasma torch enables the formation of covetic materials, which are useful as interfacial materials in batteries, for example, to enhance battery electrode to substrate adhesion.

The porous media is composed of inorganic materials that are capable of withstanding high processing temperatures that are present in some of the downstream processes (such as greater than 500° C., or greater than 1000° C.). In other examples, the porous media is composed of materials with melting points and/or boiling points below the processing temperatures that are required for the downstream processes (such as greater than 500° C., or greater than 1000° C.). In some of these cases, the porous media will change phase in the downstream processes and intermix (such as melt-diffuse) with subsequently deposited materials.

The ECM can be deposited on the porous media, and the porous media will change phase during the ECM deposition process. In some cases, the electrically conductive media and the porous media will intermix (such as melt-diffuse) during the ECM deposition process. In some cases, covetic materials can result from phase changes through the SCM production process, which allow the two components to effectively combine.

Further details regarding general approaches to making and using covetic materials are described in U.S. application Ser. No. 16/752,693 titled "Covetic Materials", filed on Jan. 27, 2020, which is hereby incorporated by reference in its entirety.

Figure 13B:
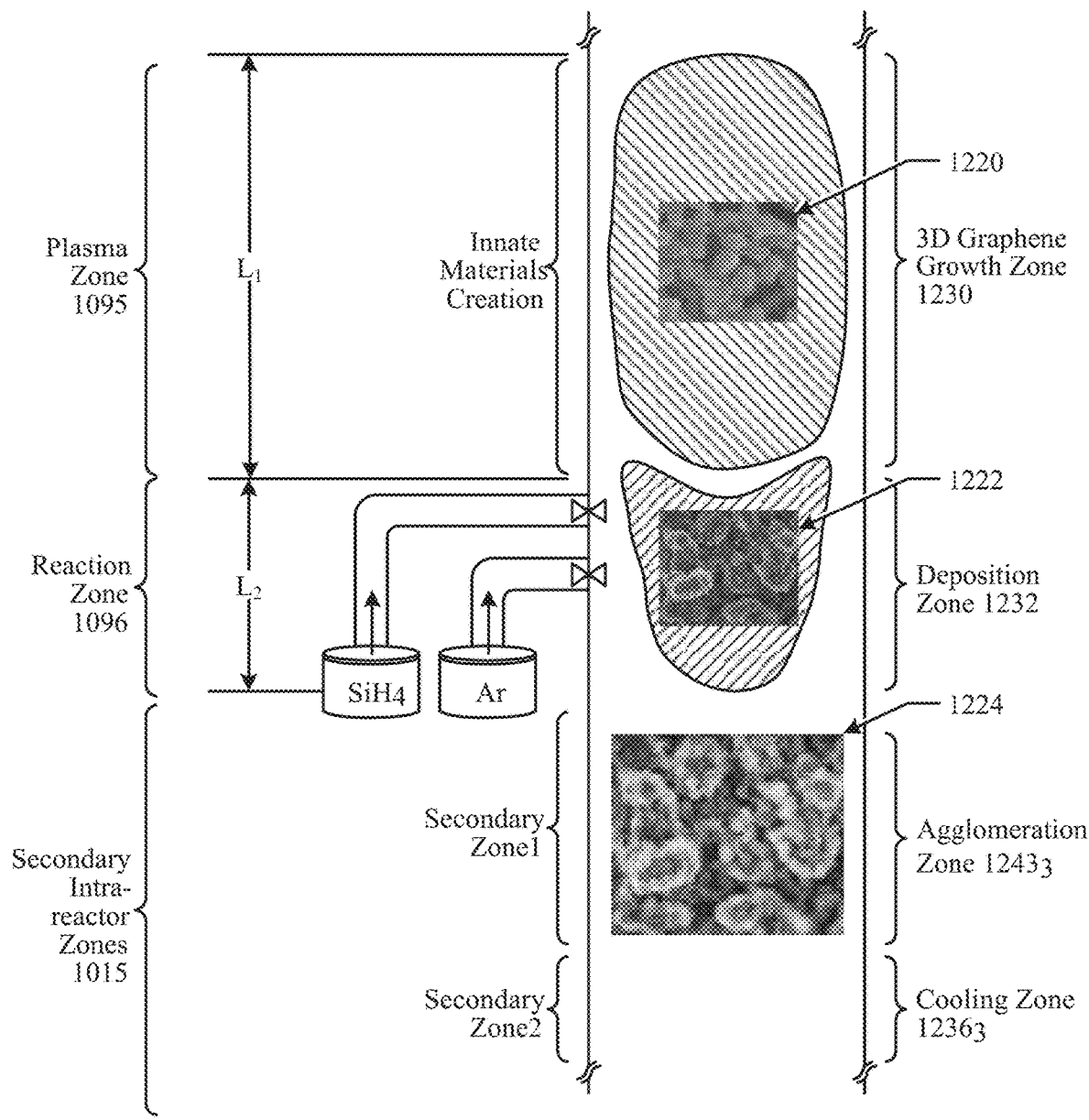
FIG. 13B shows actual images of materials as the materials evolve within a reactor, according to some implementations.

FIG. 13B shows actual images of materials as the materials evolve within a reactor. The specific implementation of the reactor of FIG. 13B supports various methods to produce an SCM. In the shown example embodiment, a plurality of porous media particles and a plurality of conductive particles are provided into the deposition zone 1232, and an ECM is deposited onto the surfaces (and/or in within the pores) of these two types of particles. Further, an active material may be then deposited on the surfaces (and/or in within the pores) of the plurality of the porous media particles, and the plurality of conductive particles is coated with the electrically conductive material to form a particular structured composite material. For example, $SiH_4$ and Ar can be injected into the afterglow region to form functionalized graphene structures. The graphene structures can be further functionalized using impurity doping. The graphene structures can be further functionalized by controlling the pore sizes during innate material growth.

One or more zones or secondary zones of the reactors described herein can contain particle drum coaters. Particle drum coaters are reactors that can be used to deposit coatings, weld, or otherwise modify particles. a particle drum coater is cylinder-shaped and configured such that particles are fed into one circular end of the cylinder-shaped coater, and an auger (such as an auger conveyor, or a screw conveyor, or a device for moving material by means of a rotating helical flighting) is used to transport the particles along the major axis of the cylinder. Some examples of drum coaters configured to deposit materials onto particles are drum coaters equipped with plasma CVD deposition systems, thermal CVD deposition systems, and spray liquid deposition systems. For example, silicon porous media particles can be fed into a particle drum coater equipped with a plasma CVD system, and a hydrocarbon precursor gas can be used to deposit a carbon ECM on the silicon particles. In some cases, the cylinder also rotates along the major axis to agitate the particles and improve the particle processing uniformity. Some advantages of such particle drum coaters are high throughput, continuous operation (using an auger system to continuously feed particles through the coater), and low equipment cost.

Zones can be abutted such that the SCM is not exposed to air between the zones. The materials flowing through the reactor can be transported between zones of a reactor by physical carriage in a gas flow, and/or due to gravity, or by a physical mechanism (such as an auger, or conveyor belt). Alternatively, the zones can be connected such that there is a small amount of oxygen exposure between zones (such as less than 100 ppm in the environment). In some cases, the particles can be exposed to air, or another moderately reactive environment while being transferred between zones.

Components of the reactor can be connected such that the SCM is not exposed to air between formation and collection. For example, the particles described herein can be conveyed from the reactor by pressurized flow, or by gravity, or by a physical mechanism (such as an auger, or conveyor belt). Alternatively, the zones can be connected such that there is a small amount of oxygen exposure between zones (such as less than 100 ppm in the environment). In some cases, the particles can be exposed to air, or another moderately reactive environment while being transferred between zones in the reactor.

An SCM contains porous media coated with ECM and can have a high surface area and very small pores. Conventionally, it can be difficult to deposit an additional material (such as an active material) into very small pores, especially if those pores have high aspect ratios. The surface characteristics of the partially formed SCM and the deposition method of the additional material can enable the additional material to be efficiently deposited within the small pores of the SCM, even into pores with high aspect ratios. For example, the average pore size can be less than 50 nm or less than 10 nm or less than 5 nm, with an aspect ratio of 1:10 (such as 10 times deeper than wide), or 1:5, or 1:2, or 1:1, and the additional material can fill more than 30%, or more than 40%, or more than 50%, or more than 60%, or more than 70%, or more than 80%, or more than 90% of the volume of the pore. In the case of a thin coating, then for the same pore sizes as stated above, the additional material coating can cover more than 30%, or more than 40%, or more than 50%, or more than 60%, or more than 70%, or more than 80%, or more than 90% of the surface area of the pore with the geometries described above.

An initial coating of surfactant materials such as silver or antimony are grown on the aforementioned materials to promote the additional material to fill the pores (such as with the geometries described above) without clogging. Tuning these surfactant materials (such as by varying coverage) can also be used to effectively tune the degree of pore volume filling of an additional material. In other examples, a thin wetting layer, such as a layer of amorphous carbon, or a surface functionalized with hydroxy groups, allows the additional material (especially if the additional material is a liquid) to infiltrate into the small pores more effectively.

The porous media, conductive particles, and/or ECM can have a high surface area (such as greater than 50 $m^2/g$), a high electrical conductivity (such as greater than 500 S/m), and/or a particular morphological structure (such as a mesoporous structure with a bi-modal pore size distribution, or with nanometer-scale pores interspersed within a 3D web of thicker, more conductive branches). These properties can also be varied such that the SCMs are useful in different applications.

Different morphologies of the porous media can be advantageous for different applications. For example, carbon-based mesoporous structures (such as with bi-modal or multimodal pore size distributions) can be advantageous in battery electrodes, metamaterials for IoT, fillers for elastomeric compounds, or other applications. The porous media can be any shape that provides a high porosity, such as mesoporous structures, hierarchical structures (such as structures with small and large features organized by size, such as dendritic or fractal-like structures), star-shaped, fibrous, or ordered structures.

An ECM, as described above, can then be conformally deposited (such as coated) on the surfaces and/or within the pores of the porous media. The SCMs containing the porous media and the ECM, as described above, have an electrical conductivity greater than 500 S/m, or greater than 2000 S/m, or from 500 S/m to 5000 S/m, or from 500 S/m to 20,000 S/m. In some cases, the electrical conductivity of the SCMs is measured after compression (such as into a disk, pellet, etc.) or after compression followed by annealing. The SCMs containing the porous media and the ECM, as described above, have an electrical sheet resistance less than 1 ohm/square, or less than 100 ohm/square, or between 1 ohm/square and 100 ohm/square, or between 1 ohm/square and 10,000 ohm/square, or between 1 ohm/square and 100,000 ohm/square. In some cases, the sheet resistance of the SCMs is measured by forming a film (such as when the SCMs are formulated into a slurry with a volatile solvent, coated, and dried), and using a four-point probe measurement, or an eddy current based measurement.

For example, SCMs with high electrical conductivity can be created by vapor depositing metals onto the clusters in such a way as to prevent pore clogging (such as by functionalizing the pore surfaces as described above). In some applications, these high-conductivity SCMs are slurry-deposited (such as inks or toners for printers). Optionally, a heated calendaring roller can compress and melt the metals in the SCM particles together to connect the porous media (such as graphene containing carbon material) without the use of binders. In some high-speed electronics applications, films or patterns formed using this method can be used to efficiently conduct GHz frequency electrical signals. In the case of toners, SCM particles can be printed via laser printer and microwave radiation can be used to melt a low melting point ECM (such as silver, or antimony), thereby embedding the porous media of the SCM particles into a highly conductive metal matrix. The thickness of the ECM deposited on the surfaces and/or within the pores of the porous media can be from 1 monolayer (such as less than 1 nm thick) to several layers thick (such as less than a few nanometers thick). In other cases, the thickness of the ECM deposited on the surfaces or within the pores of the porous media can be from 1 nm to 100 nm thick, or from 0.1 microns to 100 microns.

An active material, as described above, can then be deposited on the surfaces and/or within the pores of the porous media optionally coated with the ECM. The resulting material is an SCM with a porous media, optionally an ECM, and an active material. The active material can be deposited using any conformal deposition technique capable of depositing the active material on the surfaces and/or within the pores of the porous media optionally coated with the ECM. Some examples of conformal deposition techniques that can be used to deposit the active material are solution deposition techniques (such as chemical bath deposition, sol-gel deposition, particle printing, etc.) and vapor deposition techniques (such as sputtering, evaporation, chemical vapor deposition, atomic layer deposition (ALD), etc.).

Due to the high porosity of the porous media and/or the ECM, an active material that efficiently penetrates into the pores can occupy a large volume of the SCM. The mass fraction of the active material compared to the total mass of the SCM is greater than 20%, or greater than 40%, or greater than 60%, or greater than 80%, or from 10% to 90%, or from 50% to 90%, or from 60% to 90%.

In some cases, the active material will alloy with the material in the porous media or the materials in the porous media coated with the ECM. For example, in some processes the active material is deposited at an elevated temperature, which can melt or partially melt the porous media and/or conductive particles and the active material will alloy with the underlying materials upon deposition. In other cases, the porous media and/or conductive particles will not melt or will partially melt during the active material deposition, but the elevated temperatures enable the active material to diffuse into the underlying materials causing some degree of alloying between the active materials and underlying materials.

Coating the porous media with other films (such as an ECM and/or active material) will densify the porous media by filling in some of the voids (such as pores) in the material. This is true for other examples of film deposition on the porous materials described herein as well. Furthermore, the act of welding (or coalescing) can also densify the less dense porous materials into a denser SCM. The porous media has a high electrical conductivity (such as a conductive carbon allotrope). In such cases, the coating of additional ECMs may or may not be required. The porous media is itself an active material (such as silicon). In such cases, the coating of additional active materials may or may not be required.

Figure 13C:
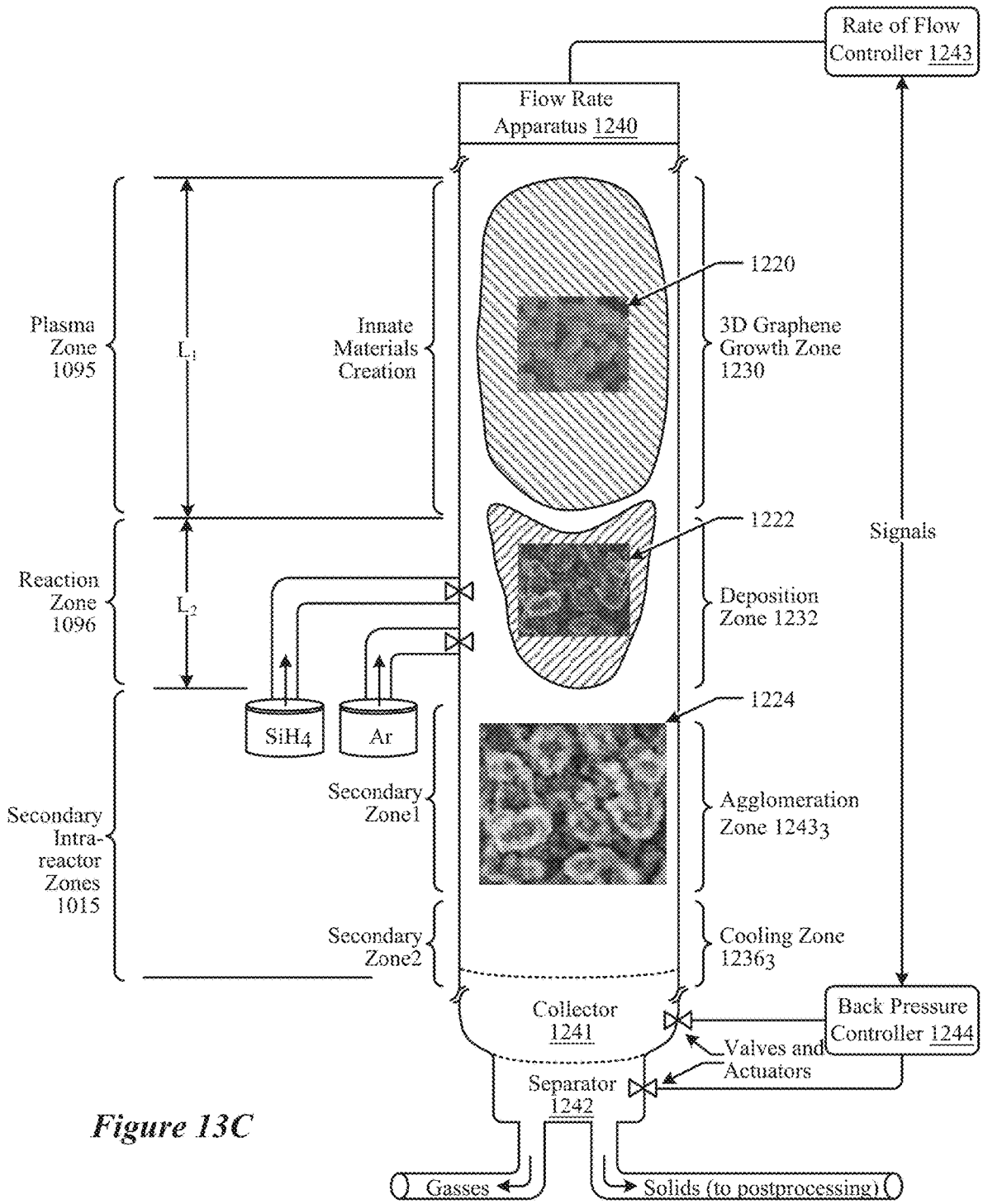
FIG. 13C depicts a materials evolution as materials flow through a reactor and into a collector for post-processing, according to some implementations.

FIG. 13C depicts a materials evolution as materials flow through a reactor an into a collector for post-processing. The reactor design of FIG. 13C includes a collector 1241 and a separator 1242. The collector and/or the separator, whether configured singly or configured in combination, may use any known techniques to separate different constituents (such as gasses versus solids) of the materials emerging from the cooling zone. Details of performing constituent separation in microwave chemical processing systems are disclosed in U.S. Pat. No. 10,308,512, entitled "Microwave Reactor System with Gas-Solids Separation" and issued on Jun. 4, 2019, which is owned by the assignee of the present application and is hereby incorporated by reference in its entirety.

Pressure inside the zones of the reactor can be varied to control gas phase chemistry and the concentration of precursors. Such pressures also affect the forces on the particles and in turn affect particle agglomeration. For example, a lower pressure leads to a lower neutral gas density which typically leads to lower electron densities and higher electron temperatures, which conditions serve to tune the gas phase chemistry in the reactor. The pressures inside the collector and/or the separator can be controlled, at least in part by operation of (1) a flow rate apparatus 1240, (2) a rate of flow controller 1243, and a back-pressure controller 1244.

As shown, after cooling follows collection and separation, after which one or more post-processing steps can be performed. For example, etching (such as plasma etching, or chemical etching) can be performed on the SCM to selectively etch or remove one or more of the material components. Some non-limiting examples of post-treatments include mechanical processing such as ball milling, grinding, attrition milling, micro-fluidizing, jet milling, and/or other techniques to reduce the particle size without damaging the carbon allotropes contained within.

Other examples of post-treatments include exfoliation processes such as shear mixing, chemical etching, oxidizing (such as Hummer method), thermal annealing, sintering, doping by adding elements during annealing (such as S, and N), steaming, filtering, and lyophilizing, among others. Other examples of post-treatments include sintering processes such as SPS, microwave, microwave plasma, and UV, which can be conducted at high pressure and high temperature in an inert gas. Multiple post-treatment methods can be used together in parallel or in series. The post-processing can be useful to modify the morphology and/or the surfaces of the SCMs. For example, large SCMs can be ground into smaller SCMs and formulated with certain solvents into printable inks.

The present porous media and/or conductive particles can contain particulate carbon. This particulate carbon can have high compositional purity, high electrical conductivity, and a high surface area compared to conventional carbon materials. The particulate carbon can also have a structure that is beneficial for specific applications. For example, small pore sizes and/or mesoporous structures can be beneficial to battery electrode materials, metamaterials for electromagnetic films, electrochemical sensors, and materials for impedance spectroscopy. In some cases, a mesoporous structure can be characterized by a structure with a wide distribution of pore sizes (such as with a multimodal distribution of pore sizes). For example, a multimodal distribution of pore sizes can be indicative of structures with high surface areas and a large quantity of small pores that are efficiently connected to the substrate and/or current collector via material in the structure with larger feature sizes (such as that provide more conductive pathways through the structure). Some non-limiting examples of such structures are fractal structures, dendritic structures, branching structures, and aggregate structures with different sized interconnected channels (such as composed of pores and/or particles that are roughly cylindrical and/or spherical).

The particulate carbon in the porous media and/or conductive particles is doped with another material (such as H, O, N, S, Li, Cl, F, Si, Se, Sb, Sn, Ga, As, and/or other metals). Doping can be advantageous because it can tune the properties of the particulate carbon. For example, doping with a metal can improve the conductivity of the particulate carbon, and doping with oxygen can change the surface energy of the particulate carbon making the particulate carbon easier to disperse in liquids.

In the present disclosure, compositions, and methods for making structured composite materials (SCMs) are described. In different embodiments, the SCMs can contain different combinations of porous media, conductive particles, electrically conductive materials (ECMs), and/or active materials. The porous media can provide a structural framework (or scaffold) and the ECM provides high electrical conductivity to the SCM. In some cases, the ECM is deposited on the surfaces and/or in the pores of the porous media and forms a continuous (or semi-continuous, with some disconnected regions and/or islands) matrix and/or a coating throughout the SCM. In some cases, the porous media and the conductive particles are coalesced (or, welded together) by depositing an ECM. The resulting SCMs contain the porous media and conductive particles embedded in a matrix of the ECM. In some cases, the active material is deposited on the surfaces and/or in the pores of the ECM and provides activity (such as energy storage capacity) to the SCM.

Further Experimental Runs

The heretofore-described materials generation can occur in many different types of reactors. The term "reactor" as used herein can include any system where the porous media and/or the conductive particles and/or the active materials are processed to form the SCMs described herein, and/or to form an intermediate product of the SCMs described herein. The reactors described herein will typically provide energy to input materials to deposit materials, weld materials together, or otherwise alter the input materials, thereby forming the SCMs described herein. For example, the input materials can be a gas or liquid input material that is converted into separated components to form particles or deposit films or can be the porous media which are partially melted and weld together with conductive particles. In some cases, the reactors can include components that are open to the surrounding environment. In some cases, the reactors can enable processing at atmospheric pressure, or a pressure greater than 0.1 atm, or in a vacuum. The pressure within the reactor can be above atmospheric pressure (such as above 1 atm, or from 1 atm to 10 atm), approximately at atmospheric pressure (such as from 0.5 atm to 2 atm, or from 0.1 atm to 2 atm), or a vacuum (such as below 0.1 atm).

In some cases, the atmosphere within the reactor is inert (such as argon or nitrogen gas), or reactive (such as oxygen or hydrogen gas), or moderately reactive (such as air). In some cases, the microwave chemical processing reactor comprises any one or more components of a microwave plasma reactor, a microwave plasma enhanced chemical vapor deposition (CVD) reactor, a microwave thermal CVD reactor, a plasma torch, a radio frequency (RF) energy source reactor, an RF plasma CVD reactor, a thermal reactor, a filament heating thermal CVD reactor, a thermal CVD reactor, an inductive heating thermal CVD reactor, a particle drum coater, and/or a UV reactor. A particle drum coater is a reactor that processes particles inside of a rotating drum (such as to deposit additional materials onto the particles or modify the particle surfaces). A UV reactor is a reactor that supplies energy to the materials using UV radiation.

The processes described herein include sequences of steps, and in a given step one or more materials can be produced, modified, or welded. All of the steps in a reaction occur in one integrated reactor (such as "in situ" processing separate reactors are used for different steps (such as "ex situ" processing). For example, the porous media and/or conductive particles can be produced ex situ in separate reactors, collected from each reactor, and then fed into a third reactor to be welded together. In another example, the porous media and/or conductive particles can be produced in situ in separate zones of the same reactor, and then fed into a third zone of the reactor to be welded together.

In some experimental runs, different methods were used to feed the carrier fluid mixtures into the reactors. In some experimental runs, carrier fluid mixtures were supplied to the reactor using gas lines, atomizers, or bubblers (such as head gas fed into a reactor with or without an additional carrier gas). In some cases, the carrier fluid mixtures were supplied in the reactor from single source or multi-source supply methods. In some cases, the carrier fluid and porous media and/or the conductive particles were mixed in situ in the reactor, or prior to being fed into the reactor. In some cases, the carrier fluid and porous media and/or the conductive particles were fed directly into the reactor from a single stream, and in other cases there were multiple feed streams into the reactor and mixing occurred within the reactor. In some cases, the materials being fed into the reactor were temperature regulated. For example, the temperature of a gaseous material can be kept above the boiling point of the liquid phase (such as 10° C. above the boiling point).

In some experimental runs, the carrier fluid with the porous media and/or the conductive particles was fed into a reactor (such as a microwave chemical processing reactor) to produce an SCM, which was subsequently compressed into a pellet or deposited onto a substrate to form a film, and the resistance or sheet resistance of the resulting SCM pellet or film was measured to be low (such as the conductivity was high). The resulting SCMs had resistivities that were 20% to 35% lower than the resistivity of the carbon particles alone (when compressed into a pellet for testing).

In some experimental runs, the carrier fluid with the porous media and/or the conductive particles were processed in a UV reactor, then were irradiated with a UV laser to form the SCM. For example, in some experimental runs, carbon particles were fed into a reactor and irradiated with a UV laser to create an SCM (similar to what is described in step 240 in FIG. 2). In some of the experimental runs, the pressure within the UV reactor was a low pressure (such as from 1 mTorr to 500 mTorr, or below about 70 Torr). Other pressures can be used within the reactor such as above atmospheric pressure (such as above, 1 atm, or from 1 atm to 10 atm) or approximately at atmospheric pressure (such as from 0.5 atm to 2 atm, or from 0.1 atm to 2 atm). In some experimental runs, the environment within the reactor was inert. In some experimental runs, a KOH chemical pre-treatment was performed on the carbon particles prior to UV irradiation, and in some cases no chemical pre-treatment was performed. In some cases, the resulting SCMs had sheet resistivities that were about 80% lower than the sheet resistivity of the carbon particles alone (when compressed into a pellet for testing).

Figure 14:
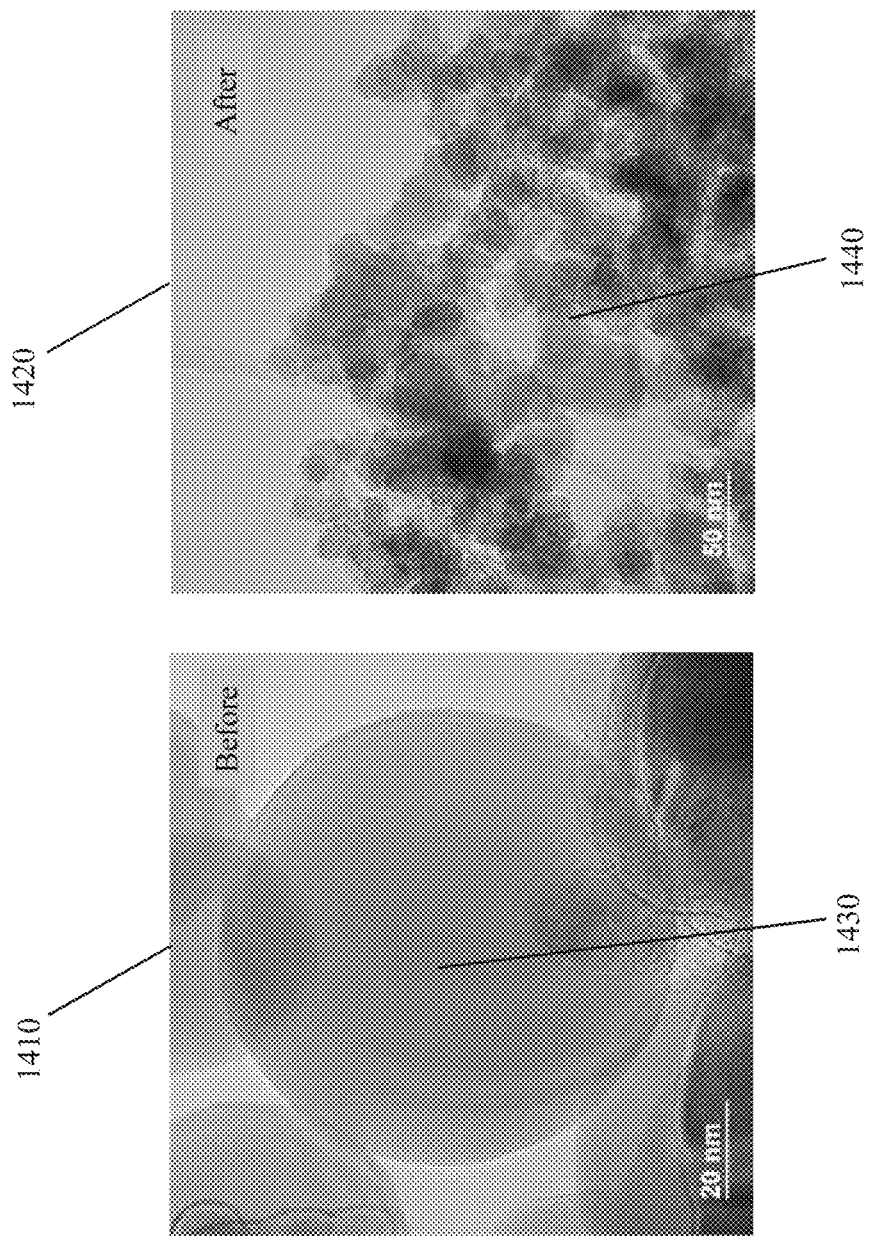
FIG. 14 shows TEM images of silicon particles before and after being processed in a microwave chemical processing reactor, according to some implementations.

FIG. 14 shows an example of silicon particles before and after being processed in a microwave chemical processing reactor, illustrating how some particles can be broken up during the processes described herein. As shown in the TEM image 1410, before being processed in the microwave chemical processing reactor, the silicon particles were roughly spherical. As shown in TEM image 1420, after the microwave plasma processing, the spherical particles 1430 were broken into smaller irregular shaped particles 1440. The broken particles in this example were roughly elliptical in shape with jagged edges. The particles were smaller, as well as geometrically different, from the primary Si particles injected, both of which caused an increase in surface area of the particles. This is advantageous for certain applications where high surface area, and small particle sizes are desired.

Figure 15:
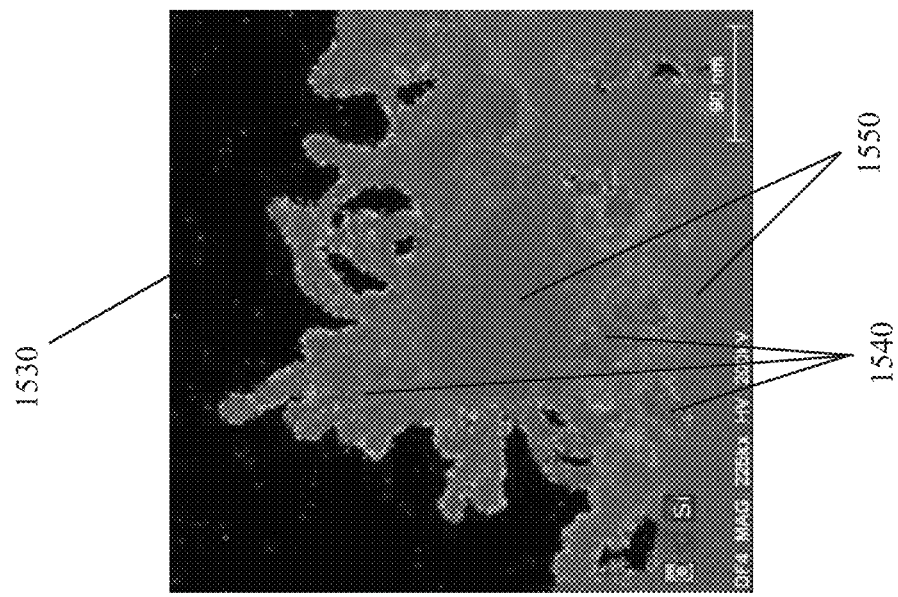
FIG. 15 shows TEM images and an EELS image of a structured composite material containing silicon particles with dendritic chains within a carbon-based electrically conductive matrix, according to some implementations.
Figure 15:
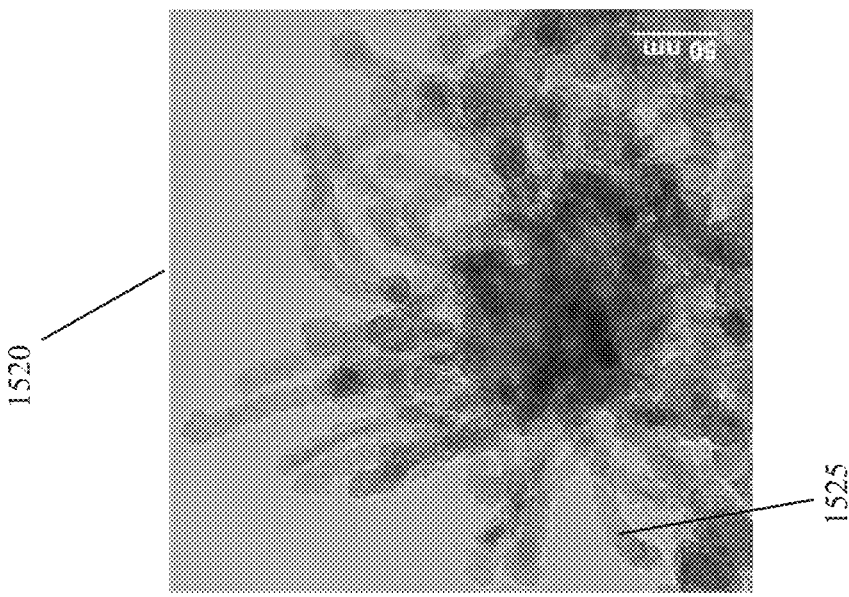
Figure 15:
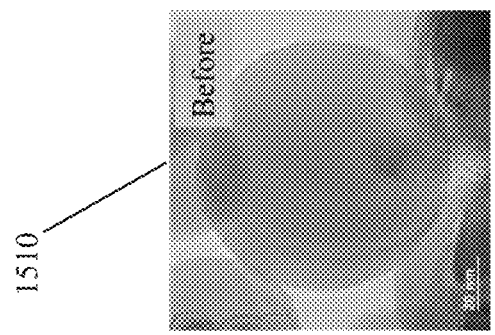

FIG. 15 shows an example of an SCM containing silicon particles with dendritic chains within a carbon-based electrically conductive matrix, produced using similar methods as the SCM in Example 3. A dendritic morphology can provide high surface area for forming an electrically conductive matrix. The porous media in this example contained silicon nanoparticles, which were fed into the microwave chemical processing reactor as roughly spherical shaped particles, as shown in image 1510. The silicon particles fed into the reactor in this example also had a thin oxide coating. The carrier fluid in this example was hexane and was mixed with the silicon particles in an inert environment before injection into the reactor. A hydrocarbon gas (such as methane) was also mixed with the carrier fluid mixture within the microwave chemical processing reactor (such as the carrier fluid mixture and the hydrocarbon gas were fed into the reactor using two separate inlets). The microwave plasma broke up the roughly spherical silicon particles into smaller irregular shaped particles, similarly to the example shown in FIG. 14. The hydrocarbon gas and the carrier fluid decomposed into separated components in the reactor including conductive carbon allotropes, which coated and fused (such as coalesced; welded) the broken silicon particles together forming the SCM. The TEM image 1520 shows the porous morphology of the SCM, including the irregular broken silicon particles, which formed dendritic chains 1525. The EELS image 1530 shows the elemental map of the SCM shown in image 1520. The EELS image 1530 shows the silicon porous media 1540 surrounded by the matrix of carbon ECM 1550. The silicon porous media regions 740 also show more oxygen than the SCMs shown in FIG. 10 and FIG. 11, and less oxygen than the materials shown in FIG. 12.

Figure 16:
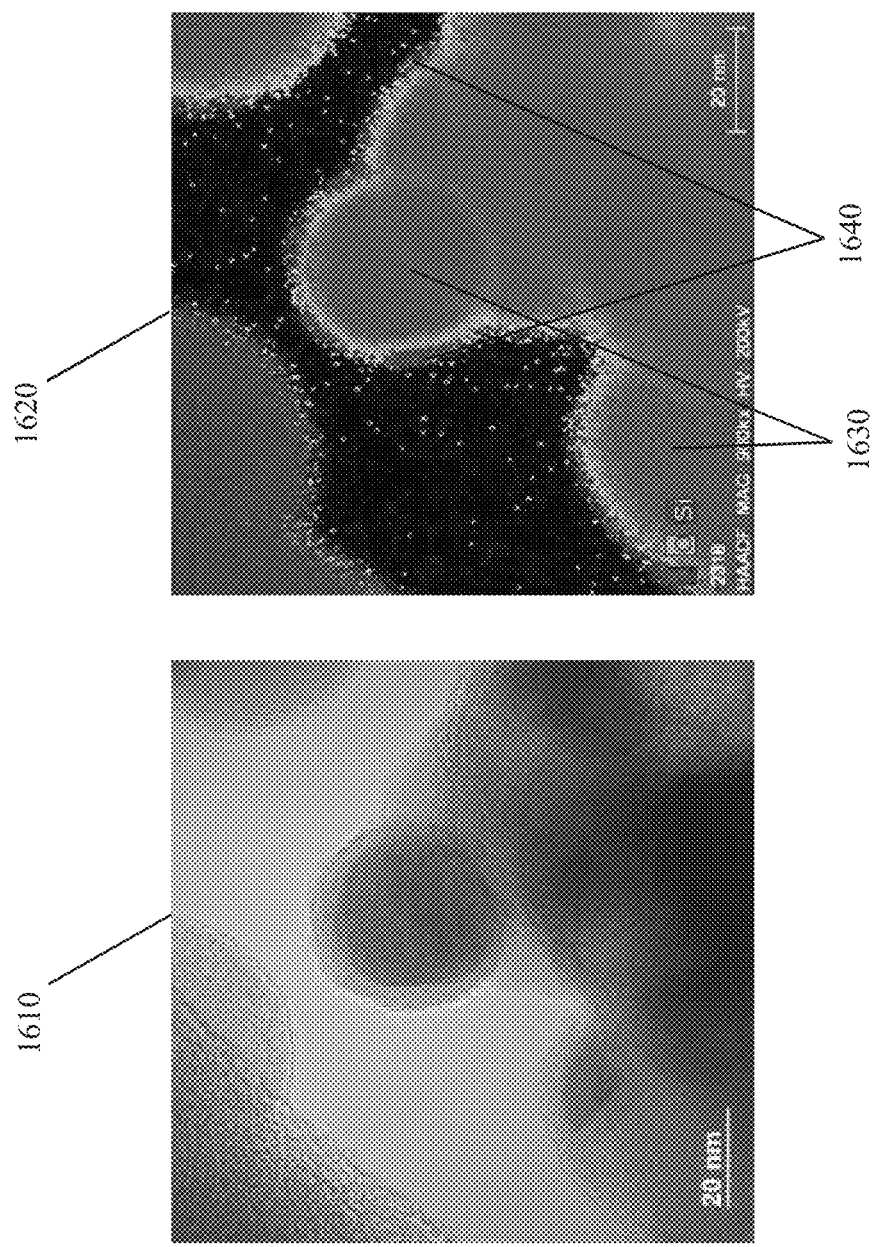
FIG. 16 shows a TEM image with an EELS image of a structured composite material containing silicon particles within a thermally produced carbon-based electrically conductive matrix, according to some implementations.

FIG. 16 shows an example of an SCM containing silicon particles within a carbon-based electrically conductive matrix, where the silicon particles were fed into a thermal reactor as a dry material. The porous media in this example contained silicon particles with average diameter less than about 1 micron. The silicon particles were premixed in an agitated bed in an inert environment before being fed into the thermal reactor in this example. Methane gas was mixed with the silicon particles within the reactor (such as the silicon particles were fed dry into the reactor, and the methane gas was fed into the reactor using a separate inlet). The methane gas decomposed into separated components in the reactor including conductive carbon allotropes, which coated and fused (such as coalesced or welded) the silicon particles together forming the SCM. The TEM image 1610 shows the porous morphology of the SCM. The EELS image 1620 shows the elemental map of the SCM shown in 1610. The EELS image 1620 shows the silicon porous media 1630 surrounded by the matrix of carbon ECM 1640.

Figure 17A:
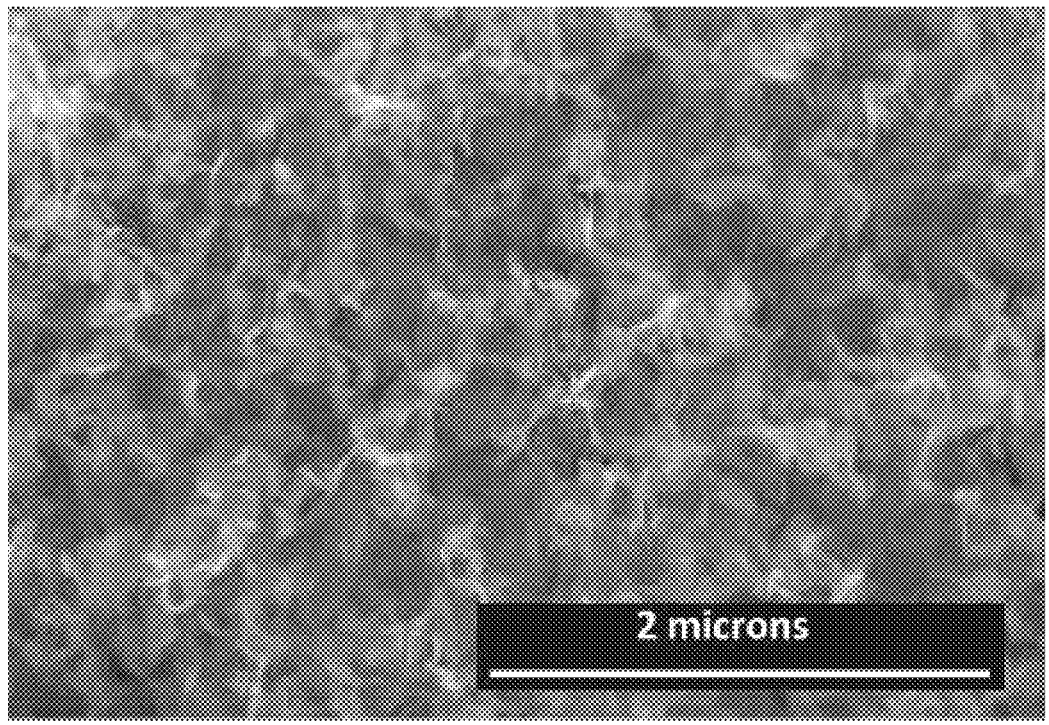
FIG. 17A shows an SEM image of an example of a carbon-based porous media produced using a microwave chemical processing reactor, according to some implementations.
Figure 17B:
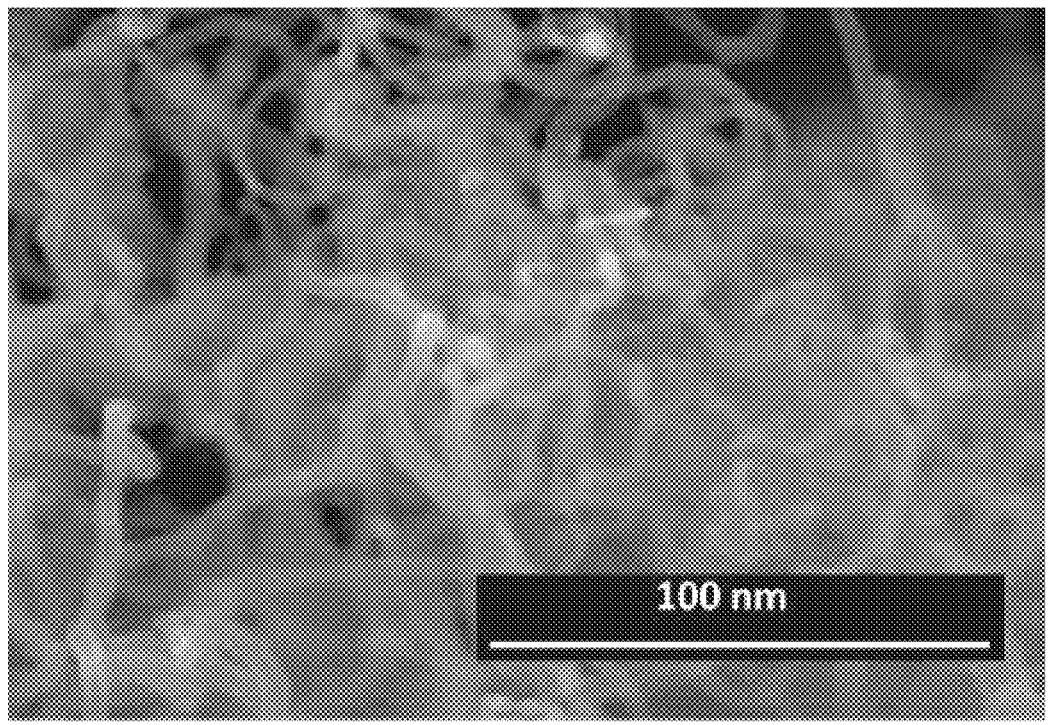
FIG. 17B shows an SEM image of an example of carbon-based conductive particles produced using a microwave chemical processing reactor, according to some implementations.

FIG. 17A is an SEM image of an example of a carbon-based porous media produced using a microwave chemical processing reactor, as described herein. FIG. 17B is an SEM image of an example of carbon-based conductive particles produced using a microwave chemical processing reactor, as described herein. The porous media in this example was highly structured, as shown in FIG. 17A, and had a high surface area.

The conductive particles in this example had high aspect ratios, as shown by the fibrous structures in FIG. 17B. Both the porous media and conductive particles in this example were produced using a microwave chemical processing reactor. The carrier fluid in the reactor was a hydrocarbon gas (methane), which decomposed into separated components in the reactor including the carbon allotropes forming the materials in FIG. 17A and FIG. 17B. The main condition that was changed within the microwave chemical processing reactor to produce the porous media in FIG. 17A or the conductive particles in FIG. 17B was the argon to nitrogen ratio within the reactor. The energy required to ionize argon within the reactor is higher than the energy required to ionize nitrogen, due to the higher ionization potential of argon. When a higher argon to nitrogen ratio was used within the reactor, the more dense, lower surface area, fibrous material in FIG. 17B was produced. And when a lower argon to nitrogen ratio was used within the reactor, the less dense, higher surface area material in FIG. 17B was produced.

Figure 17C:
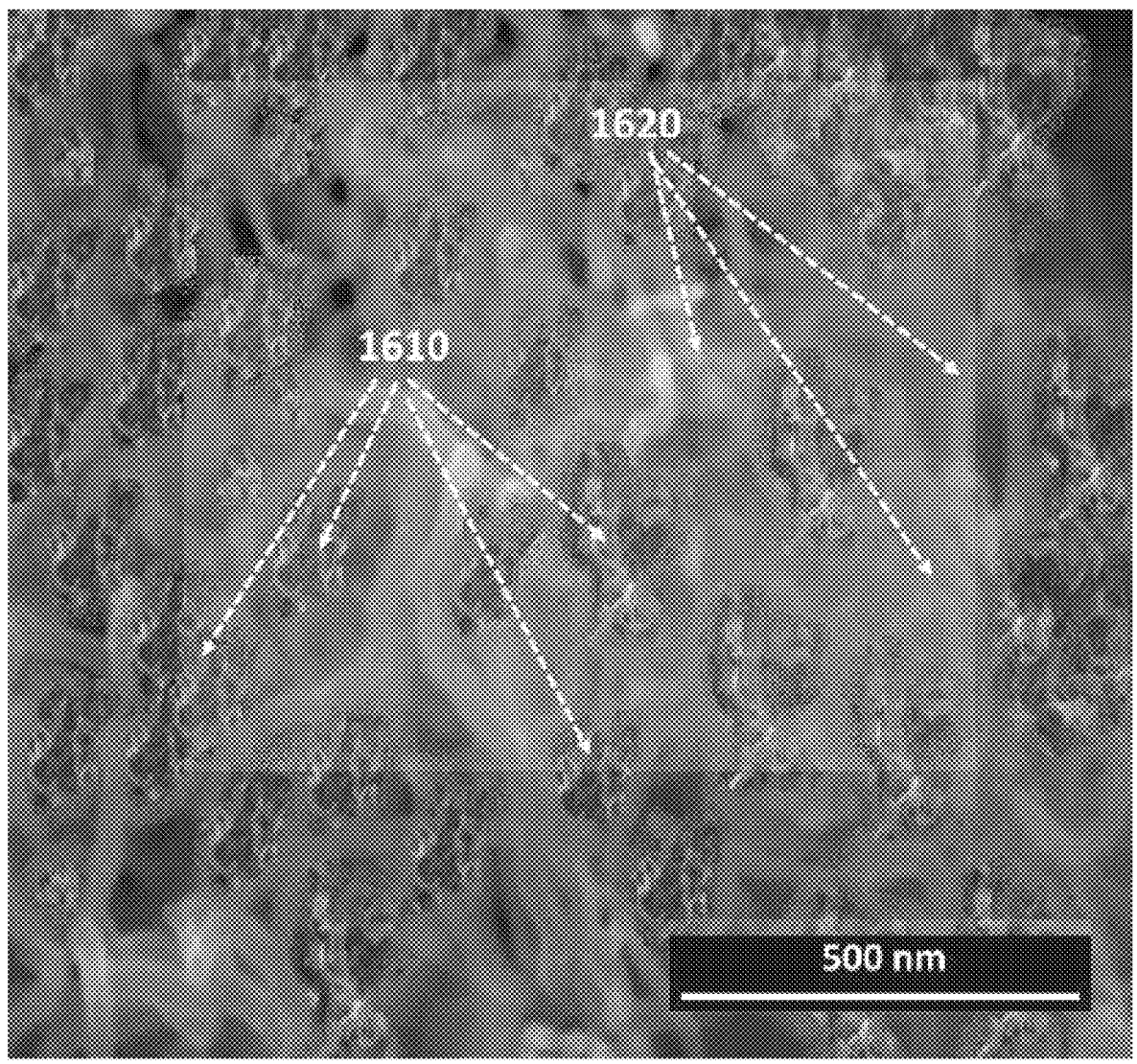
FIG. 17C shows an SEM of a structured composite material produced by welding the porous media in FIG. 17A together with the conductive particles in FIG. 17B, according to some implementations.

FIG. 17C is an SEM of an SCM produced by welding the porous media in FIG. 17A together with the conductive particles in FIG. 17B using an ECM. In this example, a particle drum coater was used to weld the materials together. The porous media and conductive particles in this example were fed into the particle drum coater with a hydrocarbon gas (methane) carrier fluid. The hydrocarbon gas decomposed into separated components in the reactor including a conductive carbon-containing ECM, which coated and fused (such as coalesced, or welded) the porous media and conductive particles together to form the SCM in FIG. 17C. The SCM in FIG. 17C has the advantages of both of the constituent particles, namely, it has a high surface area provided by the porous media 1710 and a high electrical conductivity provided by the conductive particles 1720 and the deposited ECM. Furthermore, the high aspect ratio conductive particles 1720 in this example provide mechanical strength to the SCM. The SCM shown in FIG. 17C could be an intermediate product, where the next step would be for an active material (such as a battery electrode material) to be conformally deposited within the pores of the SCM.

In addition to the foregoing, there are many techniques to produce functionalized 3D carbons using a microwave gas processing system having a series of secondary zones. Many variations of materials evolution can take place as the processing moves from initial formation of innate materials, through the process of functionalizing the innate materials, through the process of structural synthesis and into post processing.

Materials for a battery can be produced by control of process variables. In this case, these battery materials begin an evolutionary path as carbon particles that are formed in a plasma region of a reactor. Then, upon input of vapor (such as sulfur) into a temperature-controlled flow, the vapor and the particles interact to diffuse the sulfur into the pores of the carbon particles. The carbon particles move through a further temperature-controlled flow into a collector/separator, which in turn conveys the solid materials downstream for post-processing.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein but are to be accorded the widest scope consistent with this disclosure, the principles and the novel features disclosed herein.

What is claimed is:

1. A reactor system comprising:
    a microwave source configured to generate a microwave energy;
    one or more independently controllable heating sources;
    a field-enhancing waveguide (FEWG) disposed downstream the microwave source, extending in-line with it and including a plasma zone and an afterglow region and characterized by a cross-sectional area that decreases along a portion of a length of the FEWG, the FEWG comprising:
    a supply gas inlet disposed downstream of the microwave source, and configured to provide a supply gas to the FEWG, wherein a majority of the supply gas is configured to flow in the direction of microwave propagation along the length of the FEWG;
    the plasma zone disposed in fluid communication with the supply gas inlet and configured to generate a plasma in response to excitation of the supply gas by the microwave energy wherein the microwave source or the FEWG is configured to direct microwave energy directly into the plasma zone and not through a dielectric window or wall;
    a process inlet configured to inject a raw material into one of the plasma zone or the afterglow region disposed downstream of the plasma zone wherein the afterglow region is disposed in thermal communication with the one or more independently controllable heating sources and configured to produce a plurality of carbon-inclusive particles by reacting the plasma and the raw material; and
    an outlet disposed downstream of the afterglow region and configured to output the plurality of carbon-inclusive particles.

2. The reactor system of claim 1, further comprising a pair of electrodes positioned on opposite sides of the FEWG and proximate to the plasma zone, the pair of electrodes configured to generate an electric field.

3. The reactor system of claim 1, wherein the microwave energy is pulsed according to a pulse frequency.

4. The reactor system of claim 1, wherein the FEWG is configured to concentrate the microwave energy.

5. The reactor system of claim 1, wherein the FEWG further comprises a controller configured to independently control the one or more heating sources.

6. The reactor system of claim 1, wherein the FEWG is configured to self-nucleate the carbon-inclusive particles by tuning the reactor system process conditions.

7. The reactor system of claim 1, wherein the carbon-inclusive particles include graphene platelets.

8. The reactor system of claim 7, wherein the FEWG is configured to fuse the graphene platelets to each other at substantially orthogonal angles by tuning the reactor system process conditions.

9. The reactor system of claim 8, wherein the FEWG comprises a tunable waveguide configured to selectively adjust one or more angles at which the graphene platelets are fused together.

10. The reactor system of claim 7, wherein the one or more independently controllable heating sources are configured to disperse the graphene platelets within each of the carbon-inclusive particles.

11. The reactor system of claim 1, wherein the FEWG is configured to adjust a length of the plasma zone by selectively flowing one or more precursors through the FEWG.

12. The reactor system of claim 1, further comprising a first set of secondary zones positioned downstream from the afterglow region, the first set of secondary zones comprising an agglomeration zone.

13. The reactor system of claim 12, further comprising one or more heating sources disposed in thermal communication with the first set of secondary zones.

14. The reactor system of claim 13, wherein the one or more heating sources comprises a microwave energy device.

15. The reactor system of 14, wherein the microwave device is configured to adjust one or more of a pulsing frequency, a pulsing duty cycle, or a pulsing shape of microwave energy provided to the first set of secondary zones.

16. The reactor system of claim 12, further comprising a second set of secondary zones positioned downstream from the first set of secondary zones, the second set of secondary zones comprising a cooling zone.

17. The reactor system of claim 1, wherein the output from the outlet further comprises any one or more of carbonaceous particles, colloidal dispersions, or a plurality of solid particles.

* * * * *